(12) United States Patent
Okada et al.

(10) Patent No.: US 7,187,143 B2
(45) Date of Patent: Mar. 6, 2007

(54) MOVER DEVICE AND SEMICONDUCTOR MANUFACTURING APPARATUS AND METHOD

(75) Inventors: Keiji Okada, Ehime (JP); Yoshitomo Hidaka, Yokohama (JP); Michiro Sugitani, Niihama (JP); Junichi Murakami, Toyo (JP); Fumiaki Sato, Saijo (JP); Mitsukuni Tsukihara, Ehime (JP); Suguru Hirokawa, Saijo (JP); Masamitsu Shinozuka, Toyo (JP)

(73) Assignee: Sumitomo Eaton Nova, Corporation, Tokyo (JP)

( * ) Notice: Subject to any disclaimer, the term of this patent is extended or adjusted under 35 U.S.C. 154(b) by 20 days.

(21) Appl. No.: 10/781,756

(22) Filed: Feb. 20, 2004

(65) Prior Publication Data

US 2004/0194565 A1 Oct. 7, 2004

(30) Foreign Application Priority Data

Feb. 21, 2003 (JP) ............................. 2003-045102

(51) Int. Cl.
*H02P 1/00* (2006.01)
(52) U.S. Cl. ..................... 318/135; 318/567; 310/10; 355/53
(58) Field of Classification Search ................ 310/12; 318/135, 567, 568.22; 355/53, 72–76
See application file for complete search history.

(56) References Cited

U.S. PATENT DOCUMENTS

| | | | |
|---|---|---|---|
| 4,835,078 A * | 5/1989 | Harvey ..................... 430/22 |
| 5,194,893 A * | 3/1993 | Nishi ......................... 355/53 |
| 5,815,246 A | 9/1998 | Sperling et al. ............. 355/53 |
| 6,081,578 A * | 6/2000 | Braat ......................... 378/34 |
| 6,408,045 B1 | 6/2002 | Matsui et al. ............... 378/34 |
| 6,417,914 B1 | 7/2002 | Li .............................. 355/75 |
| 2002/0075467 A1 | 6/2002 | Tanaka et al. .............. 355/57 |
| 2004/0012768 A1 | 1/2004 | Tanaka et al. .............. 355/72 |
| 2004/0051854 A1 | 3/2004 | Tanaka et al. .............. 355/53 |

FOREIGN PATENT DOCUMENTS

| | | |
|---|---|---|
| JP | 05-262429 | 10/1993 |
| JP | 2000-028344 | 1/2000 |
| JP | 2001-195130 | 7/2001 |
| JP | 2002-008971 | 1/2002 |

* cited by examiner

*Primary Examiner*—Rina Duda
(74) *Attorney, Agent, or Firm*—Squire, Sanders & Dempsey LLP

(57) ABSTRACT

A mover device and an ion implanter apparatus having a processing base that reciprocates at a high speed without undesirable noise and vibration are provided. The mover device includes: a fixed base; a movable base that is linearly movable with respect to the fixed base; a processing base that is linearly movable with respect to the movable base; a main linear motor that generates a moving force to move the processing base with respect to the movable base, thereby moving the processing base with respect to the fixed base; and a velocity control unit that controls the moving velocity of the processing base with respect to the fixed base. In this mover device, the movable base is moved by virtue of a reaction force caused by the moving force to move the processing base.

48 Claims, 29 Drawing Sheets

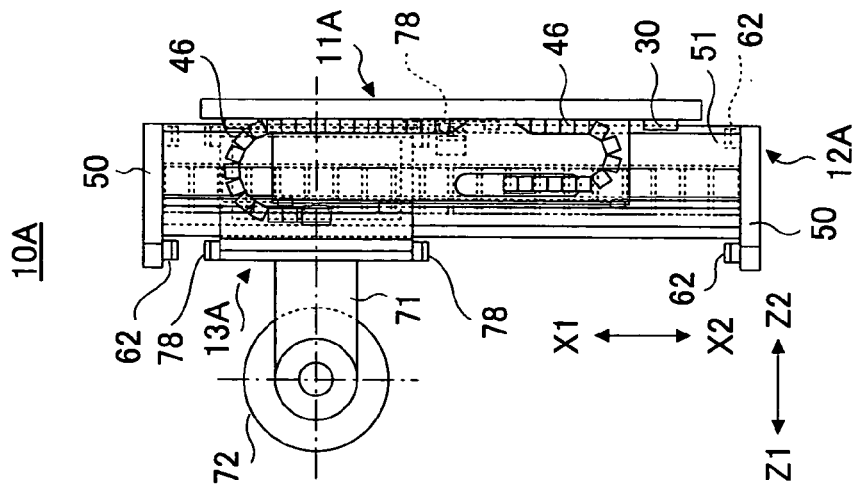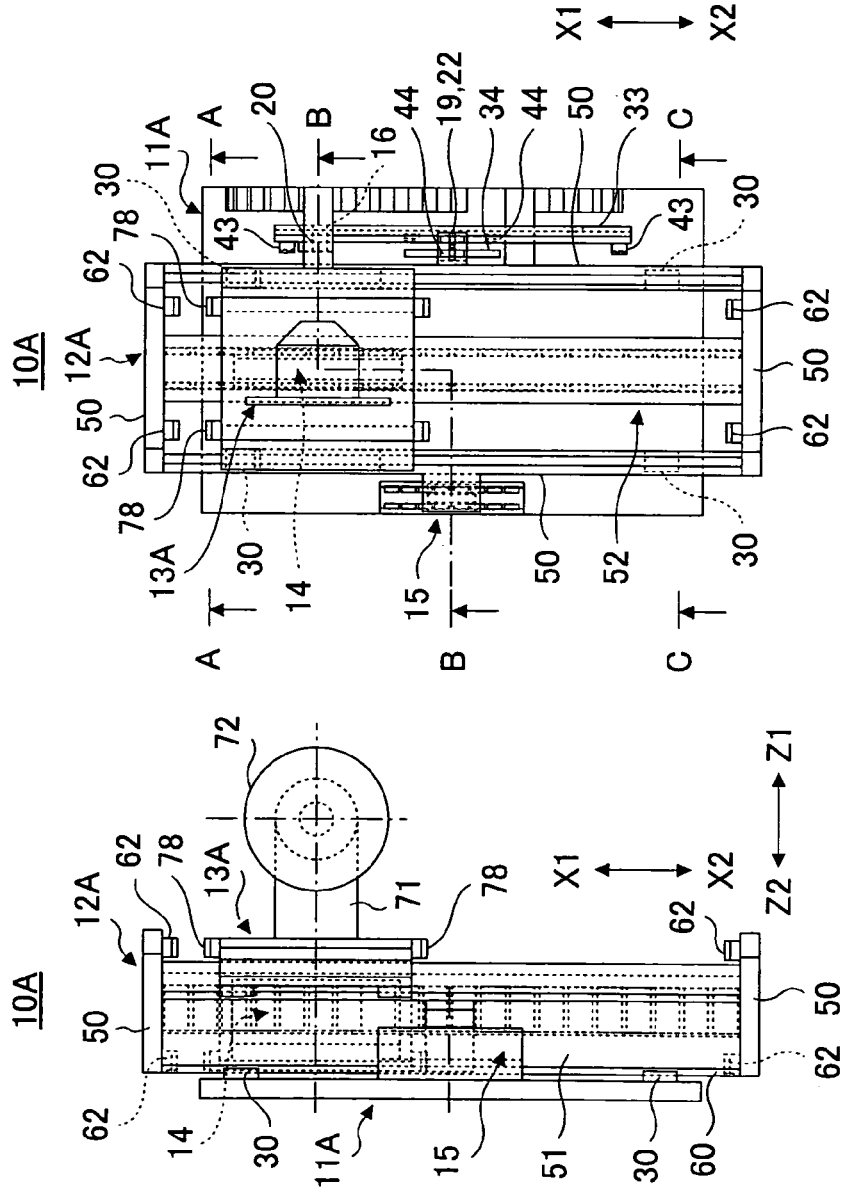

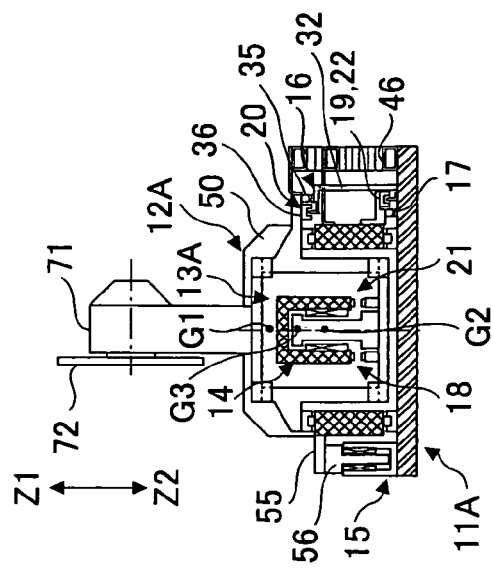
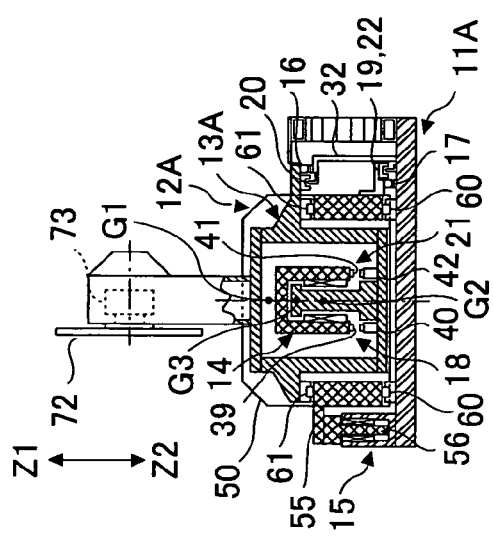
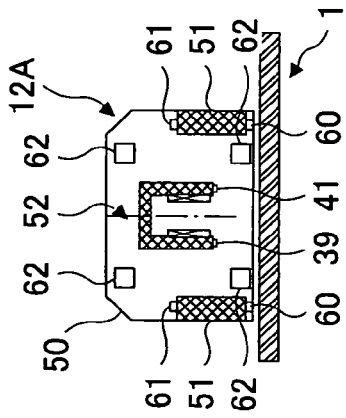

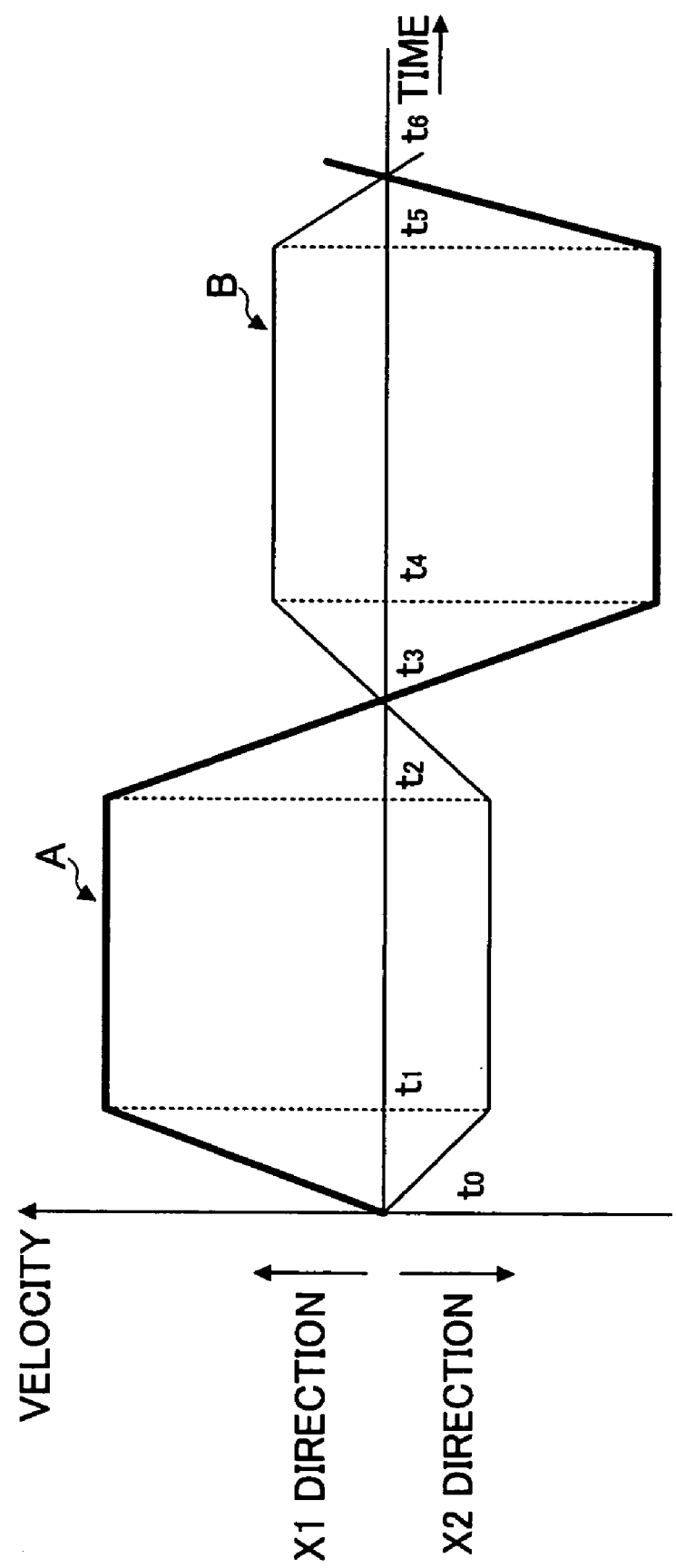

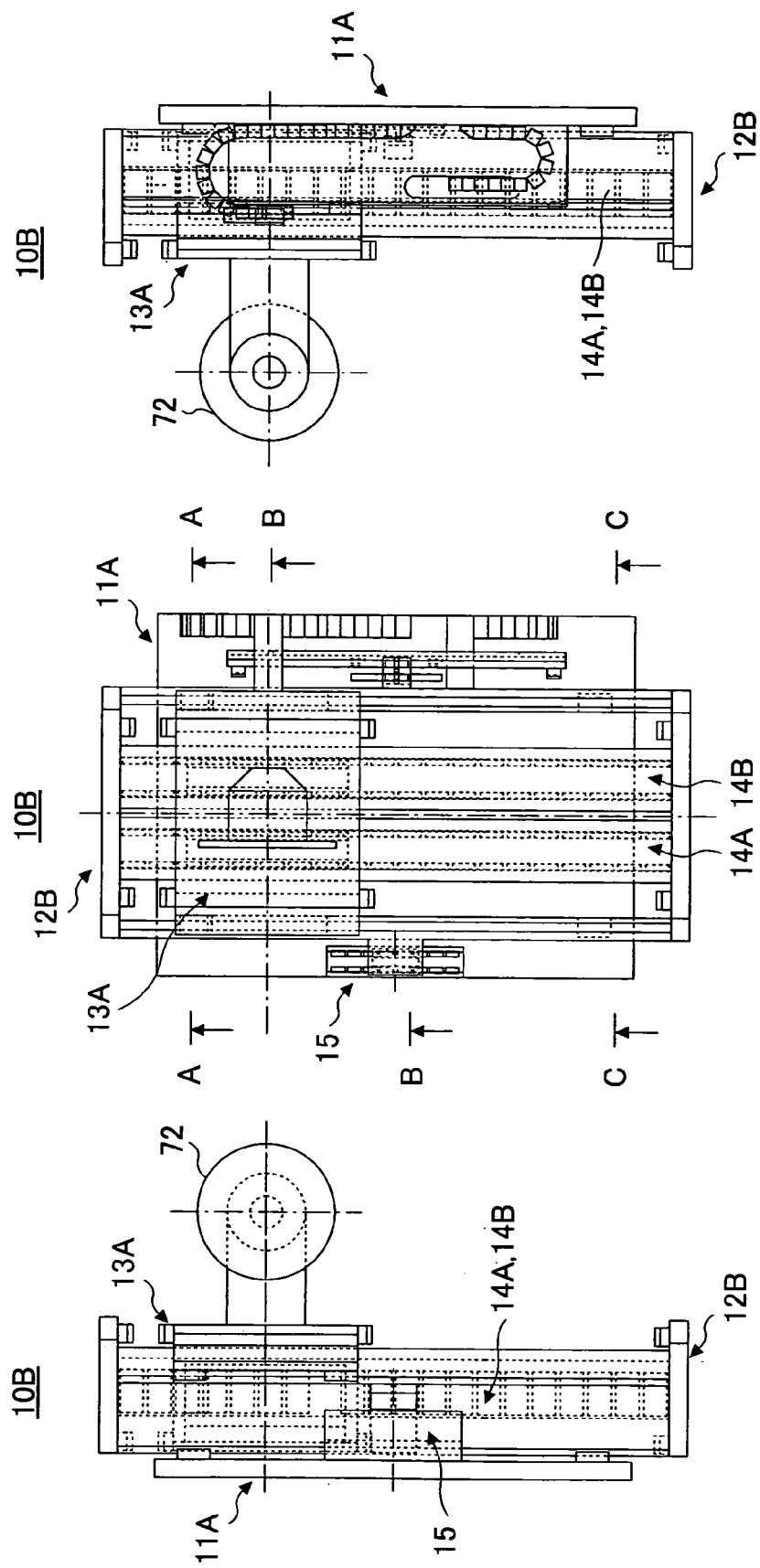

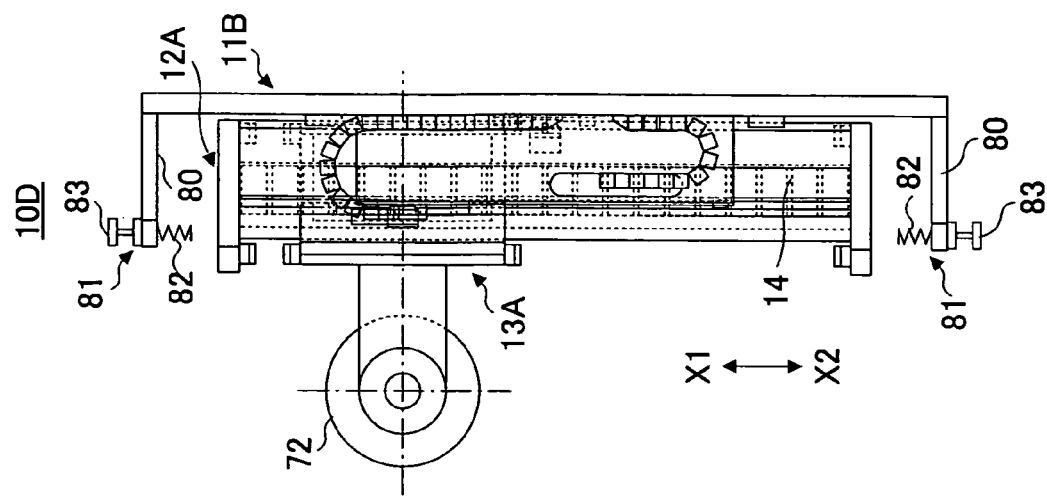
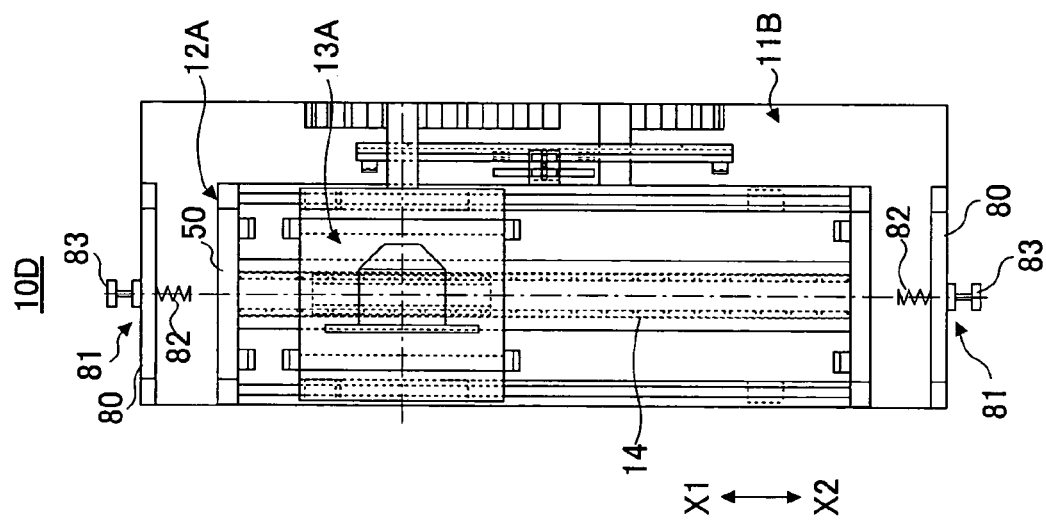
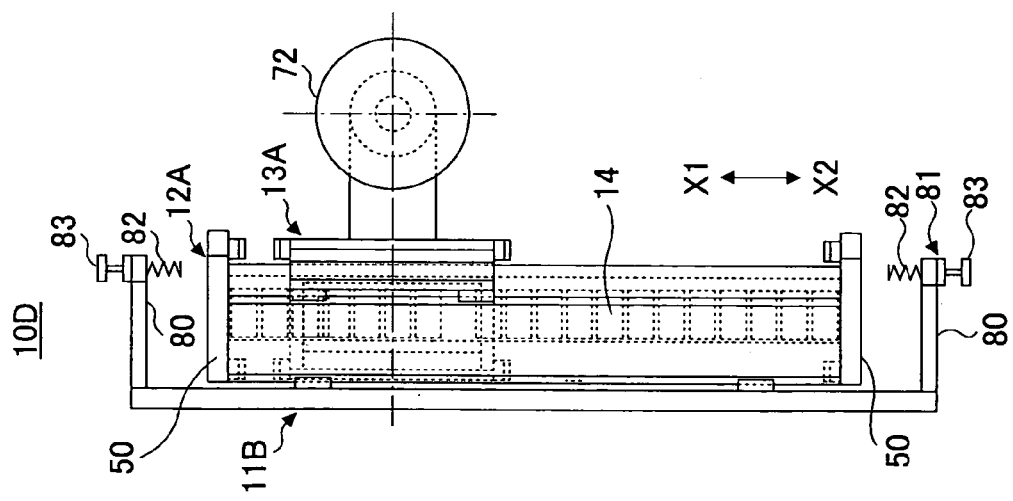

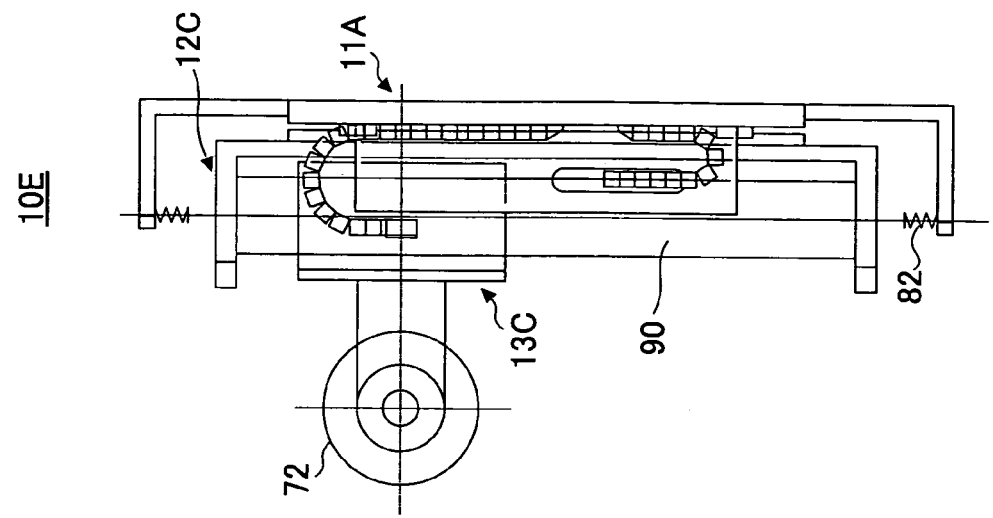
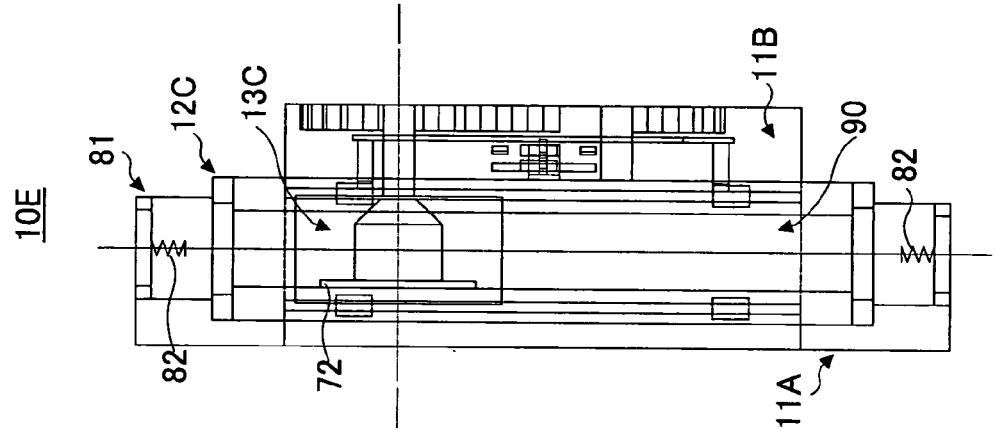
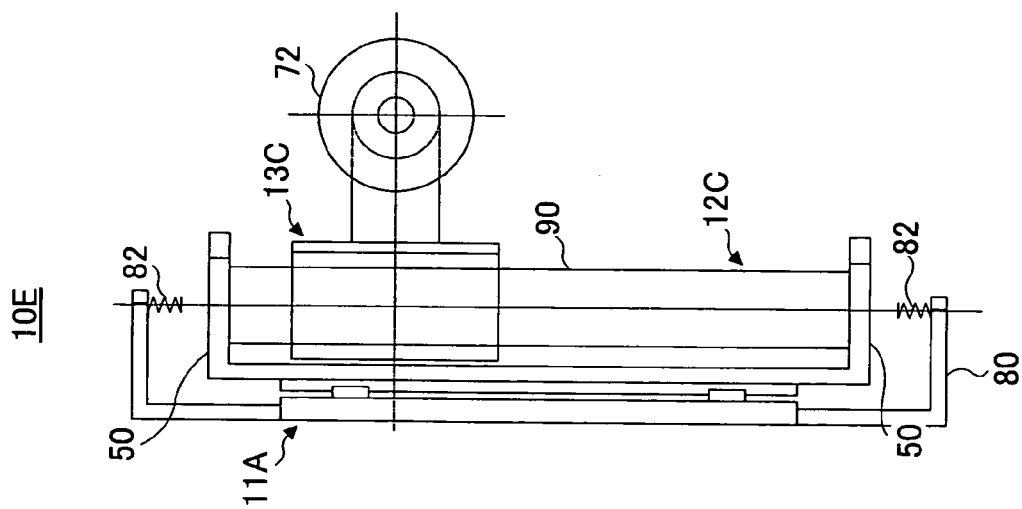

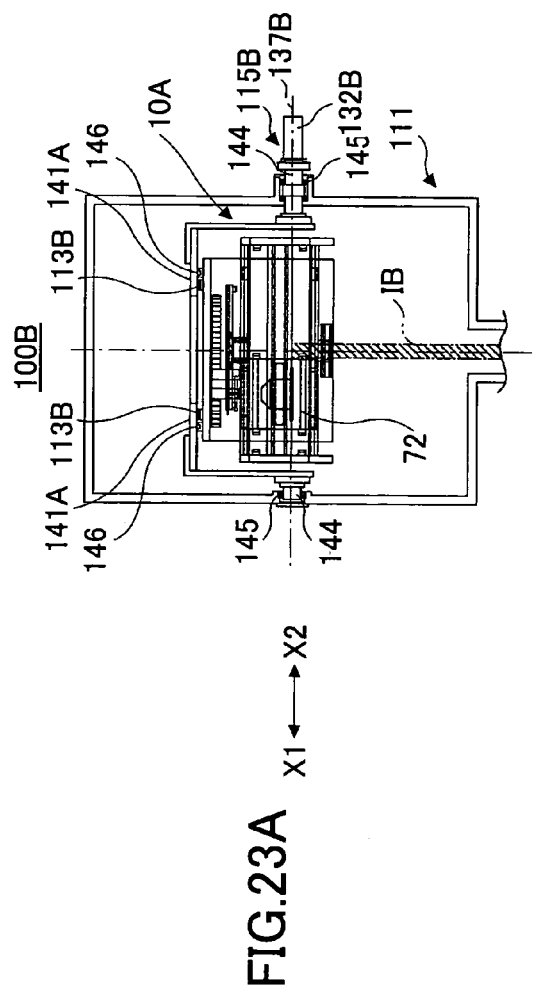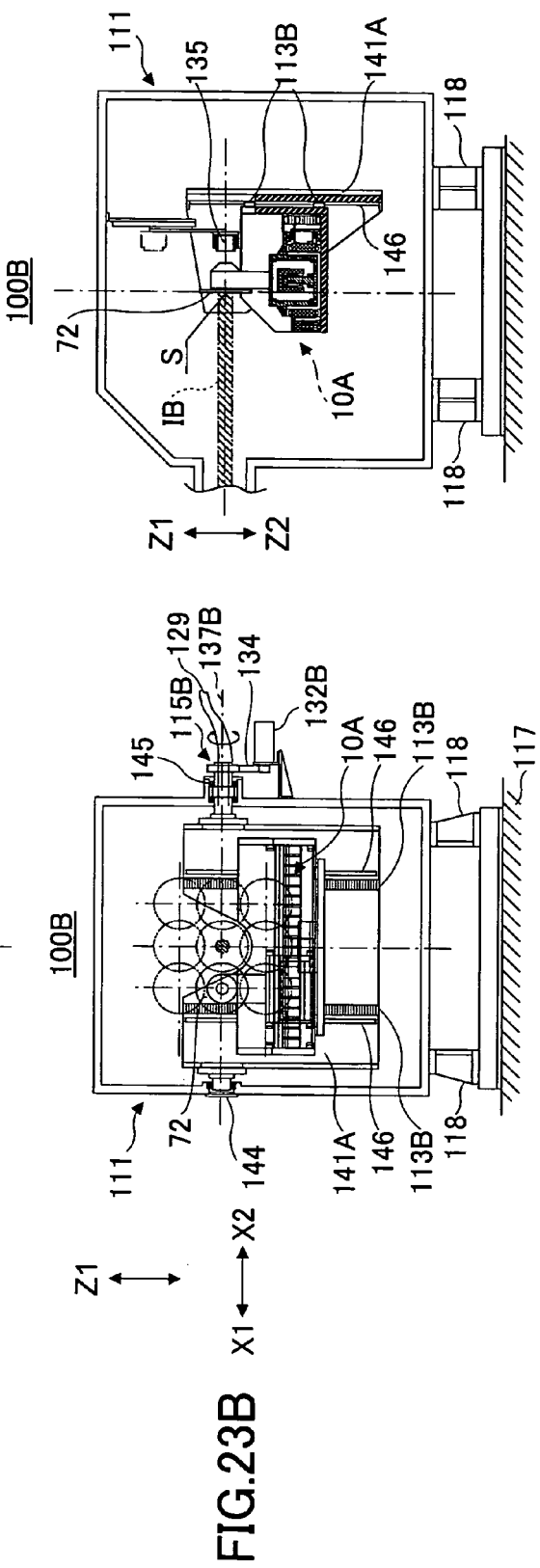
FIG.23A
FIG.23B
FIG.23C

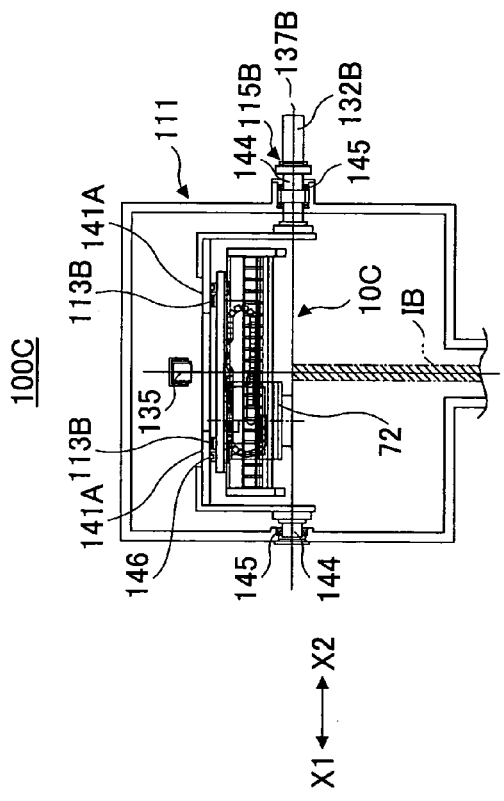
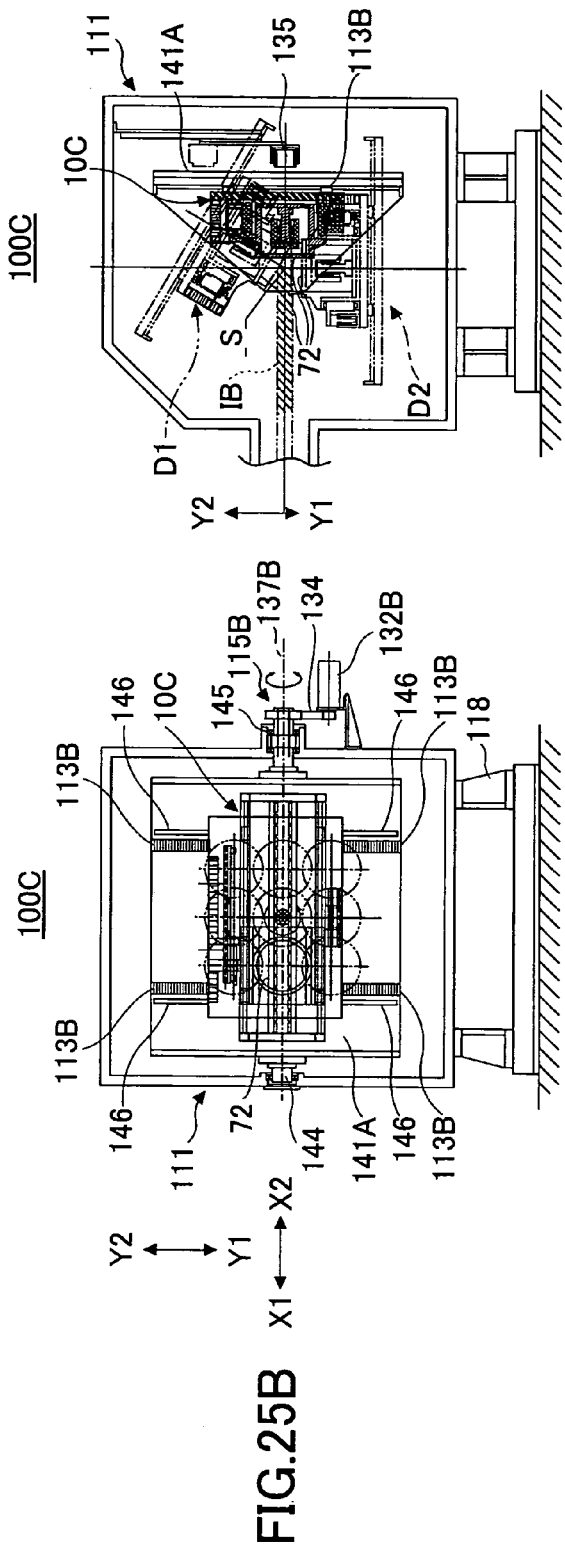
FIG.25A
FIG.25B
FIG.25C

MOVER DEVICE AND SEMICONDUCTOR MANUFACTURING APPARATUS AND METHOD

BACKGROUND OF THE INVENTION

The present invention generally relates to mover devices and semiconductor manufacturing apparatuses, and, more particularly, to a mover device and a semiconductor manufacturing apparatus in which a processing base reciprocates at a high speed.

In semiconductor manufacturing apparatuses and liquid crystal manufacturing apparatuses, a large number of production procedures are normally carried out for each substrate (semiconductor substrate).

More specifically, the following processes are carried out: a sputtering process for physically forming a thin film on a substrate; a CVD sputtering process for forming a thin film on a substrate through chemical vapor deposition; a lithography process for processing the shape of a thin film formed on a substrate; an impurity adding process for adding impurities to a film formed on a substrate; an etching process for etching a thin film formed on a substrate; an electronic beam process for performing minute processing on the surface of a substrate, using electronic beams; an ion beam process for performing minute processing on the surface of a substrate, using ion beams; an ion implanting process for implanting ions, using ion beams; a testing process for conducting a test on a substrate; and an exposure process to be carried out to form a pattern on a substrate.

When any of the above processes is to be carried out, the substrate needs to be precisely positioned in a processing chamber. Therefore, a processor to carry out each of the processes is equipped with a mover device that accurately moves a stage (a processing base) within a processing chamber or a vacuum processing chamber at a high speed. Each substrate is attached to the stage (the processing base) prior to an operation.

Especially, in an electronic beam process or an ion beam/ion implanting process that utilizes charged particle beams having small diameters in comparison with the area of a substrate, processing is performed on the entire area of the substrate. Therefore, it is necessary to repeatedly move and stop the processing base in one direction, or to reciprocate the processing base throughout the operation or in a part of the operation.

In recent years, there has been an increasing demand for substrate processing operation with higher throughputs and multi-variation limited-lot production systems. In response to such a demand, it is necessary to move a processing base in one direction at a higher speed or to reciprocate a processing base at a hither speed. In this trend, various mover devices that move a processing base in one direction at a high speed or reciprocate a processing base at a high speed have been developed.

When a processing base is moved in one direction or reciprocated at a high speed, the processing base naturally decelerates and accelerates to reverse the moving direction. At the times of accelerating, decelerating, starting, reversing, and stopping movements, great driving reaction forces are caused in the fixed base that supports the processing base. The driving reaction forces cause impact and vibration that are undesirable for movements of the processing base during operations. So as to eliminate undesirable impact and vibration, structures each having a fixed base formed by a platen with a great mass have been developed. With such structures, driving reaction force generation can be absorbed and restricted. An example of such structures is disclosed in Japanese Unexamined Patent Publication No. 2001-195130.

However, a mover device that exhibits a higher stopping accuracy, moves at a higher speed, and has a processing base with a higher performance, normally has a greater mass than a conventional mover device. As a result, greater driving reaction forces are generated from accelerating, decelerating, starting, reversing, and stopping movements of the processing base of such a mover device. Also, a mover device with a higher performance tends to have a heaver processing base. This also causes greater driving reaction forces. As a result, conventional methods of preventing driving reaction force generation cannot effectively restrict undesirable impact, vibration, and noise in a mover device.

SUMMARY OF THE INVENTION

A general object of the present invention is to provide mover devices and semiconductor manufacturing apparatuses in which the above disadvantages are eliminated.

A more specific object of the present invention is to provide a mover device and a semiconductor manufacturing apparatus in which a processing base can reciprocate at a high speed without undesirable impact, vibration, and noise.

The above objects of the present invention are achieved by a mover device that includes:

a fixed base;

a movable base that is movable in a linear direction with respect to the fixed base;

a processing base that is movable in a linear direction with respect to the movable base, the linear direction being in parallel with the linear moving direction of the movable base;

a moving force generating unit that is provided between the processing base and the movable base, and forms a main moving unit in cooperation with the processing base and the movable base; and a velocity controlling unit that controls the moving velocity of the processing base with respect to the fixed base.

In this mover device, the moving force generating unit is designed to generate a moving force to move the processing base with respect to the movable base, and, as a result, to move the processing base with respect to the fixed base.

The movable base on the fixed base is moved in the opposite direction to the moving direction of the processing base by virtue of a reaction force caused by the moving force generated from the moving force generating unit to move the processing base.

The above objects of the present invention are also achieved by a mover device that includes:

a fixed base;

a movable base that is movable in a linear direction with respect to the fixed base;

a processing base that is movable in a linear direction with respect to the movable base, the linear direction being in parallel with the linear moving direction of the movable base; and a moving force generating unit that is provided between the processing base and the movable base, and forms a main moving unit in cooperation with the processing base and the movable base.

In this mover device, the moving force generating unit is designed to generate a moving force to accelerate and decelerate the processing base with respect to the movable base, so as to move the processing base with respect to the movable base, and, as a result, to move the processing base with respect to the fixed base.

The movable base forms an inertial force processing unit that is moved on the fixed base in the opposite direction to the moving direction of the processing base by virtue of a reaction force caused by the moving force generated from the moving force generating unit to move the processing base. The inertial force processing unit is designed to convert the reaction force caused by the movement of the processing base into linear-direction inertial movements of the movable base, so that the processing base and the movable base linearly move with respect to each other.

The moving force generating unit is controlled so as to control the moving velocity of the processing base and the movable base that interactively move on the fixed base in linear directions.

The above objects of the present invention are also achieved by a mover device that includes:

a fixed base;

a movable base that is movable in a linear direction with respect to the fixed base;

a processing base that is movable in a linear direction with respect to the movable base, the linear direction being in parallel with the linear moving direction of the movable base; and a moving force generating unit that is provided between the processing base and the movable base, and forms a main moving unit in cooperation with the processing base and the movable base.

In this mover device, the moving force generating unit is designed to generate a moving force to accelerate and decelerate the processing base with respect to the movable base, so as to move the processing base with respect to the movable base, and, as a result, to move the processing base with respect to the fixed base.

The movable base forms an inertial force processing unit that is moved on the fixed base in the opposite direction to the moving direction of the processing base by virtue of a reaction force caused by the moving force generated from the moving force generating unit to move the processing base. The inertial force processing unit is designed to convert the reaction force caused by the movement of the processing base into linear-direction inertial movements of the movable base, so that the processing base and the movable base linearly move with respect to each other.

The moving force generating unit is controlled so as to control the moving velocity of the processing base with respect to the fixed base.

The above objects of the present invention are also achieved by a mover device that includes:

a fixed base;

a movable base that is movable in a linear direction with respect to the fixed base;

a processing base that is movable in a linear direction with respect to the movable base, the linear direction being in parallel with the linear moving direction of the movable base;

a moving force generating unit that is provided between the processing base and the movable base, and forms a main moving unit in cooperation with the processing base and the movable base; and a P-F measuring unit that is provided between the processing base and the fixed base, and a M-F measuring unit that is provided between the movable base and the fixed base.

In this mover device, the moving force generating unit is designed to generate a moving force to move the processing base with respect to the movable base, and, as a result, to move the processing base with respect to the fixed base.

The movable base forms an inertial force processing unit that is moved on the fixed base in the opposite direction to the moving direction of the processing base by virtue of a reaction force caused by the moving force generated from the moving force generating unit to move the processing base.

The moving force generating unit is controlled so as to control the moving velocity of the processing base with respect to the fixed base, using signals generated from the P-F measuring unit and the M-F measuring unit.

The above objects of the present invention are also achieved by a mover device that includes:

a fixed base;

a movable base that is movable in a linear direction with respect to the fixed base;

a processing base that is movable in a linear direction with respect to the movable base, the linear direction being in parallel with the linear moving direction of the movable base;

a moving force generating unit that is provided between the processing base and the movable base, and forms a main moving unit in cooperation with the processing base and the movable base; and a P-M measuring unit that is provided between the processing base and the movable base, and a M-F measuring unit that is provided between the movable base and the fixed base.

In this mover device, the moving force generating unit is designed to generate a moving force to move the processing base with respect to the movable base, and, as a result, to move the processing base with respect to the fixed base.

The movable base forms an inertial force processing unit that is moved on the fixed base in the opposite direction to the moving direction of the processing base by virtue of a reaction force caused by the moving force generated from the moving force generating unit to move the processing base.

The moving force generating unit is controlled so as to control the moving velocity of the processing base with respect to the fixed base, using signals generated from the P-M measuring unit and the M-F measuring units.

The above objects of the present invention are also achieved by a mover device that includes:

a fixed base;

a movable base that is movable in a linear direction with respect to the fixed base;

a processing base that is movable in a linear direction with respect to the movable base, the linear direction being in parallel with the linear moving direction of the movable base;

a moving force generating unit that is provided between the processing base and the movable base, and forms a main moving unit in cooperation with the processing base and the movable bass; and a P-F measuring unit that is provided between the processing base and the fixed base, and a P-M measuring unit that is provided between the processing base and the movable base.

In this mover device, the moving force generating unit is designed to generate a moving force to move the processing base with respect to the movable base, and, as a result, to move the processing base with respect to the fixed base.

The movable base forms an inertial force processing unit that is moved on the fixed base in the opposite direction to the moving direction of the processing base by virtue of a reaction force caused by the moving force generated from the moving force generating unit to move the processing base.

The moving force generating unit is controlled so as to control the moving velocity of the processing base with respect to the fixed base, using signals generated from the P-F measuring unit and the P-M measuring unit.

With any of the above structures, the movable base is moved by virtue of the reaction force caused by the moving force to move the processing base. The reaction force generated at the time of accelerating or decelerating the processing base is absorbed by the movement of the movable base, and does not reach the fixed base. Accordingly, even when the processing base is moved at a high speed, vibration is not caused in the mover device at the times of acceleration and deceleration. Thus, the mover device can be stably moved with high precision.

In any of the above mover devices, the movable base may have a greater mass than the processing base so that the movable base may function as an inertial force processing weight and that the movement of the movable base by virtue of the reaction force may be made smaller than the movement of the processing base.

Also, in any of the above mover devices, the linear-direction inertial movement of the movable base caused by the reaction force generated from the movement of the processing base may include accelerating or decelerating movements and a uniform velocity movement.

With any of the above structures, the movable base functions as a counter weight for converting the reaction force into movements of the movable base. Accordingly, the movable base can completely absorb the reaction force caused by the accelerating and decelerating movements of the processing base.

Also, in the mover device having the above structure, the moving force generating unit may move the processing base with a greater moving force than a moving force that overcomes a moving force required to start moving the movable base and then moves the movable base in the opposite direction, the moving force generating unit thereby forcing the movable base to start moving.

With this structure, the processing base can be started with certainty in the beginning of an operation.

Also, in any of the above mover devices, the velocity controlling unit may include a first detector that detects the moving state of the processing base with respect to the fixed base, and a controller that controls the moving force generating unit based on a detection result of the first detector.

With this structure, the controller controls the moving force generating unit based on a detection result of the first detector that detects the moving state of the processing base with respect to the fixed base. Accordingly, movement control on the processing base can be performed with high precision. Also, as the movement control on the processing base can be performed with only one detector, the device structure can be simplified.

Also, in any of the above mover devices, the velocity controlling unit may include:

a second detector that detects the moving state of the movable base with respect to the fixed base;

a third detector that detects the moving state of the processing base with respect to the movable base; and a controller that controls the moving force generating unit based on detection results of the second detector and the third detector.

With this structure, the moving force generating unit can be controlled by the controller using the second detector and the third detector.

Also, in any of the above mover devices, the velocity controlling unit may include:

a first detector that detects the moving state of the processing base with respect to the fixed base;

a second detector that detects the moving state of the movable base with respect to the fixed base;

a third detector that detects the moving state of the processing base with respect to the movable base; and a controller that controls the moving force generating unit based on detection results of at least two of the first detector, the second detector, and the third detector.

Also, in any of the above mover devices, the velocity controlling unit may include:

a first detector that detects the moving state of the processing base with respect to the fixed base;

a second detector that detects the moving state of the movable base with respect to the fixed base;

a third detector that detects the moving state of the processing base with respect to the movable base; and a controller that controls the moving force generating unit based on detection results of the first detector, the second detector, and the third detector.

With the above structure, the moving force generating unit can be controlled by the controller using the first, second, and third detectors.

Also, in any of the above mover devices, the movable base may be guided by a first linear support guide, to move linearly with respect to the fixed base.

Guided by the first linear support guide, the movable base can be stably moved linearly with respect to the fixed base in this structure.

Also, in any of the above mover devices, the processing base may be guided by a second linear support guide, to move linearly with respect to the movable base.

Guided by the second linear support guide, the processing base can be stably moved linearly with respect to the movable base in this structure.

Also, in any of the above mover devices, the processing base may be guided by a third linear support guide provided on the fixed base, so as to move linearly with respect to the fixed base.

Guided by the third linear support guide, the processing base can be stably moved linearly with respect to the fixed base in this structure.

Also, in any of the above mover devices, the velocity controlling unit may control the processing base to reciprocate in a predetermined range.

In this structure, the processing base reciprocates in the predetermined range. Accordingly, it is possible to perform consecutive processing operations on the processing base when an object to be processed (such as a wafer) is attached to the processing base.

In the mover device having the above structure, the velocity controlling unit may set a region in which the processing base moves at a uniform velocity.

Also, in the mover device having the above structure, the velocity controlling unit may control the processing base to reciprocate in the predetermined range in such a manner that the processing base moves in both directions at the same velocity in each uniform velocity reciprocating movement.

With either of the above structures, the processing base sets a region in which the processing base moves at a uniform velocity. Accordingly, when an object to be processed (such as a wafer) is attached to the processing base, processing can be performed on the processing base in the uniform velocity region. Thus, the processing to be performed on the processing base can be easily controlled.

Also, in the mover device having the above structure, the velocity controlling unit may repeat acceleration control, uniform velocity control, and deceleration control, while moving the processing base with respect to the fixed base.

With this structure, the moving velocity of the processing base with respect to the fixed base is controlled through the acceleration control until the moving velocity of the processing base with respect to the fixed base reaches a predetermined velocity. Once the moving velocity of the processing base with respect to the fixed base reaches the predetermined velocity, it is maintained at a predetermined velocity through the uniform velocity control. The movement of the processing base with respect to the fixed base is then stopped through the deceleration control. By repeating the acceleration control, the uniform velocity control, and the deceleration control, the processing base can be stably reciprocated.

Also, in any of the above mover devices, the center of composite gravity of the processing base and the movable base in the linear moving directions may be maintained at a predetermined point that is located on the fixed base, regardless of movements of the processing base and the movable base.

With this structure, the center of composite gravity of the processing base and the movable base is maintained at one point on the fixed base, even though the processing base and the movable base are moved. Accordingly, vibration due to movement of the center of composite gravity can be prevented in the fixed base. Thus, undesirable vibration and noise can be prevented in the mover device, and the processing base can be stably moved with high precision.

In any of the above mover devices, the moving force generating unit may be a linear motor that can linearly reciprocate.

In this structure, a linear motor that can linearly reciprocate is employed as the moving force generating unit. Accordingly, highly responsive control can be performed through a simple controlling process, because a linear motor can be controlled with ease.

In the mover device having the above structure, the linear motor may be of a coreless coil type.

With a linear motor of a coreless coil type, cogging force generation can be prevented. Thus, the processing base can be smoothly moved with high precision.

Any of the above mover devices may further include a positional deviation correcting unit that corrects a positional deviation of the movable base from a predetermined reference position with respect to the fixed base.

With this structure, a positional deviation of the movable base from the reference position with respect to the fixed base is corrected by the positional deviation correcting unit. Thus, a decrease of the movement accuracy of the processing base can be prevented.

In the mover device having the above structure, a positional deviation of the movable base from the predetermined reference position with respect to the fixed base may be detected by the second detector.

With this structure, a positional deviation of the movable base from the reference position with respect to the fixed base can be detected by the second detector. Thus, the device structure can be simplified, and the number of components can be reduced, compared with a structure in which a positional deviation detector is also employed.

Any of the above mover devices may further include a positional deviation correcting mechanism that acts between the movable base and the fixed base, and corrects a positional deviation of the movable base from a predetermined reference position, the positional deviation correcting mechanism being provided in a position in which the fixed base and the movable base face each other with respect to the moving direction of the movable base.

With this structure, a positional deviation of the movable base with respect to the fixed base is corrected by the positional deviation correcting mechanism. Thus, a decrease of the movement accuracy of the processing base can be prevented. Also, the positional deviation correcting mechanism is located in a position in which the fixed base and the movable base face each other with respect to the moving direction of the movable base. In this arrangement, the positional deviation correcting mechanism acts between the movable base and the fixed base, so as to correct a positional deviation. Thus, a positional deviation of the movable base can be directly corrected.

In the mover device having the above structure, the positional deviation correcting mechanism may adjust a range in which a positional deviation can be corrected.

This structure can easily cope with an increase or decrease in the moving force generated from the moving force generating unit, or a change of the conditions that are set for the mover device.

In the mover device having the above structure, the positional deviation correcting mechanism may utilize magnetism for correcting a positional deviation of the movable base from the predetermined reference position.

With this structure, the positional deviation correcting mechanism utilizes magnetism for correcting a positional deviation of the movable base from the reference position. Thus, a positional deviation can be corrected through a simple mechanism.

Also, in the mover device having the above structure, the positional deviation correcting mechanism may utilize a spring for correcting a positional deviation of the movable base from the predetermined reference position.

With this structure, a positional deviation of the movable base can be corrected through a simple mechanism.

Any of the above mover devices may further include a reverse facilitating unit that helps the processing base to reverse the moving direction so as to keep reciprocating. This reverse facilitating unit is provided between the movable base and the processing base.

With this structure, the processing base is helped by the reverse facilitating unit to reverse the moving direction so as to keep reciprocating. Accordingly, the load on the moving force generating unit can be reduced, and the processing base can be easily reversed, compared with a case where the processing base is reversed only by the moving force generating unit.

Any of the above mover devices may further include an auxiliary driving unit that drives the movable base to move with respect to the fixed base.

In the mover device having the above structure, the auxiliary driving unit may be controlled through the second detector that detects the moving state of the movable base with respect to the fixed base.

Also, in the mover device having the above structure, the auxiliary driving unit may be controlled through the second detector that detects the moving state of the movable base with respect to the fixed base, and the moving force generating unit may be controlled through the first detector that detects the moving state of the processing base with respect to the fixed base.

With the auxiliary driving unit that drives the movable base to move with respect to the fixed base, both the moving force generating unit and the auxiliary driving unit can be used for controlling movements of the processing base and the movable base. Thus, a greater degree of freedom can be allowed for movement control to be performed on the processing base and the movable base.

In any of the above mover devices having a positional deviation correcting mechanism, the positional deviation correcting mechanism may utilize an auxiliary driving unit for correcting a positional deviation of the movable base from the predetermined reference position. The auxiliary driving unit drives the movable base to move with respect to the fixed base.

With this structure, a positional deviation of the movable base from the reference position is corrected through the auxiliary driving unit. Accordingly, a positional deviation can be corrected with a simpler mechanism, compared with a case where a positional deviation correcting unit is also employed.

In any of the above mover devices having an auxiliary driving unit, the velocity controlling unit may utilize the auxiliary driving unit for correcting the moving velocity of the processing base with respect to the fixed base.

With this structure, the auxiliary driving unit is utilized for correcting the moving velocity of the processing base with respect to the fixed base. Accordingly, a moving operation for the processing base and a moving velocity control operation for the processing base can be performed separately from each other. Thus, a greater degree of freedom can be allowed for the moving velocity control to be performed on the processing base.

Also, in any of the above mover devices having an auxiliary driving unit, the velocity controlling unit controls the moving force generating unit so as to perform acceleration control, uniform velocity control, and deceleration control on the processing base moving with respect to the fixed base, while controlling the auxiliary driving unit so as to perform velocity control for disturbance correction on the processing base moving with respect to the fixed base.

With this structure, the moving force generating unit and the auxiliary driving unit perform control operations separately from each other, so to move the processing base with respect to the fixed base. Accordingly, each control operation to be performed by the moving force generating unit and the auxiliary driving unit can be simplified.

Also, in any of the above mover devices having an auxiliary driving unit, the auxiliary driving unit may be a linear motor of a coreless coil type.

With the linear motor of a coreless coil type, cogging force generation can be prevented. Thus, the auxiliary driving unit can smoothly move the processing base and the movable base with high precision.

Also, in any of the above mover devices having an auxiliary driving unit, the center of gravity of the processing base in the linear moving direction may be located in the same position as the center of gravity of the movable base in the linear moving direction, and the point at which the moving force generating unit applies a moving force to the processing base may be located in the same position as the center of gravity of the processing base in the linear moving direction and the center of gravity of the movable base in the linear moving direction.

Also, in any of the above mover devices having an auxiliary driving unit, the center of gravity of the processing base in the linear moving direction may be located in the same position as the center of gravity of the movable base in the linear moving direction and the point at which the moving force generating unit applies a moving force to the processing base. Here, the center of gravity of the processing base in the linear moving direction is also located on the linear moving plane of a second linear support guide that guides and moves the processing base linearly with respect to the movable base.

With this structure, unnecessary moment generation can be prevented when the moving force generating unit applies a moving force to the processing base. Thus, the processing base can be smoothly moved with high precision.

Also, in any of the above mover devices having an auxiliary driving unit, the velocity controlling unit may control the moving force generating unit, so as to perform acceleration control, uniform velocity control, and deceleration control on the processing base moving with respect to the fixed base. The velocity controlling unit may also control the auxiliary driving unit, so as to perform acceleration control, uniform velocity control, and deceleration control on the movable base moving with respect to the fixed base.

With this structure, the moving force generating unit is controlled so as to perform acceleration control, uniform velocity control, and deceleration control on the processing base moving with respect to the fixed base. Meanwhile, the auxiliary driving unit is controlled so as to perform acceleration control, uniform velocity control, and deceleration control on the movable base moving with respect to the fixed base. Even if a disturbance is caused in any of the control operations performed on the processing base, the velocity control operations performed on the movable are adjusted to correct the disturbance in the moving velocity of the processing base.

In the mover device having the above structure, the velocity controlling unit may control the moving force generating unit in such a manner that changes of the moving velocity of the processing base with time conform to a first reference trapezoid. The changes of the moving velocity are caused by acceleration, uniform velocity moving, and deceleration. The velocity controlling unit may also control the auxiliary driving unit in such a manner that changes of the moving velocity of the movable base with time conform to a second reference trapezoid. The changes of the moving velocity are caused by acceleration, uniform velocity moving, and deceleration.

With this structure, changes of the moving velocity of the processing base with time conform to the first reference trapezoid under the control of the moving force generating unit, while changes of the moving velocity of the movable base with time conform to the second reference trapezoid under the control of the auxiliary driving unit. Accordingly, the moving velocity of the processing base can be adjusted to the predetermined uniform velocity promptly, and the processing base can be stopped promptly. Furthermore, the uniform velocity region of the processing base can be widened.

In the mover device having the above structure, a transition point between the acceleration and the uniform velocity moving and a transition point between the uniform velocity moving and the deceleration in accordance with the first reference trapezoid may be in synchronization with the corresponding transition points in accordance with the second reference trapezoid.

As the transition point between the acceleration and the uniform velocity moving and the transition point between the uniform velocity moving and the deceleration in accordance with the first reference trapezoid are in synchronization with the corresponding transition points in accordance with the second reference trapezoid, the processing base and the movable base synchronously changes moving states (for example, from an accelerating state to a uniform velocity moving state). Accordingly, at each moving state transition time, the processing base and the movable base interact with each other, so as to prevent a positional deviation.

In the mover device having the above structure, the first reference trapezoid that represents ideal movements of the processing base may be stored beforehand in the velocity controlling unit, and the velocity controlling unit may control the moving force generating unit to correct the moving velocity of the processing base, when the moving velocity of the processing base deviates from the velocity represented by the first reference trapezoid.

With this structure, when the moving velocity of the processing base deviates from the velocity represented by the first reference trapezoid stored in the velocity controlling unit, the velocity controlling unit controls the moving force generating unit so that the processing base can be moved at an ideal velocity.

Also, in the mover device having the above structure, the second reference trapezoid that represents ideal movements of the movable base may be stored beforehand in the velocity controlling unit, and the velocity controlling unit may control the auxiliary driving unit to correct the moving velocity of the movable base, when the moving velocity of the movable base deviates from the velocity represented by the second reference trapezoid.

With this structure, when the moving velocity of the movable base deviates from the velocity represented by the second reference trapezoid stored in the velocity controlling unit, the velocity controlling unit controls the moving force generating unit so that the processing base can be moved at an ideal velocity.

The above objects of the present invention are also achieved by a semiconductor manufacturing apparatus that includes:

one of the mover devices described above: and a processing unit that performs processing on a processing object attached to the processing base of the mover device.

The above objects of the present invention are also achieved by a semiconductor manufacturing apparatus of a vacuum processing type that includes:

one of the mover devices described above; and a processing unit that performs processing on a processing object attached to a processing base of the mover device in a vacuum.

With either of the above semiconductor manufacturing apparatuses, undesirable vibration is not caused in the processing base, and the processing base can be moved at a high speed. As the mover device can move each processing object attached to the processing base, the throughput of ion implanting into each processing object can be increased.

Either of the above semiconductor manufacturing apparatuses may further include a mover unit that moves the mover device in a direction perpendicular to the moving direction of the processing base.

Any of the above semiconductor manufacturing apparatuses may further include a tilting unit that tilts the mover device.

Any of the above semiconductor manufacturing apparatuses may further include a rotator unit that rotates the mover device on an axis that is perpendicular to the moving direction of the processing base.

With any of the above semiconductor manufacturing apparatuses, the angle of the processing base with respect to the ion beam emitting direction can be arbitrarily changed. Thus, the condition of ion implanting into each processing object can be arbitrarily set.

The above objects of the present invention are also achieved by a method of controlling a mover device that includes: a fixed base; a movable base that is moved in a linear direction with respect to the fixed base by a second linear support guide; a processing base that is moved in a linear direction with respect to the movable base by a first linear support guide, the linear direction being in parallel with the linear moving direction of the movable base; a first precise relative position measuring unit that is provided between the processing base and the fixed base; a second precise relative position measuring unit that is provided between the movable and the fixed base; and a moving force generating unit that is provided between the processing base and the movable base, and forms a main moving unit in cooperation with the processing base and the movable base. This method includes the steps of:

generating a moving force from the moving force generating unit to move the processing base with respect to the movable base, thereby moving the processing base with respect to the fixed base by virtue of a moving force acting in the opposite direction as a result of the movement of the processing base with respect to the movable base;

moving the movable base on the fixed base in the opposite direction to the moving direction of the processing base by virtue of a reaction force caused by the moving force generated from the moving force generating unit to move the processing base, so that the movable base moves in the opposite direction to the moving direction of the processing base on the fixed base; and controlling the moving velocity of the processing base with respect to the fixed base, using a detection signal generated from the first precise relative position measuring unit.

By this method, the reaction force caused by the accelerating or decelerating movement of the processing base is absorbed by the movable base, and does not reach the fixed base. Accordingly, even when the processing base is moved at a high speed, undesirable vibration is not caused in the mover device at the times of acceleration and deceleration of the processing base. Thus, the processing base can be stably moved with precision.

The above objects of the present invention are also achieved by a method of controlling a mover device that includes: a fixed base; a movable base that is movable in a linear direction with respect to the fixed base; a processing base that is movable in a linear direction with respect to the movable base, the linear direction being in parallel with the linear moving direction of the movable base; a moving force generating unit that is provided between the processing base and the movable base, and forms a main moving unit in cooperation with the processing base and the movable base; and an auxiliary driving unit that drives the movable base to move with respect to the fixed base. This method includes the steps of:

generating a movable force from the moving force generating unit to move the processing base with respect to the movable base, thereby moving the processing base with respect to the fixed base by virtue of a moving force acting in the opposite direction as a result of the movement of the processing base with respect to the movable base;

moving the movable base on the fixed base in the opposite direction to the moving direction of the processing base by virtue of a reaction force caused by the moving force generated from the moving force generating unit to move the processing base, so that the movable base moves in the opposite direction to the moving direction of the processing base on the fixed base;

controlling the moving velocity of the processing base with respect to the fixed base;

converting the reaction force caused by the movement of the processing base into an inertial moving force to move the movable base, so that the movable base accelerates, decelerates, and moves at a uniform velocity in the linear direction;

controlling the moving force generating unit to drive the processing base to accelerate, decelerate, and move at a uniform velocity with respect to the fixed base, using a first detector that detects the moving state of the processing base with respect to the fixed base; and controlling the auxiliary driving unit to drive the movable base to accelerate, decelerate, and move at a uniform velocity with respect to the fixed base, using a second detector that detects the moving state of the movable base with respect to the fixed base, so that the movable base and the processing base are controlled independently of each other.

By this method, the reaction force caused by the acceleration or deceleration movement of the processing base can be completely absorbed. Also, cogging force generation can be prevented. Accordingly, the auxiliary driving unit can smoothly move the processing base and the movable base with high precision. Furthermore, the moving velocity of the processing base can be adjusted to a predetermined uniform velocity promptly, and the processing base can be stopped promptly. Accordingly, the uniform velocity region can be widened. When the processing base and the movable base change moving states at the same time (for example, from an accelerating state to a uniform velocity moving state), the processing base and the movable base can interact with each other so as to prevent a positional deviation.

The above and other objects and features of the present invention will become more apparent from the following description taken in conjunction with the accompanying drawings.

BRIEF DESCRIPTION OF THE DRAWINGS

FIG. 1A is a left side view of a mover device in accordance with a first embodiment of the present invention;

FIG. 1B is a plan view of the mover device in accordance with the first embodiment;

FIG. 1C is a right side view of the mover device in accordance with the first embodiment;

FIG. 1D is a section view of the mover device, taken along the line A—A of FIG. 1B;

FIG. 1E is a section view of the mover device, taken along the line B—B of FIG. 1B;

FIG. 1F is a section view of the mover device, taken along the line C—C of FIG. 1B;

FIG. 17 shows examples of the velocity setting trapezoids of the processing base and the movable base;

FIGS. 18A through 18F illustrate the hardware structure of a mover device in accordance with a second embodiment of the present invention;

FIGS. 20A through 20C illustrate the hardware structure of a mover device in accordance with a fourth embodiment of the present invention;

FIGS. 21A through 21C illustrate the hardware structure of a mover device in accordance with a fifth embodiment of the present invention;

FIG. 23A is a plan view illustrating the hardware structure of an ion implanter apparatus in accordance with a seventh embodiment of the present invention;

FIG. 23B is a front view illustrating the ion implanter apparatus in accordance with the seventh embodiment;

FIG. 23C is a right side view illustrating the ion implanter apparatus in accordance with the seventh embodiment;

FIG. 25A is a plan view illustrating the hardware structure of an ion implanter apparatus in accordance with an eighth embodiment of the present invention;

FIG. 25B is a front view illustrating the ion implanter apparatus in accordance with the eighth embodiment; and FIG. 25C is a right side view illustrating the ion implanter apparatus in accordance with the eighth embodiment.

DESCRIPTION OF THE PREFERRED EMBODIMENTS

The following is a description of embodiments of the present invention, with reference to the accompanying drawings.

Figure 2A:
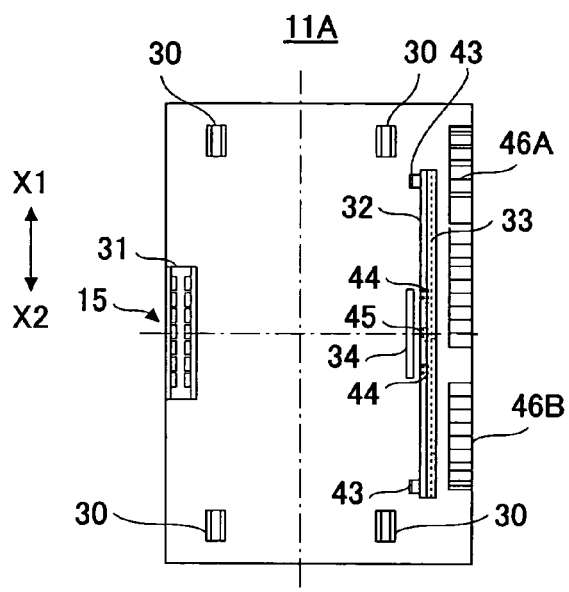
FIG. 2A is a plan view of the fixed base of the mover device in accordance with the first embodiment.
Figure 2B:
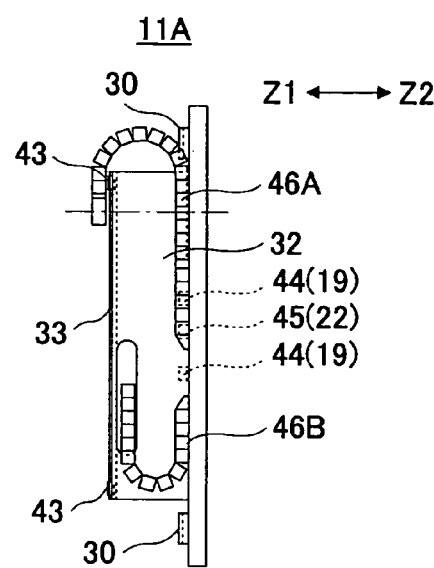
FIG. 2B is a right side view of the fixed base of the mover device in accordance with the first embodiment.
Figure 2C:
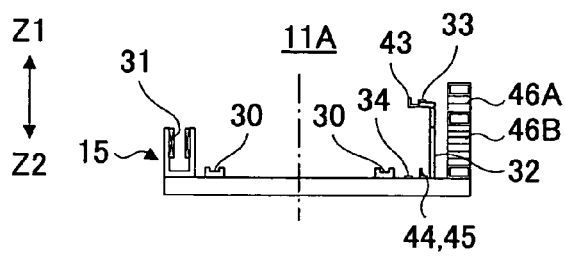
FIG. 2C is a front view of the fixed base of the mover device in accordance with the first embodiment.
Figure 3A:
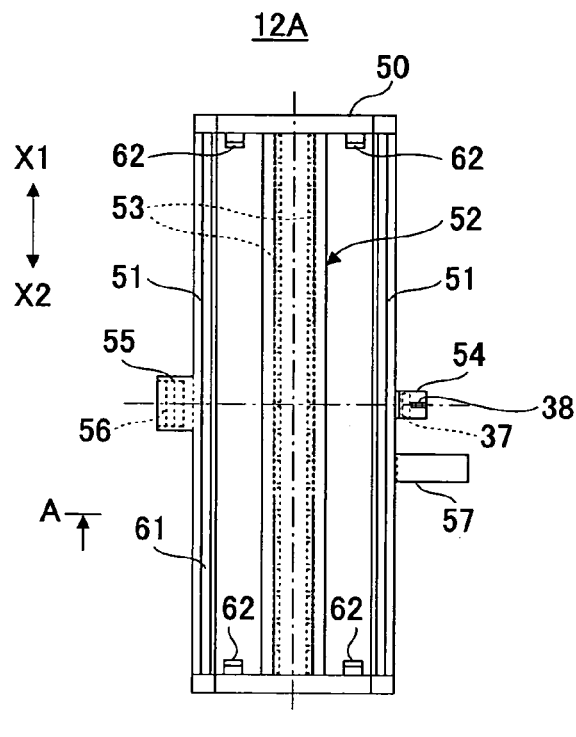
FIG. 3A is a plan view of the movable base of the mover device in accordance with the first embodiment.
Figure 3B:
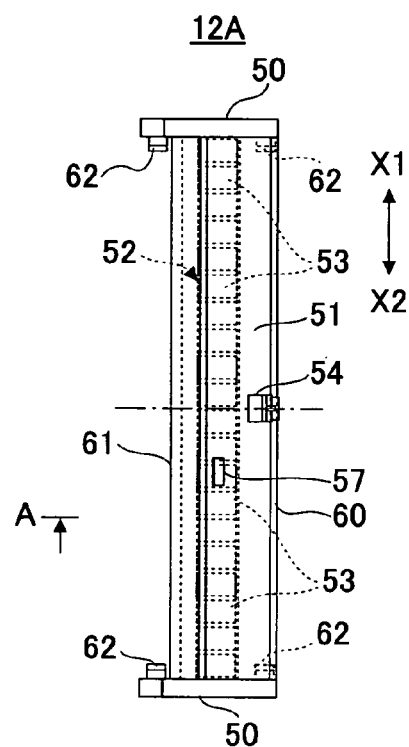
FIG. 3B is a right side view of the movable base of the mover device in accordance with the first embodiment.
Figure 3C:
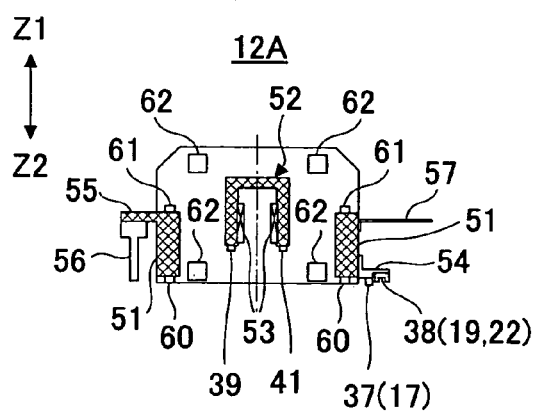
FIG. 3C is a section view of the movable device, taken along the line A—A of FIG. 3A.
Figure 4A:
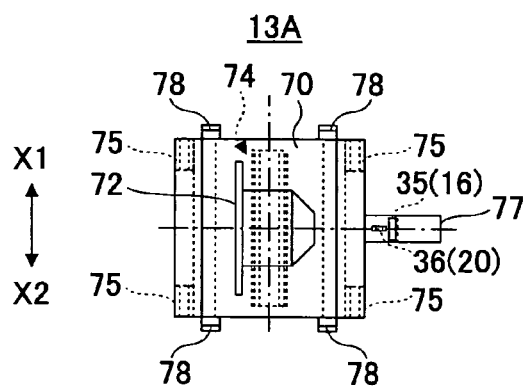
FIG. 4A is a plan view of the processing base of the mover device in accordance with the first embodiment.
Figure 4B:
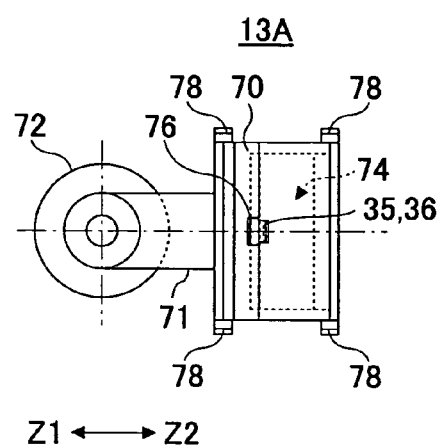
FIG. 4B is a right side view of the processing base of the mover device in accordance with the first embodiment.
Figure 4C:
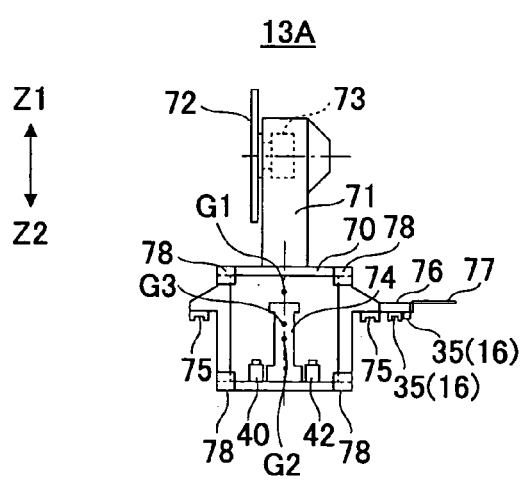
FIG. 4C is a front view of the processing base of the mover device in accordance with the first embodiment.

FIGS. 1A through 4C illustrate the hardware structure of a mover device 10A in accordance with a first embodiment of the present invention. FIGS. 1A through 1F illustrate the entire structure of the mover device 10A. FIGS. 2A through 2C illustrate a fixed base 11A. FIGS. 3A through 3C illustrate a movable base 12A. FIGS. 4A through 4C illustrate a processing base 13A.

As shown in FIGS. 1A through 1F, the mover device 10A includes the fixed base 11A, the movable base 12A, the processing base 13A, a main linear motor 14, and a sub linear motor 15. The mover device 10A linearly moves the processing base 13A in a reciprocation manner in the directions of the arrows X1 and X2 shown in the drawings. This is carried out in accordance with a control operation performed by a later described control device 80 (see FIG. 6).

The fixed base 11A will be first described. As shown in FIGS. 1A through 1F and FIGS. 2A through 2C, the fixed base 11A has a linear guide block 30 in the vicinity of each of the four corners. The linear guide blocks 30 are to be engaged with first linear guide rails 60 formed in the movable base 12A that will be described later. With the linear guide blocks 30 being engaged with the first linear guide rails 60, the movable base 12A can be movable in the directions of the arrows X1 and X2 with respect to the fixed base 11A.

Sub linear motor magnets 31 that form the sub linear motor 15 are provided at the center left in the fixed base 11A shown in FIG. 2A. The sub linear motor magnets 31 are provided at predetermined intervals, and are divided into two rows, with a space being formed between the two rows. A sub linear motor coil unit 56 (provided on the movable base 12A) that is a part of the sub linear motor 15 is inserted in the space. Here, the sub linear motor coil unit 56 is movable in the directions of the arrows X1 and X2.

At the center right in the fixed base 11A shown in FIG. 2A, a holder board 32, a F-P (Fixed-Processing) linear scale 33, a F-M (Fixed-Movable) linear scale 34, F-P overrun detecting pieces 43, F-M overrun detecting pieces 44, a movable base origin mark 45, and cable bearings 46A and 46B are provided.

The holder board 32 is a board material standing on the fixed base 11A, and extends in the directions of X1 and X2, as shown in FIG. 2B. The F-P linear scale 33 and the F-P overrun detecting pieces 43 are provided on the upper surface of the holder board 32, as shown in FIGS. 2A and 2C.

The F-P linear scale 33 extends in the directions of X1 and X2 on the upper surface of the holder board 32. The length of the F-P linear scale 33 should be longer than the moving range of the processing base 13A in the directions of X1 and X2. The F-P linear scale 33 has an alternating multi-phase (A, B, . . . Z phases) structure in which high light reflectance parts and low light reflectance parts are alternately arranged at predetermined intervals. The F-P linear scale 33 forms a F-P sensor 16 in cooperation with an optical sensor 35 provided on the processing base 13A.

The F-P sensor 16 detects the location of the movable base 12A with respect to the fixed base 11A. The location information as to the movable base 12A with respect to the fixed base 11A that is detected by the F-P sensor 16 is sent to the control device 80 (see FIG. 6).

The F-P overrun detecting pieces 43 are provided at the X1 end and the X2 end of the holder board 32. As shown in FIG. 2C, each of the F-P overrun detecting pieces 43 is a bent claw-like piece having an L-shape. The F-P overrun detecting pieces 43 form a F-P overrun sensor 20 in cooperation with a photointerrupter 36 provided in the processing base 13A.

The F-P overrun sensor 20 detects a movement of the processing base 13A outside the predetermined allowable moving range due to an external disturbance or the like. Such a movement of the processing base 13A will be hereinafter referred to as an overrun. The positions of the F-P overrun detecting pieces 43 are restricted within the allowable reciprocation moving range of the processing base 13A in the directions of X1 and X2. When the F-P overrun sensor 20 detects an overrun of the processing base 13A, the overrun detection information is sent to the control device 80 (see FIG. 6).

The F-M linear scale 34 extends in the directions of X1 and X2 on the upper surface of the fixed base 11A, and is longer than the moving range of the movable base 12A in the directions of X1 and X2 with respect to the fixed base 11A. Like the F-P linear scale 33, the F-M linear scale 34 has a multi-phase (A, B, . . . Z phases) structure in which high light reflectance parts and low light reflectance parts are alternately arranged at predetermined intervals. The F-M linear scale 34 having such a structure forms a F-M sensor 17 in cooperation with an optical sensor 37 (shown in FIG. 3C) provided in the movable base 12A.

The pair of F-M overrun detecting pieces 44 are provided at a predetermined distance from each other on the fixed base 11A. As shown in FIG. 2C, each of the F-M overrun detecting pieces 44 is a bent claw-like piece having an L-shape. The F-M overrun detecting pieces 44 form a F-M overrun sensor 19 in cooperation with a photointerrupter 38 provided in the movable base 12A.

The F-M overrun sensor 19 detects a movement of the movable base 12A outside the predetermined allowable moving range due to an external disturbance or the like. Such a movement of the movable base 12A will be hereinafter referred to as an overrun. The positions of the F-M overrun detecting pieces 44 are restricted within the allowable reciprocation moving range of the movable base 12A in the directions of X1 and X2. When the F-M overrun sensor 19 detects an overrun of the movable base 12A, the overrun detection information is sent to the control device 80 (see FIG. 6).

The movable base origin mark 45 is located at the middle point between the pair of F-M overrun detecting pieces 44 in this embodiment. This movable base origin mark 45 is a claw-like piece having an L shape, which is the same as each of the F-M overrun detecting pieces 44. The movable base origin mark 45 forms a movable base origin detecting sensor 22 in cooperation with the photointerrupter 38.

The movable base origin detecting sensor 22 detects the location of the movable base 12A with respect to the fixed base 11A when the mover device 10A is activated. Therefore, the control device 80 cannot grasp the current location of the movable base 12A immediately before and after the mover device 10A is activated.

After the mover device 10A is activated, the control device 80 moves the movable base 12A until the photointerrupter 38 detects the movable base origin mark 45. When the movable base origin mark 45 is detected, the control device 80 sets an origin that is to be used in software operations (this origin will be hereinafter referred to as the software origin).

As the software origin is set in the above manner, the location of the movable base 12A with respect to the location of the fixed base 11A can be detected from the software origin. Therefore, after the setting of the software origin, the F-M sensor 17 (including the F-M linear scale 34 and the optical sensor 37) can detect the location of the movable base 12A with respect to the location of the fixed base 11A.

The cable bearings 46A and 46B are provided on the outer sides of the holder board 32 of the fixed base 11A. Inside the cable bearings 46A and 46B, various cables that are connected to the movable base 12A and the processing base 13A are provided. The cable bearing 46A is connected to the processing base 13A, while the cable bearing 46B is connected to the movable base 12A.

The movable base 12A will be next described. As shown in FIGS. 1A through 1F and FIGS. 3A through 3C, the movable base 12A includes a pair of sideboards 50, side connecting bodies 51, a center part connecting body 52, the sub linear motor coil unit 56, the first linear guide rails 60, second linear guide rails 61, and reverse facilitating magnets 62. The movable base 12A is mounted to the fixed base 11A, and is movable in the directions of the arrows X1 and X2.

The pair of sideboards 50 is provided at a distance from each other in the directions of the arrows X1 and X2. Between the two sideboards 50, the side connecting bodies 51 are provided on the left side and the right side in FIG. 3A. At the center point between the two sideboards 50, the center part connecting body 52 is provided. With the pair of sideboards 50 being connected with the connecting bodies 51 and 52, the movable base 12A has a rigid body.

The side connecting body 51, which is provided on the left side in FIG. 3A, has a motor arm that is located at the center with respect to the directions of X1 and X2, and extends to the left in FIG. 3A. As shown in FIG. 3C, the motor arm 55 has the sub linear motor coil unit 56 extending downward.

The sub linear motor coil unit 56 has coils provided therein. These coils are cooled down to a predetermined temperature by a cooling mechanism (not shown), and are capable of generating a strong magnetic field though small in size.

The coils provided in the sub linear motor coil unit 56 are so-called coreless coils. With the use of the coreless coils, cogging force generation can be prevented when the sub linear motor 15 is driven. Thus, the sub linear motor 15 can smoothly move the movable base 12A with high precision. The sub linear motor coil unit 56 forms the sub linear motor 15 in cooperation with the sub linear motor magnets 31 provided in the fixed base 11A.

The sub linear motor 15 moves the movable base 12A in the directions of the arrows X1 and X2 with respect to the fixed base 11A. The sub linear motor 15 is controlled by the control device 80 (see FIG. 6).

It is also possible to employ a linear motor with a core. In such a case, a control operation may be performed to make a correction. If cogging force is generated from a linear motor with a core driven at a uniform velocity, a correcting operation needs to be performed to generate positive acceleration to cancel the cogging force. Since the size of the cogging force generated from the linear motor is a known value, the correcting operation to cancel the cogging force is relatively easy.

Meanwhile, the side connecting body 51 provided on the right side in FIG. 3A has a sensor arm 54 that is located at the center with respect to the directions of the X1 and X2, and extends to the right in FIG. 3A. Also, a cable bearing arm 57 to which the cable bearing 46B is connected is provided at a location slightly shifted from the location of the sensor arm 54 in the direction of X2.

The sensor arm 54 holds the optical sensor 37 that forms the F-M sensor 17 in cooperation with the F-M linear scale 34, and the photointerrupter 38 that forms the F-M overrun sensor 19 in cooperation with the F-M overrun detecting pieces 44. The photointerrupter 38 also functions as the movable base origin detecting sensor 22 in cooperation with the movable base origin mark 45.

As shown in FIG. 3C, the center part connecting body 52 has three walls, and main linear motor magnets 53 that form the main linear motor 14 are provided on the inner surfaces of the walls. The main linear motor magnets 53 are arranged at predetermined intervals, and are divided into two rows, with a space being formed in between. A main linear motor coil unit 74 (provided on the processing base 13A) that is also a part of the main linear motor 14 is inserted in the space between the two rows of the main linear motor magnets 53. Here, the main linear motor coil unit 74 is movable in the directions of the arrows X1 and X2.

Four reverse facilitating magnets 62 are formed on each of the inner surfaces of the two facing sideboards 50 of the movable base 12A. There are eight reverse facilitating magnets 62 provided on the inner surfaces of the two facing sideboards 50 of the movable base 12A. The reverse facilitating magnets 62 help the processing base 13A to reverse near an end of the movable base 12A by virtue of magnetic repulsion. More specifically, when the processing base 13A reverses in an reciprocation movement, the reverse facilitating magnets 78 exhibit a braking effect, a stopping effect, and a reverse directing effect.

Each of the side connecting bodies 51 has a first linear guide rail 60 provided at the lower end (on the Z2 side in FIG. 3C), and has a second linear guide rail 61 at the upper end (on the Z1 side in FIG. 3C). The first linear guide rails 60 and the second linear guide rails 61 extend in the directions of the arrows X1 and X2, and are flanked by the pair of sideboards 50.

The first linear guide rails 60 are to be engaged with the linear guide blocks 30 provided on the fixed base 11A. Accordingly, the movable base 12A moves in the directions of the arrows X1 and X2, being guided by the linear guide blocks 30 and the first linear guide rails 60. Even in a high speed movement, the movable base 12A can remain positioned with high precision, and move in a stable state.

Meanwhile, the second linear guide rails 61 are to be engaged with linear guide blocks provided on the processing base 13A. Accordingly, the processing base 13A moves in the directions of the arrows X1 and X2, being guided by the second linear guide rails 61 and the linear guide blocks 75. Even in a high speed movement, the processing base 13A can remain positioned with high precision, and move in a stable state.

Further, a P-M (Processing-Movable) linear scale 39 and a processing base origin mark 41 are provided at the two lower ends of the center part connecting body 52 having the three walls. In FIG. 3C, the P-M linear scale 39 is provided at the left lower end of the center part connecting body 52, while the processing base origin mark 41 is provided at the right lower end of the center part connecting body 52.

The P-M linear scale 39 is formed over a longer range than the moving range of the processing base 13A in the directions of X1 and X2 with respect to the movable base 12A. Like each of the linear scales 33 and 34, the P-M linear scale 39 has a multi-phase (A, B, . . . Z phases) structure in which high light reflectance parts and low light reflectance parts are alternately arranged at predetermined intervals. The P-M linear scale 39 having such a structure forms a P-M sensor 18 in cooperation with an optical sensor 40 (see FIG. 4C) provided in the processing base 13A.

The processing base origin mark 41 is located at the center point of the center part connecting body 52 extending in the directions of X1 and X2 in this embodiment. The processing base origin mark 41 is a mark (a reflection sheet) that includes only the high reflectance parts of the linear scale. The processing base origin mark 41 forms a processing base origin detecting sensor 21 in cooperation with an optical sensor 42 provided in the processing base 13A.

The processing base origin detecting sensor 21 detects the location of the processing base 13A with respect to the movable base 12A when the mover device 10A is activated. Therefore, the control device 80 cannot grasp the current location of the processing base 13A immediately before and after the mover device 10A is activated.

After the mover device 10A is activated, the control device 80 moves the processing base 13A on the movable base 12A until the optical sensor 42 detects the processing base origin mark 41. When the processing base origin mark 41 is detected, the control device 80 sets an origin that is to be used in software operations (this origin will be hereinafter referred to as the software origin).

As the software origin is set in the above manner, the location of the processing base 13A with respect to the location of the movable base 12A can be detected from the software origin. Therefore, after the setting of the software origin, the P-M sensor 18 (including the P-M linear scale 39 and the optical sensor 40) can detect the location of the processing base 13A with respect to the location of the movable base 12A.

The movement of the processing base 13A with respect to the fixed base 11A is also detected by the F-P sensor 16 (including the F-P linear scale 33 and the optical sensor 35). It is therefore necessary to set a software origin for the F-P sensor 16 in the same manner as the setting of the software origins for the F-M sensor 17 and the P-M sensor 18. This software origin will be hereinafter referred to as the F-P software origin.

In this embodiment, the F-P software origin is determined through an arithmetic operation. More specifically, the movable base 12A moves with respect to the fixed base 11A, and the processing base 13A moves with respect to the movable base 12A. The software origin of the movable base 12A with respect to the fixed base 11A (this origin will be hereinafter referred to as the F-M software origin) and the software origin of the processing base 13A with respect to the movable base 12A (this software origin will be hereinafter referred to as the P-M software origin) are set in the above described manner. Accordingly, the F-P software origin can be determined through an arithmetic operation based on the F-M software origin and the P-M software origin.

The processing base 13A will be described next. As shown in FIGS. 1A through 1F and FIGS. 4A through 4C, the processing base 13A includes a housing 70, a stay frame 71, a platen 72, and the main linear motor coil unit 74.

The housing 70 has a rectangular shape, with a hollow being formed inside. The stay frame 71 stands on the upper part of the housing 70. The platen 72, to which an object to be processed, such as a wafer, is to be attached, is provided at the upper end of the stay frame 71. The platen 72 can be rotated by a platen motor 73 built in the processing base origin mark 41.

As shown in FIG. 4C, the main linear motor coil unit 74, the optical sensor 40, and the optical sensor 42 are provided inside the housing 70. The main linear motor coil unit 74 has coils provided therein. The coils are cooled down to a predetermined temperature by a cooling mechanism (not shown), and accordingly, can generate a strong magnetic field.

The coils provided in the main linear motor coil unit 74 are so-called coreless coils. With the use of the coreless coils, cogging force generation can be prevented. This main linear motor coil unit 74 forms the main linear motor 14 in cooperation with the main linear motor magnets 53 provided on the movable base 12A.

The main linear motor 14 moves (or drives) the processing base 13A in the directions of the arrows X1 and X2 with respect to the movable base 12A. The main linear motor 14 is controlled by the controlling device 80 (see FIG. 6). As a linear motor that can linearly reciprocate and can be easily controlled is employed as the moving force generator for the movable base 12A in this embodiment, highly responsive control operations can be performed through simple processes. The same applied to the sub linear motor 15. Also, the main linear motor 14 may be a linear motor with a core.

The optical sensor 40 forms the P-M sensor 18 in cooperation with the P-M linear scale 39. The optical sensor 40 is provided on a side of the main linear motor coil unit 74. Meanwhile, the optical sensor 42 forms the processing base origin detecting sensor 21 in cooperation with the processing base origin mark 41. The optical sensor 42 is also provided on a side of the main linear motor coil unit 74.

The housing 70 has a sensor arm 76 that extends to the right in FIGS. 4A and 4C. This sensor arm 76 has the optical sensor 35 and the photointerrupter 36 attached thereto. The optical sensor 35 forms the F-P sensor 16 in cooperation with the F-P linear scale 33. Meanwhile, the photointerrupter 36 forms the F-P overrun sensor 20 in cooperation with the F-P overrun detecting pieces 43. Also, a cable bearing arm 77 to which the cable bearing 46A is to be connected is provided at the end of the sensor arm 76.

The linear guide blocks 75 are provided at the four corners of the housing 70, as shown in the plan view of FIG. 4A. The linear guide blocks 75 are to be engaged with the second linear guide rails 61 provided in the movable base 12A. Accordingly, the processing base 13A can move steadily in the directions of the arrows X1 and X2, guided by the second linear guide rails 61 and the linear guide blocks 75, which position the processing base 13A with high precision.

In this embodiment, the second linear guide rails 61 provided in the movable base 12A are engaged with the linear guide blocks 75 provided on the processing base 13A, so as to guide the processing base 13A in a linear movement. However, it is also possible to provide third linear guide rails on the fixed base 11A. In such a case, the third linear guide rails are engaged with the linear guide blocks 75, so as to guide the processing base 13A in a linear movement. Where the third linear guide rails are employed, the second linear guide rails 61 can be omitted.

The housing 70 further has the reverse facilitating magnets 78. When the processing base 13A is mounted onto the movable base 12A, the reverse facilitating magnets 78 face the reverse facilitating magnets 62 provided on the sideboards 50 of the movable base 12A. More specifically, the reverse facilitating magnets 78 face the reverse facilitating magnets 62 in the moving direction of the movable base 12A. The reverse facilitating magnets 62 provided on the sideboards 50 facing each other have the same polarity as the reverse facilitating magnets 78 provided on the housing 70.

Although the processing base 13A reciprocates in the directions of the arrows X1 and X2 on the movable base 12A, the reverse facilitating magnets 62 and 78 help the reverse movements in the reciprocating movements of the processing base 13A. Referring now to FIG. 1B, the reverse helping operation of the reverse facilitating magnets 62 and 78 will be described below.

In this example, the processing base 13A has reached the limit in the direction of the arrow X1, and is about to reverse the moving direction and move in the direction of the arrow X2. Under the control of the controlling device 80 that will be described later, the processing base 13A slows down after the constant movement in the X1 direction.

As the processing base 13A moves in the X1 direction, the reverse facilitating magnets 78 provided on the housing 70 (the processing base 13A) approach the reverse facilitating magnets 62 provided on the sideboards 50 (the movable base 12A). Since the reverse facilitating magnets 62 have the same polarity as the reverse facilitating magnets 78, repulsion forces are caused between the reverse facilitating magnets 62 and the reverse facilitating magnets 78. As the processing base 13A approaches the sideboards 50, the repulsion forces between the magnets 62 and the magnets 78 gradually increase, and finally push the processing base 13A in the direction of the arrow X2 (i.e., the reverse direction).

When the processing base 13A is reversed, the main linear motor 14 and the sub linear motor 15 reverse the moving direction of the processing base 13A. Therefore, it is necessary to generate a large driving force. As a result, the power consumption of each of the linear motors 14 and 15 increases every time the processing base 13A is reversed.

With the reverse facilitating magnets 62 and 78, however, the repulsion forces caused between the magnets 62 and the magnets 78 facilitate the reversing of the processing base 13A. Accordingly, the power consumption (the load) of each of the linear motors 14 and 15 can be reduced, and the processing base 13A can be more smoothly reversed compared with a case where the processing base 13A is reversed only by the linear motors 14 and 15. The same effect is of course expected when the processing base 13A is reversed after reaching the limit in the direction of the arrow X2.

Referring now to FIGS. 5A through 5H, the basic operation of the mover device 10A having the above described structure will be described. Although various control operations are performed by the sub linear motor 15 in an actual moving operation of the processing base 13A, the following description of the basic operation of the mover device 10A illustrated in FIGS. 5A through 5H does not involve the sub linear motor 15, for ease of explanation.

The mover device 10A of this embodiment has the movable base 12A provided movably in the directions of X1 and X2 on the fixed base 11A, and the processing base 13A provided movably in the directions of X1 and X2 on the movable base 12A. The main linear motor 14 drives the processing base 13A to linearly reciprocate in the directions of X1 and X2 with respect to the movable base 12A.

Figure 5A:
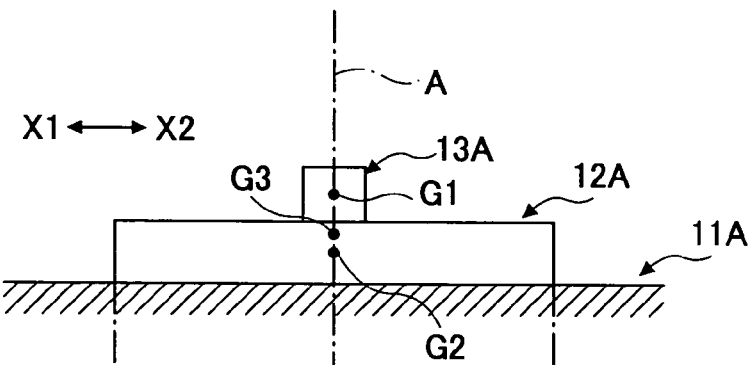
FIGS. 5A through 5H illustrate the center of composite gravity between the processing base and the movable base.
Figure 5B:
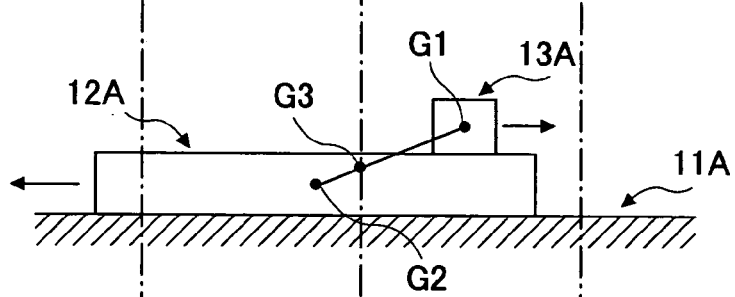

FIG. 5A illustrates a situation in which the processing base 13A and the movable base 12A are located in the movement center position (indicated by the dashed lines denoted by A in FIG. 5A). FIG. 5D illustrates the processing base 13A and the movable base 12A in the situation of FIG. 5A, seen from the right. In this situation, the main linear motor 14 provided between the movable base 12A and the processing base 13A drives the processing base 13A to move in the direction of the arrow X2 with respect to the fixed base 11A.

The main linear motor 14 drives (increases or reduces the speed) the processing base 13A to move in the direction of the arrow X2 with respect to the movable base 12A. Here, the movable base 12A receives a reaction force generated from the moving force of the processing base 13A moving in the X2 direction. As a result, the movable base 12A is pushed in the direction of the arrow X1. As the movable base 12A is movable in the directions of X1 and X2 with respect to the fixed base 11A, the movable base 12A is moved by the reaction force in the X1 direction, as shown in FIG. 5B.

Likewise, when the main linear motor 14 drives the processing base 13A to move in the direction of the arrow X1 through acceleration or deceleration, a reaction force is generated to push the movable base 12A in the X2 direction. Accordingly, the movable base 12A is moved in the X2 direction by the reaction force.

The application direction of the reaction force onto the movable base 12A is opposite to the moving direction of the processing base 13A. Here, the acceleration in the movement of the movable base 12A is inversely proportional to the mass ratio of the processing base 13A to the moving member 12A.

As the movable base 12A is moved by the reaction force generated from the moving force of the processing base 13A, the reaction force generated by accelerating or decelerating the processing base 13A does not reach the fixed base 11A, and is absorbed by the movement of the movable base 12A.

More specifically, the movable base 12A converts the reaction force into the moving force of the movable base 12A, and also uses the reaction force as a counter weight to reduce the movement of the movable base 12A with respect to the processing base 13A. Even if the processing base 13A is moved at a high speed (50 $\mu$s or 100 $\mu$s, for example), the mover device 10A can be prevented from vibrating when the processing base 13A is accelerated or decelerated. Thus, the processing base 13A can be steadily moved with high precision.

When driving the processing base 13A, the main linear motor 14 overcomes the force to start the moving member 12A, and moves the processing base 13A with a greater force than the moving force of the movable base 12A in the opposite direction. In other words, the force F1 that is required to move the movable base 12A in the directions of X1 and X2 with respect to the fixed base 11A is greater than the force F2 that is required to move the processing base 13A in the directions of X1 and X2 with respect to the movable base 12A (F1>F2).

So as to form the above structure, the weight of the processing base 13A is made lighter than the weight of the movable base 12A, for example. By doing so, the processing base 13A can be started with certainty, while the movable base 12A can also be started.

Referring to FIGS. 5A through 5H, the relationships among the center of gravity G1 of the processing base 13A, the center of gravity G2 of the movable base 12A, and the center of composite gravity G3 of the center of gravity G1 of the processing base 13A and the center of gravity G2 of the movable base 12A, will now be described. FIGS. 5A through 5H schematically illustrate the fixed base 11A, the movable base 12A, and the processing base 13A. For ease of explanation, the centers of gravity G1, G2, and G3 are located in the center positions of the fixed base 11A, the movable base 12A, and the processing base 13A, respectively.

FIG. 5A illustrates a situation in which the processing base 13A and the movable base 12A are located in the movement center position (indicated by the dashed lines denoted by A in FIG. 5A). In this situation, the centers of gravity G1, G2, and G3 are all located in the movement center position A. More specifically, the center of gravity G1 of the processing base 13A, the center of composite gravity G3, and the center of gravity G2 of the movable base 12A are located in this order, seen from the top in FIG. 5A.

FIG. 5B illustrates a situation in which the processing base 13A has moved in the X2 direction. As the processing base 13A has moved in the X2 direction, the movable base 12A has moved in the X1 direction due to the reaction force. Here, the acceleration in the movement is inversely proportional to the mass ratio of the processing base 13A to the movable base 12A.

As the processing base 13A and the movable base 12A move, the center of gravity G1 of the processing base 13A and the center of gravity G2 of the movable base 12A move. In the mover device 10A of this embodiment, however, the center of composite gravity G3 remains at a predetermined point over the fixed base 11A, regardless of the movements of the processing base 13A and the movable base 12A.

Figure 5C:
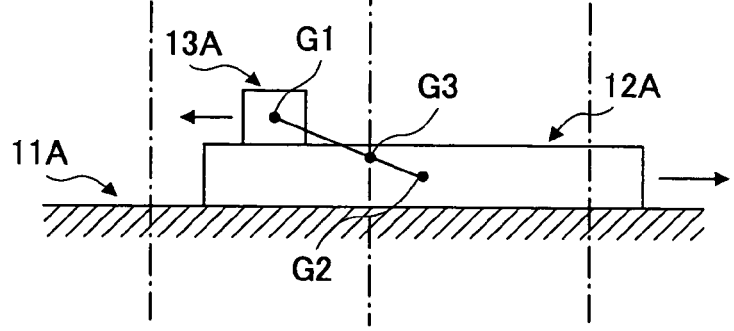
Figure 5D:
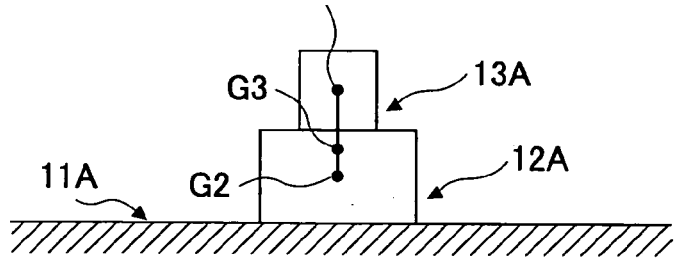

FIG. 5C illustrates a situation in which the processing base 13A has moved in the X1 direction. As the processing base 13A has moved in the X1 direction, the movable base 12A has moved in the X2 direction due to the reaction force. In this situation, the center of composite gravity G3 also remains at the predetermined point (in the movement center position A) over the fixed base 11A, despite the movements of the processing base 13A and the movable base 12A.

As described above, even if the movable base 12A and the processing base 13A move, the center of composite gravity G3 of the center of gravity G1 of the processing base 13A and the center of gravity G2 of the movable base 12A remains at the predetermined point over the fixed base 11A. Accordingly, the fixed base 11A can be prevented from vibrating due to shifting of the center of composite gravity G3. Thus, vibration and noise can be eliminated from the mover device 10A, and the processing base 13A can be steadily moved with high precision.

In the mover device 10A of this embodiment, the center of composite gravity G3 of the center of gravity G1 of the processing base 13A and the center of gravity G2 of the movable base 12A is substantially the same as a composite application point at which the main linear motor 14 and the sub linear motor 15 cooperate to apply a moving force to the processing base 13A.

In other words, the location of the center of composite gravity G3 is substantially the same as the location at which the composite force of the moving force of the main linear motor 14 moving the processing base 13A and the moving force of the sub linear motor 15 moving the processing base 13A through the movable base 12A is applied to move the processing base 13A (this location will be hereinafter referred to as the composite moving force application point).

With this structure, unnecessary moment generation in the processing base 13A can be prevented when the linear motors 14 and 15 apply moving forces to the processing base 13A. Thus, the processing base 13A can be smoothly moved with high precision.

Alternatively, it is possible to employ a structure in which the center of gravity G1 of the processing base 13A, the center of gravity G2 of the movable base 12A, and the center of composite gravity G3 of the two centers of gravity G1 and G2 are located at the same point. In this structure, each of the centers of gravity G1, G2, and G3 (G1=G2=G3) also corresponds to the composite moving force application point.

Figure 5E:
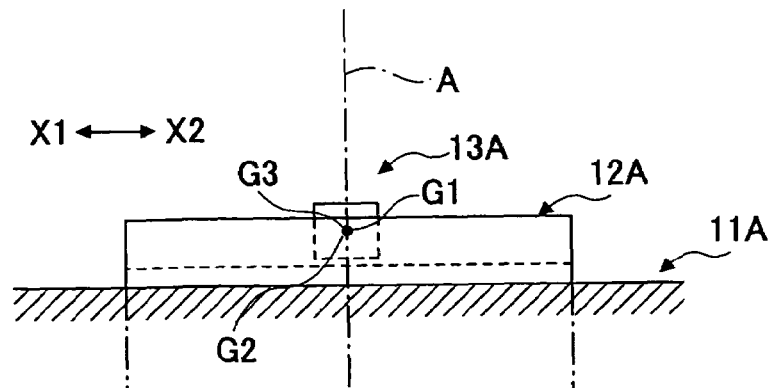

FIG. 5E illustrates a situation in which the processing base 13A and the movable base 12A are located in the movement center position (indicated by the dashed lines denoted by A in FIG. 5E). Here, the centers of gravity G1, G2, and G3 are all located at the same point.

Figure 5F:
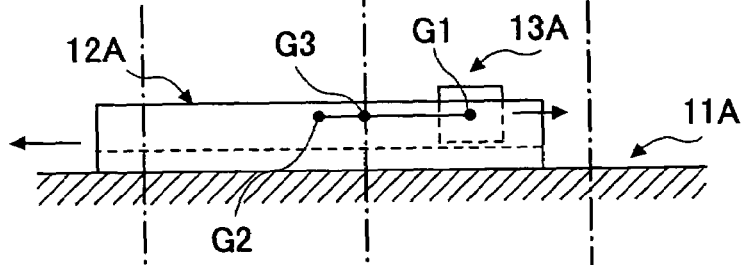

FIG. 5F illustrates a situation in which the processing base 13A has moved in the X2 direction. As the processing base 13A has moved in the X2 direction, the movable base 12A has moved in the X1 direction by the reaction force, as shown in FIG. 5F. As already mentioned in the explanation of the situation shown in FIG. 5B, the acceleration in the movement is inversely proportional to the mass ratio of the processing base 13A to the movable base 12A.

As the processing base 13A and the movable base 12A move, the center of gravity G1 of the processing base 13A and the center of gravity G2 of the movable base 12A move. In the mover device 10A of this embodiment, however, the center of composite gravity G3 remains at a predetermined point over the fixed base 11A, despite the movements of the processing base 13A and the movable base 12A. In this situation, the center of gravity G1 of the processing base 13A and the center of gravity G2 of the movable base 12A are located on the horizontal line that passes through the center of composite gravity G3 and extends in parallel with the fixed base 11A.

Figure 5G:
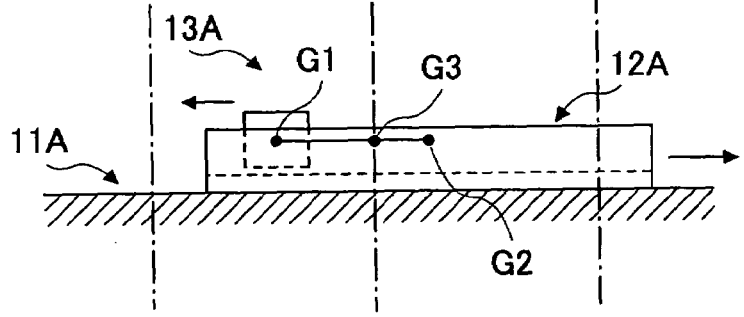
Figure 5H:
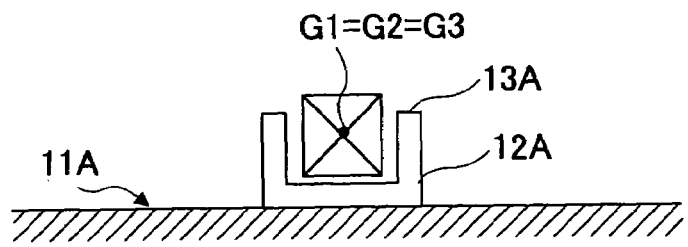

FIG. 5G illustrates a situation in which the processing base 13A has moved in the X1 direction. As the processing base 13A has moved in the X1 direction, the movable base 12A has moved in the X2 direction by the reaction force. In this situation, the center of composite gravity G3 remains at the predetermined point (located in the movement center position A) over the fixed base 11A, despite the movements of the processing base 13A and the movable base 12A. Also, the center of gravity G1 of the processing base 13A and the center of gravity G2 of the movable base 12A are located on the horizontal line that passes through the center of composite gravity G3 and extends in parallel with the fixed base 11A.

With the structure shown in FIGS. 5E through 5H, unnecessary moment generation in the processing base 13A can be prevented, and the processing base 13A can be smoothly moved with high precision.

In the above described mover device 10A of this embodiment, the linear guide blocks 30 are provided on the fixed base 11A, and the first linear guide rails 60 are formed on the movable base 12A. However, it is also possible to form the first linear guide rails 60 on the fixed base 11A and to provide the linear guide blocks 30 on the movable base 12A.

Also, in the above described mover device 10A, the sub linear motor magnets 31 that form the sub linear motor 15 are provided on the fixed base 11A, and the sub linear motor coil unit 56 is provided on the movable base 12A. However, it is possible to provide the sub linear motor coil unit 56 on the fixed base 11A and to provide the sub linear motor magnets 31 on the movable base 12A.

Further, in the above described mover device 10A, the main linear motor magnets 53 that form the main linear motor 14 are provided on the movable base 12A, and the main linear motor coil unit 74 is provided on the processing base 13A. However, it is possible to provide the main linear motor coil unit 74 on the movable base 12A and to provide the main linear motor magnets 53 on the processing base 13A.

Figure 6:
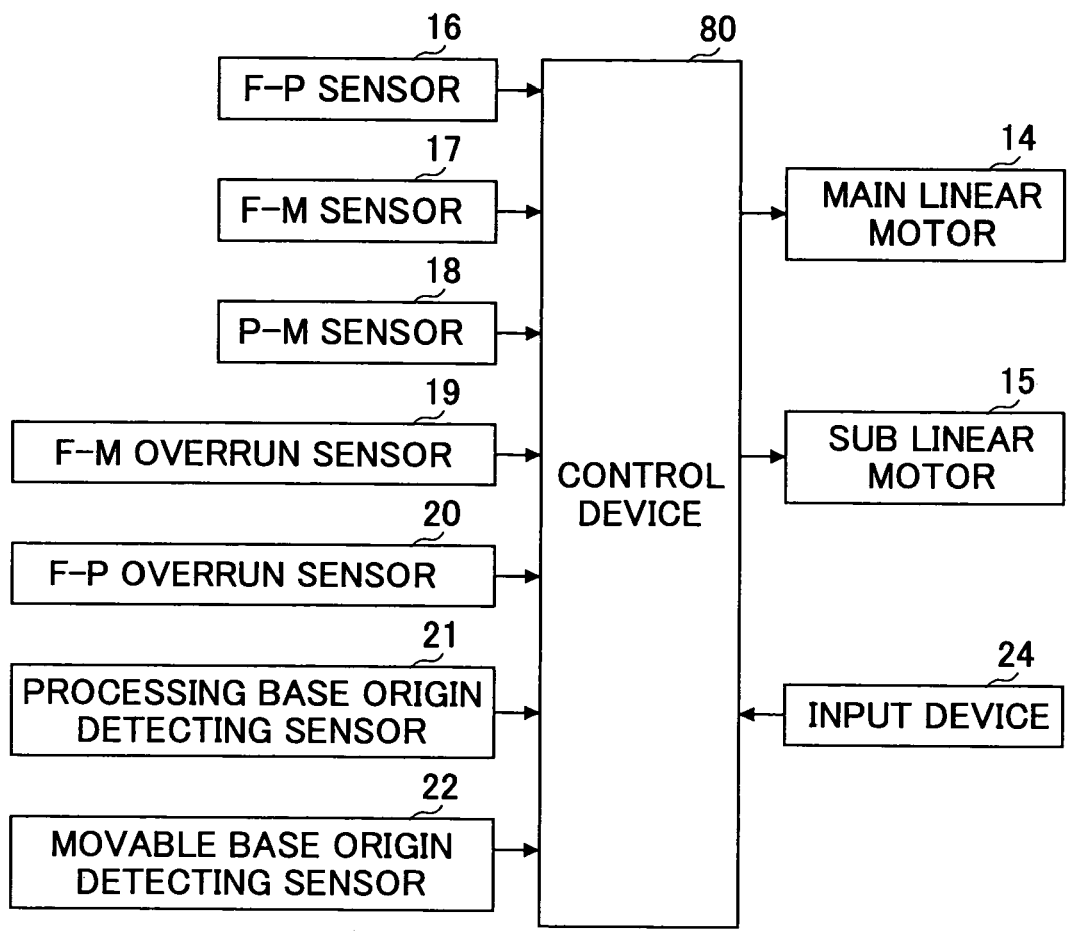
FIG. 6 is a control block diagram of the mover device in accordance with the first embodiment of the present invention.

FIG. 6 is a control block diagram of the mover device 10A. As shown in FIG. 6, the mover device 10A includes the control device 80 that controls all movement of the processing base 13A.

The control device 80 is formed by a computer (such as a microcomputer, a controller, a workstation, or a sequencer). The F-P sensor 16, the F-M sensor 17, the P-M sensor 18, the F-M overrun sensor 19, the F-P overrun sensor 20, the processing base origin detecting sensor 21, the movable base origin detecting sensor 22, and an input device 24, are all connected to the input port side of the control device 80. Meanwhile, the main linear motor 14 and the sub linear motor 15 are connected to the output port side of the control device 80. The control device 80 controls movements of the movable base 12A and the processing base 13A in accordance with a control program that will be described later.

The control device 80 performs various control operations to move the processing base 13A. In the following, those control operations to be performed by the control device 80 will be described.

Figure 7:
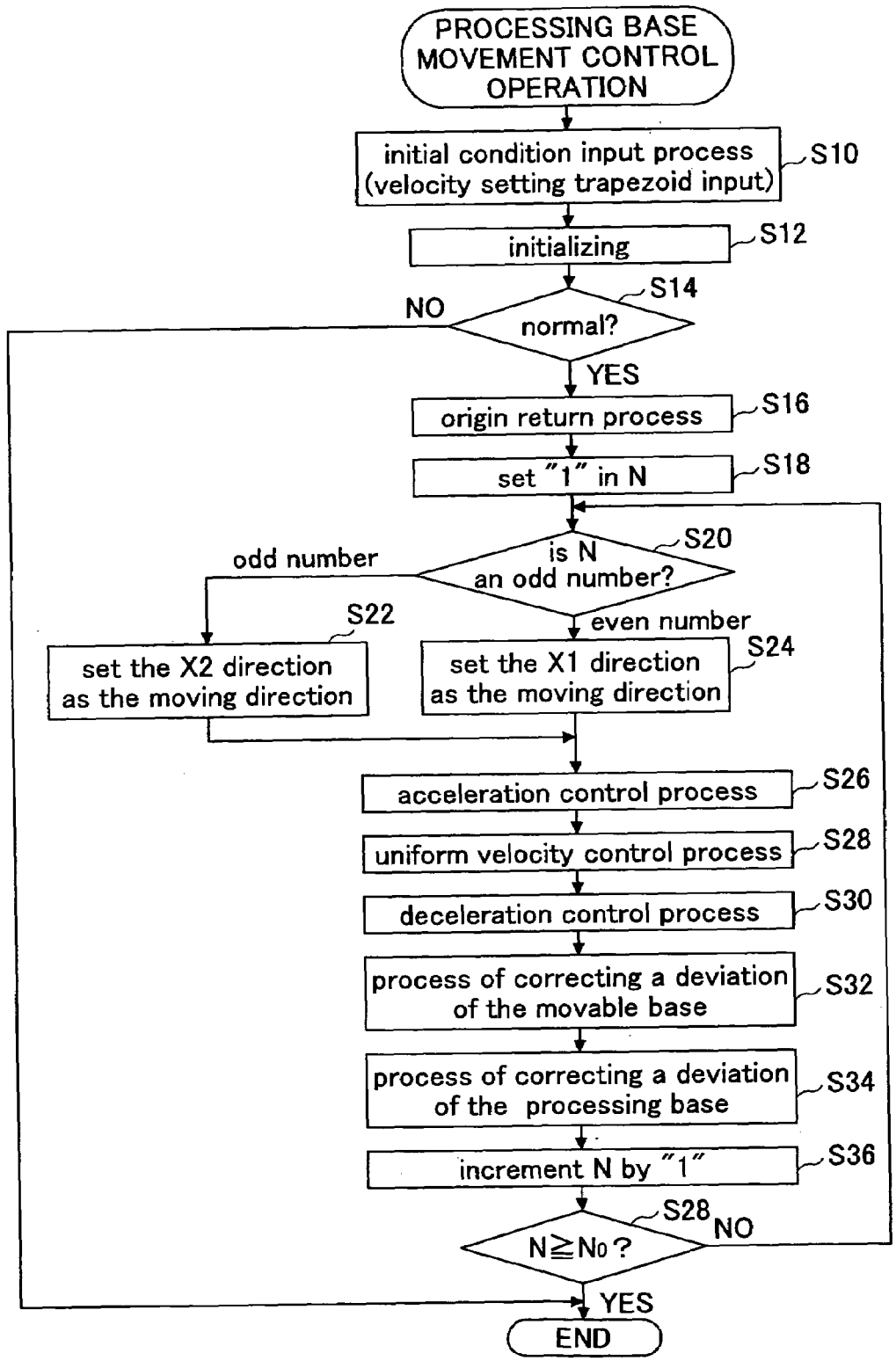
FIG. 7 is a flowchart of a movement control operation to be performed on the processing base.

FIG. 7 is a flowchart of a processing base movement control operation that is performed by the control device 80 so as to move the processing base 13A. The processing base movement control operation is performed to control the mover device 10A including the sub linear motor 15 that has been described with reference to FIGS. 1A through 6.

In the following example of a control operation, the processing base 13A reciprocates in a predetermined range with respect to the fixed base 11A. It should be noted, however, that the control operations in accordance with the present invention are not limited to operations to reciprocate the processing base, but can also be applied to any structure in which the processing base moves only in one direction, including a case where an accelerating process, a uniform velocity process, and a decelerating process are repeated in one direction.

In the example described in the following description, the mover device 10A is incorporated into a wafer processor, and moves a wafer in the wafer processor.

When the processing base movement control operation shown in FIG. 7 starts, an initial condition input process is first carried out in step S10. In the initial condition input process, various initial conditions that are required to move the processing base 13A are input. Specific initial conditions include the diameter of each wafer, a target uniform velocity, the distance of a uniform velocity required range, the number N0 of wafers to be processed, allowable positional deviations QMAX and RMAX from predetermined reference positions, and a velocity setting trapezoid that represents an ideal moving velocity of the processing base 13A (see FIG. 17). Each of the initial conditions is input to the control device 80 by the input device 24.

In step S12, the mover device 10A is initialized. The initializing involves processes of determining whether the mover device 10A, the control device 80, and the processor into which the mover device 10A is incorporated, are ready to operate. The initializing is performed by the control device 80.

Specific initializing processes to be carried out by the control device 80 include: a diagnostic process of checking the control device 80 for problems; an operation checking process for the linear motors 14 and 15; a normality checking process for the coil units 56 and 57 (checking for a problem such as disconnection, a change in the coil resistance value, and a coil cooling temperature); a checking process for power sources; and a normality checking process for the processor into which the mover device 10A is incorporated.

In step S14, the mover device 10A and the processor, into which the mover device 10A is incorporated, are determined whether to be in a normal state and to be ready for the processing base movement control operation, based on the initialing performed in step S12. If the mover device 10A and the processor are determined not to be in a normal state and not to be ready for the processing base movement control operation ("NO" in step S14), steps S16 through S28 are not carried out, and the operation comes to an end. If the mover device 10A and the processor are determined to be in a normal state and to be ready for the processing base movement control operation ("YES" in step S14), the operation moves on to step S16.

Figure 8:
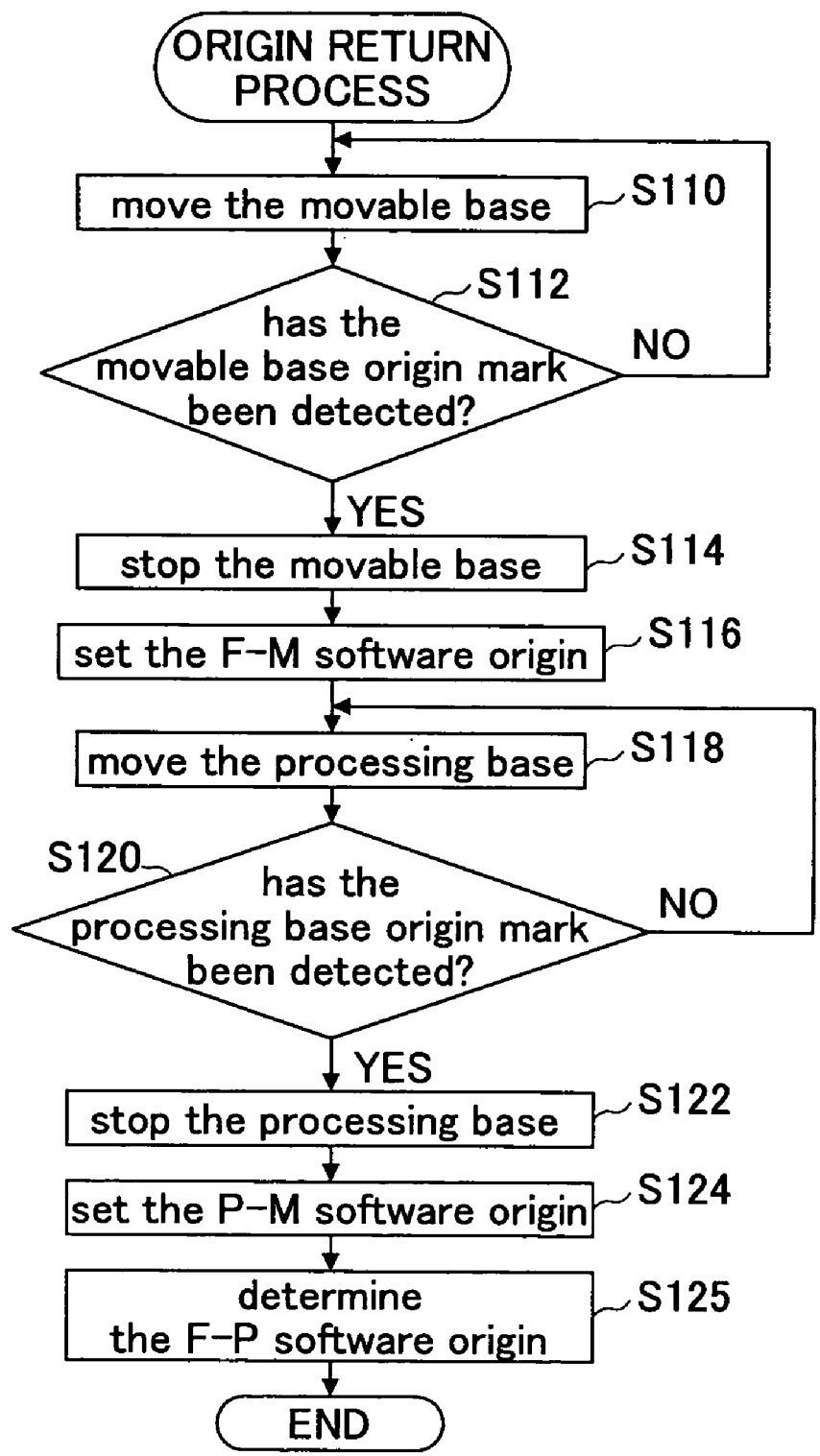
FIG. 8 is a flowchart of an origin return process.

In step S16, an origin return process is carried out to return the movable base 12A and the processing base 13A to the original positions. Referring now to FIG. 8, the origin return process will be described. FIG. 8 is a flowchart of the origin return process.

When the origin return process starts, the control device 80 first drives the sub linear motor 15 to move the movable base 12A with respect to the fixed base 11A in step S110. The moving of the movable base 12A continues until the photointerrupter 38 that forms the movable base origin detecting sensor 22 detects the movable base origin mark 45 (step S112).

When the photointerrupter 38 detects the movable base origin mark 45 in step S112, the operation moves on to step S114. The control device 80 stops the movable base 12A in step S114, and sets the F-M software origin in step S116. Having set the F-M software origin, the control device 80 can recognize the location of the movable base 12A with respect to the fixed base 11A, and hereafter controls movements of the movable base 12A with respect to the fixed base 11A, using the F-M software origin as the reference point.

In step S118, the control device 80 drives the main linear motor 14 to move the processing base 13A with respect to the movable base 12A. The moving of the processing base 13A continues until the optical sensor 42 that forms the processing base origin detecting sensor 21 detects the processing base origin mark 41 (step S120).

When the optical sensor 42 detects the processing base origin mark 41 in step S120, the operation moves on to step S122. The control device 80 then stops the processing base 13A, and sets the P-M software origin in step S124. Having set the P-M software origin, the control device 80 can recognize the location of the processing base 13A with respect to the movable base 12A, and hereafter controls movements of the processing base 13A with respect to the movable base 12A, using the P-M software origin as the reference point.

In step S125, based on the F-M software origin set in step S116 and the P-M software origin set in step S124, the control device 80 performs an arithmetic operation to determine the F-P software origin, which is the movement origin between the fixed base 11A and the processing base 13A.

Having determined the F-P software origin, the control device 80 can recognize the location of the processing base 13A with respect to the fixed base 11A, and hereafter controls movements of the processing base 13A with respect to the fixed base 11A, using the F-P software origin as the reference point. After the F-M software origin, the P-M software origin, and the F-P software origin have been determined in the above manner, the origin return process shown in FIG. 8 comes to an end.

Referring back to FIG. 7, the procedures of step S16 and later in the processing base movement control operation will be described. In step S18, "1" is set in the counter value N. In step S20, the counter value N is determined whether to be an odd number.

If the counter value N is determined to be an odd number in step S20, the operation moves on to step S22. In step S22, the control device 80 carries out a process of setting the X2 direction as the moving direction of the processing base 13A. If the counter value N is determined to be an even number in step S20, the operation moves on to step S24. In step S24, the control device 80 carries out a process of setting the X1 direction as the moving direction of the processing base 13A.

The procedures of steps S20 through S24 are carried out to make the processing base 13A reciprocate. More specifically, after the series of accelerating, uniform velocity, and decelerating processes for the processing base 13A, the counter value N is incremented by "1" in step S36. After the procedures of steps S20 through S38 are carried out for the first time, the determination result of step S38 is "NO", and the procedures of steps S20 through S38 are repeated. If the counter value N is an odd number when the procedures of steps S20 through S38 are carried out for the first time, the counter value N is an even number when the procedures of steps S20 through S38 are carried out for the second time. If the counter value N is an even number for the first time, the counter value N is an odd number for the second time. Accordingly, every time the procedures of steps S20 through S38 are completed, the moving direction of the processing base 13A is reversed. Thus, the processing base 13A reciprocates.

After the moving direction of the processing base 13A is set in steps S24 through 24, the acceleration control process of step S26, the uniform velocity control process of step S28, and the deceleration control process of step S30 are carried out in this order. In this embodiment, there are two driving devices; the main linear motor 14 and the sub linear motor 15. Using the linear motors 14 and 15, movements of the processing base 13A and the movable base 12A are simultaneously controlled through the acceleration, uniform velocity, and deceleration control processes. In the following, the acceleration, uniform velocity, and deceleration control processes to be carried out by the control device 80 on the movable base 12A and the processing base 13A will be described.

Figure 9:
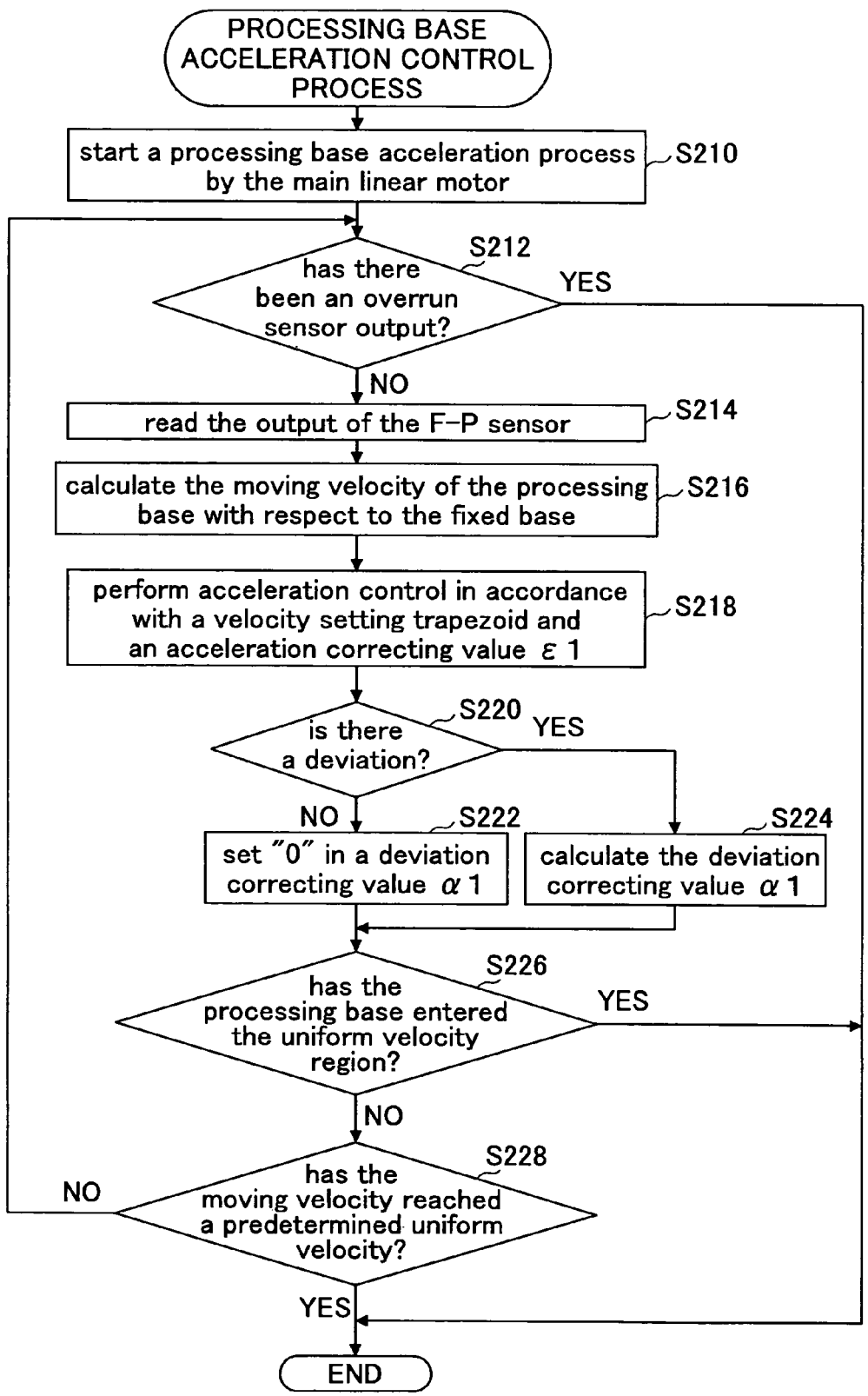
FIG. 9 is a flowchart of an acceleration control process to be carried out for the processing base.
Figure 10:
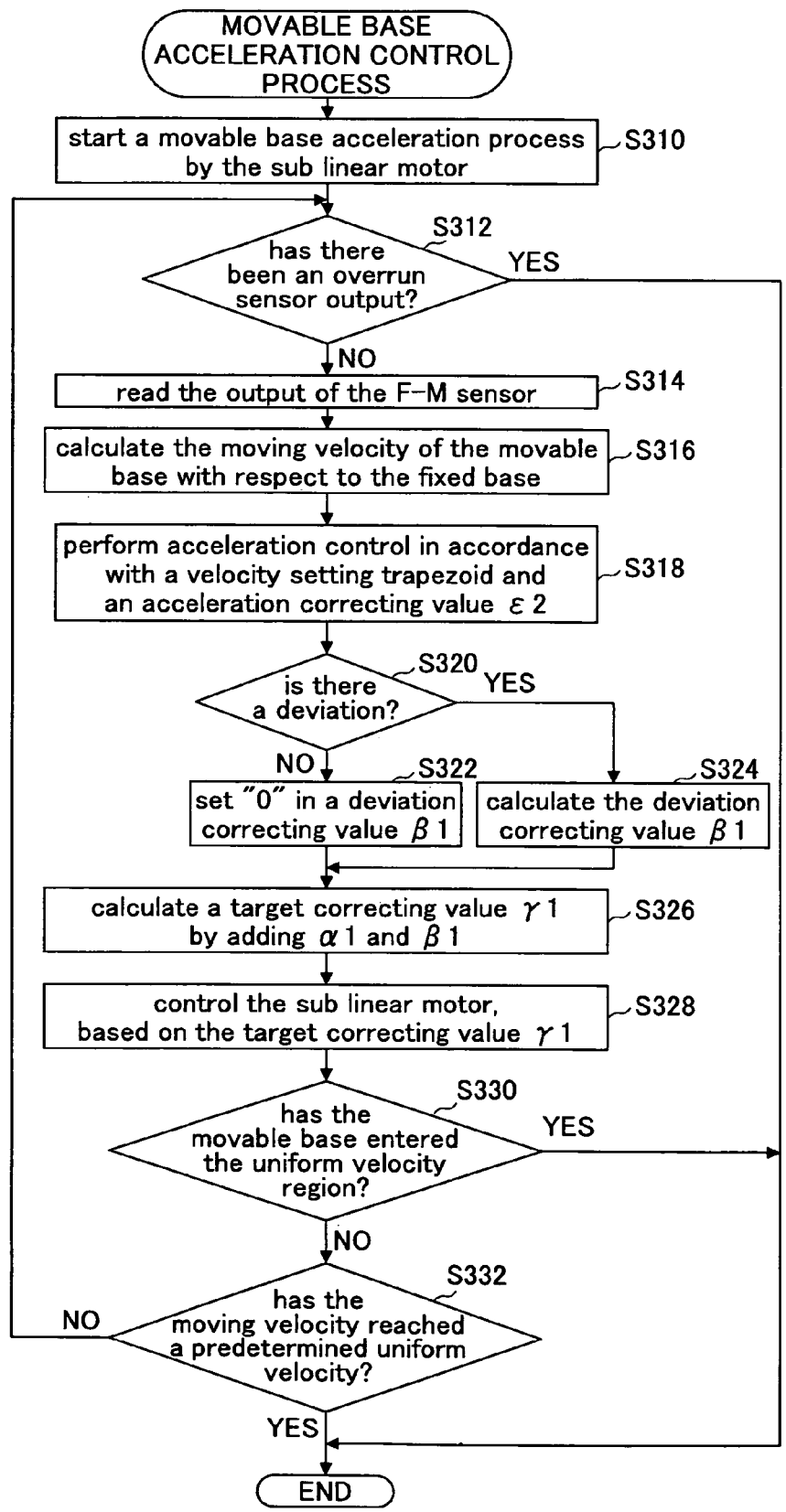
FIG. 10 is a flowchart of an acceleration control process to be carried out for the movable base.

The acceleration control process will be first described. FIG. 9 is a flowchart of the acceleration control process to be carried out on the processing base 13A. FIG. 10 is a flowchart of the acceleration control process to be carried out on the movable base 12A.

When the acceleration control process for the processing base 13A starts, the control device 80 drives the main linear motor 14 in step S210, and an acceleration process for the processing base 13A starts. In step S212, the control device 80 determines whether there has been an output from the F-P overrun sensor 20.

The F-P overrun sensor 20 transmits an output signal to the control device 80 when the processing base 13A moves beyond the allowable reciprocation movement range (overruns the allowable reciprocation movement range) due to adverse influence of an external disturbance or the like. If the control device 80 determines that there has been an output from the F-P overrun sensor 20 in step S212, the procedures of steps S214 through S228 are not carried out, and the acceleration control process comes to an end.

If it is determined that there has not been an output from the F-P overrun sensor 20 ("NO" in step S212), the operation moves on to step S214. In step S214, the output from the F-P sensor 16 is read. In step S216, based on the output from the F-P sensor 16 read in step S214, the control device 80 performs an arithmetic operation to determine the velocity of the processing base 13A with respect to the fixed base 11A.

In step S218, the control device 80 performs acceleration control based on an acceleration correcting value $_n$1 and the velocity setting trapezoid (indicated by the bold solid line A in FIG. 17) that represents the ideal moving velocity of the processing base 13A and has been input in advance in step S10. Here, the acceleration control based on the velocity setting trapezoid A is performed to control the moving velocity of the processing base 13A, so that the moving velocity of the processing base 13A conforms to the acceleration region of the velocity setting trapezoid A shown in FIG. 17.

The bold solid line denoted by A in FIG. 17 represents the ideal moving velocity in an reciprocation movement of the processing base 13A with respect to the fixed base 11A. In FIG. 17, the ordinate axis indicates velocity, while the abscissa axis indicates time. The region between time t0 and time t1 is an acceleration region in which the processing base 13A accelerates in the X1 direction. The region between time t1 and time t2 is a uniform velocity region in which the processing base 13A moves in the X1 direction at a uniform velocity. The region between time t2 and time t3 is a deceleration region in which the processing base 13A decelerates in the X1 direction.

In FIG. 17, the region between time t3 and time t4 is an acceleration region in which the processing base 13A accelerates in the X2 direction. The region between time t4 and time t5 is a uniform velocity region in which the processing base 13A moves in the X2 direction at a uniform velocity. The region between time t5 and time t6 is a deceleration region in which the processing base 13A decelerates in the X2 direction.

The moving velocity of the processing base 13A with respect to the fixed base 11A is controlled to conform to the velocity setting trapezoid A shown in FIG. 17, so that the uniform velocity region of the processing base 13A can be maximized while the processing base 13A smoothly reciprocates.

The acceleration correcting value $_n$1 used in the acceleration control process for the processing base 13A is used for correcting the positional deviation of the processing base 13A from a predetermined reference position. As mentioned earlier, the F-P software origin is determined through the origin return process in step S16 in FIG. 7, and a movement control operation is performed on the processing base 13A based on the F-P software origin as the reference point.

However, the processing base 13A might deviate from the reference position due to an external disturbance, such as errors in the linear motors 14 and 15, or loads on the cable bearings 46A and 46B. If the positional deviation is not corrected, the accuracy in the movement control operation for the processing base 13A decreases. Therefore, if the processing base 13A deviates from the reference position, the positional deviation needs to be corrected. However, if the positional deviation is corrected in the uniform velocity region of the processing base 13A, the moving velocity is changed, and the processing base 13A cannot move at a uniform velocity.

In view of this, the positional deviation of the processing base 13A is corrected in the acceleration region in this embodiment. More specifically, the positional deviation of the processing base 13A from the predetermined reference position is measured, and the acceleration correcting value „1 is determined based on the measured positional deviation. Using the acceleration correcting value „1, the velocity setting trapezoid A is corrected. In this manner, acceleration control is performed on the processing base 13A, so that the moving velocity of the processing base 13A corresponds to the velocity setting trapezoid A, and that the positional deviation of the processing base 13A can be automatically corrected. For convenience of explanation, the process of determining the acceleration correcting value „1 will be described later.

After the procedure of step S218 is completed, the moving velocity of the processing base 13A with respect to the fixed base 11A determined in step S216 is compared with the velocity setting trapezoid A (which is corrected with the acceleration correcting value „1, if the processing base 13A has deviated from the reference position) in step S220. Through the comparison, it is determined whether there is a difference between the moving velocity of the processing base 13A and the velocity setting trapezoid A.

If there is not a difference detected in step S220, the operation moves on to step S222. In step S222, "0" is set in a deviation correcting value „1 („1=0). If there is a difference detected in step S220, the operation moves on to step S224. In step S224, the deviation correcting value „1 to be used for returning the moving velocity of the processing base 13A to the velocity setting trapezoid A is calculated. The deviation correcting value „1 calculated in step S224 is a value to be reflected in the acceleration control process (step S326 in FIG. 10) for the movable base 12A that will be described later.

In step S226, the control device 80 determines whether the processing base 13A has entered the uniform velocity region. If the processing base 13A has entered the uniform velocity region ("YES" in step S226), the acceleration control process comes to an end, and the velocity control operation for the processing base 13A switches to the uniform velocity control process of step S28 in FIG. 7. If the control device 80 determines that the processing base 13A has not entered the uniform velocity region ("NO" in step S226), the operation moves on to step S228. In step S228, the control device 80 determines whether the moving velocity of the processing base 13A has reached a predetermined uniform velocity.

If the control device 80 determines that the moving velocity of the processing base 13A has not reached the predetermined uniform velocity ("NO" in step S228), the procedures of steps S212 through S228 are repeated. If the control device 80 determines that the moving velocity of the processing base 13A has reached the predetermined uniform velocity ("YES" in step S228), the acceleration control process comes to an end, and the velocity control operation for the processing base 13A switches to the uniform velocity control process of step S28. In this manner, the acceleration control process for the processing base 13A continues until the processing base 13A enters the uniform velocity region or the moving velocity of the processing base 13A reaches the predetermined uniform velocity.

Referring now to FIG. 10, the acceleration control process for the movable base 12A will be described. When the acceleration control process for the movable base 12A starts, the control device 80 drives the sub linear motor 15 to start an acceleration process for the movable base 12A in step S310. In step S312, the control device 80 determines whether there has been an output from the F-M overrun sensor 19.

The F-M overrun sensor 19 transmits an output signal to the control device 80 when the movable base 12A moves beyond the allowable reciprocation movement range (or overruns the allowable reciprocation movement range) due to adverse influence of an external disturbance or the like. If the control device 80 determines that there has been an output from the F-M overrun sensor 19 in step S312, the procedures of steps S314 through S332 are not carried out, and the acceleration control process comes to an end.

If the control device 80 determines that there has not been an output from the F-M overrun sensor 19 ("NO" in step S312), the operation moves on to step S314. In step S314, the output of the F-M sensor 17 is read. In step S316, based on the output of the F-M sensor 17 read in step S314, the control device 80 performs an arithmetic operation to determine the moving velocity of the movable base 12A with respect to the fixed base 11A.

In step S318, the control device 80 performs acceleration control based on an acceleration correcting value „2 and the velocity setting trapezoid (indicated by the thin solid line B in FIG. 17) that represents the ideal moving velocity of the movable base 12A and has been input in advance in step S10. Here, the acceleration control based on the velocity setting trapezoid B is performed to control the moving velocity of the movable base 12A, so that the moving velocity of the movable base 12A conforms to the acceleration region of the velocity setting trapezoid B shown in FIG. 17.

The thin solid line denoted by B in FIG. 17 represents the ideal moving velocity in one reciprocation movement of the movable base 12A with respect to the fixed base 11A. The region between time t0 and time t1 is an acceleration region in which the movable base 12A accelerates in the X2 direction. The region between time t1 and time t2 is a uniform velocity region in which the movable base 12A moves in the X2 direction at a uniform velocity. The region between time t2 and time t3 is a deceleration region in which the movable base 12A decelerates in the X2 direction.

In FIG. 17, the region between time t3 and time t4 is an acceleration region in which the movable base 12A accelerates in the X1 direction. The region between time t4 and time t5 is a uniform velocity region in which the movable base 12A moves in the X1 direction at a uniform velocity. The region between time t5 and time t6 is a deceleration region in which the movable base 12A decelerates in the X1 direction. The moving velocity of the movable base 12A with respect to the fixed base 11A is controlled to conform to the velocity setting trapezoid B shown in FIG. 17, so that the movable base 12A can smoothly reciprocate.

In this embodiment, the velocity setting trapezoid A of the processing base 13A and the velocity setting trapezoid B of the movable base 12A are designed to synchronize with each other, as shown in FIG. 17. More specifically, each switching point from an acceleration region to a uniform velocity region in the velocity setting trapezoid A of the processing base 13A synchronizes with each corresponding switching point from an acceleration region to a uniform velocity region in the velocity setting trapezoid B of the movable base 12A (at time t1 and time t4). Also, each switching point from a uniform velocity region to a deceleration region in the velocity setting trapezoid A of the processing base 13A synchronizes with each corresponding switching point from a uniform velocity region to a deceleration region in the velocity setting trapezoid B of the movable base 12A (at time t2 and time t5).

In this structure, the processing base 13A and the movable base 12A change the moving states at the same time (for example, a change from an acceleration state to a uniform velocity state). Accordingly, at each transition point in the moving state, the processing base 13A and the movable base 12A interact with each other to prevent positional deviations. Also, accurate movement control operations can be performed on the processing base 13A and the movable base 12A.

The moving velocity of the processing base 13A is controlled to conform to the velocity setting trapezoid A, while the moving velocity of the movable base 12A is controlled to conform to the velocity setting trapezoid B. As a result, the moving velocity of the processing base 13A can be quickly adjusted to the predetermined uniform velocity, and the processing base 13A can be promptly stopped. Accordingly, the uniform velocity region of the processing base 13A can be widened, and a longer processing time can be reserved for each wafer to be placed on the processing base 13A. Thus, the throughput in the wafer processing can be increased.

The velocity setting trapezoids A and B are employed as the representation of the ideal velocities for the processing base 13A and the movable base 12A. As can be seen from FIG. 17, the acceleration regions and the deceleration regions show linear changes in this embodiment. However, the acceleration regions and the deceleration regions may represent other types of changes, such as quadric changes, S-shaped changes, or exponential changes.

Referring back to step S318 in FIG. 10, the acceleration correcting value „2 used in the acceleration control process for the movable base 12A is used for correcting the positional deviation of the movable base 12A from a predetermined reference position. As mentioned earlier, the F-M software origin is determined through the origin return process in step S16 in FIG. 7, and a movement control operation is performed on the movable base 12A based on the F-M software origin as the reference point.

However, the movable base 12A might deviate from the reference position due to an external disturbance, such as errors in the linear motors 14 and 15, or loads on the cable bearings 46A and 46B. If the positional deviation is not corrected, the accuracy in the movement control operation for the movable base 12A decreases.

Therefore, if the movable base 12A deviates from the reference position, the positional deviation needs to be corrected. However, if the positional deviation is corrected in the uniform velocity region of the processing base 13A, the moving velocity is changed, and the processing base 13A cannot move at a uniform velocity, as already earlier. In view of this, the positional deviation of the movable base 12A is also corrected in the acceleration region of the processing base 13A in this embodiment.

More specifically, the positional deviation of the movable base 12A from the predetermined reference position is measured, and the acceleration correcting value „2 is determined based on the measured positional deviation. Using the acceleration correcting value „2, the velocity setting trapezoid B is corrected. In this manner, acceleration control is performed on the movable base 12A, so that the moving velocity of the movable base 12A corresponds to the velocity setting trapezoid B, and that the positional deviation of the movable base 12A can be automatically corrected. For convenience of explanation, the process of determining the acceleration correcting value „2 will be described later.

After the procedure of step S318 is completed, the moving velocity of the movable base 12A with respect to the fixed base 11A determined in step S316 is compared with the velocity setting trapezoid B (which is corrected with the acceleration correcting value „2, if the movable base 12A has deviated from the reference position) in step S320. Through the comparison, it is determined whether there is a difference between the moving velocity of the movable base 12A and the velocity setting trapezoid B.

If there is not a difference detected in step S320, the operation moves on to step S322. In step S322, "0" is set in a deviation correcting value „1 („1=0). If there is a difference detected in step S320, the operation moves on to step S324. In step S324, the deviation correcting value „1 to be used for returning the moving velocity of the movable base 12A to the velocity setting trapezoid B is calculated.

In step S326, the deviation correcting value „1 of the processing base 13A determined in steps S222 and S224 and the deviation correcting value „1 of the movable base 12A determined in steps S322 and 324 are added to obtain a target correcting value „1. This target correcting value „1 is a correcting value to be used for correcting a positional deviation of the movable base 12A and a positional deviation of the processing base 13A at the same time.

In step S328, the control device 80 controls the driving of the sub linear motor 15, using the target correcting value „1 determined in step S326. In this manner, the control device 80 controls the driving of the sub linear motor 15 using the target correcting value „1, so that a positional deviation of the movable base 12A and a positional deviation of the processing base 13A are corrected in the acceleration region of the movable base 12A.

Since the processing base 13A moves on the movable base 12A, the processing base 13A moves with respect to the fixed base 11A when the movable base 12A moves with respect to the fixed base 11A. Accordingly, the drive control based on the target correcting value „1 is performed on the sub linear motor 15 to correct movements of the movable member 12A with respect to the fixed base 11A, and to correct deviations of the movable member 12A and the processing base 13A.

The mover device 10A of this embodiment has a positional deviation correcting means that is formed by the procedures of steps S220 through S224 and steps S320 through S328, as described above. With the positional deviation correcting means, a positional deviation of the processing base 13A from the reference position with respect to the fixed base 11A can be corrected. Thus, a decrease of the moving accuracy of the processing base 13A can be prevented.

Since the sub linear motor 15 is used to correct location deviations of the movable base 12A and the processing base 13A, the device structure of this embodiment is simpler than a structure in which a positional deviation correcting means is employed as well as the sub linear motor 15.

Furthermore, the main linear motor 14 moves the processing base 13A, and the sub linear motor 15 controls the moving velocity of the processing base 13A. Accordingly, the moving operation and the moving velocity control operation can be performed separately from each other in this embodiment. Thus, a greater degree of freedom can be allowed in control operations to be performed on the processing base 13A.

After the position correcting processes on positional deviations of the movable base 12A and the processing base 13A with respect to the fixed base 11A are completed in step S328, the operation moves on to step S330. In step S330, the control device 80 determines whether the movable base 12A has entered the uniform velocity region. If the control device 80 determines that the movable base 12A has entered the uniform velocity region ("YES" in step S330), the acceleration control process comes to an end, and the velocity control operation for the movable base 12A switches to the uniform velocity control process of step S28 shown in FIG. 7. If the control device 80 determines that the movable base 12A has not entered the uniform velocity region ("NO" in step S330), the operation moves on to step S332. In step S332, the control device 80 determines whether the moving velocity of the movable base 12A has reached a predetermined uniform velocity.

If the control device 80 determines that the moving velocity of the movable base 12A has not reached the predetermined uniform velocity ("NO" in step S332), the procedures of steps S312 through S332 are repeated. If the control device 80 determines that the moving velocity of the movable base 12A has reached the predetermined uniform velocity ("YES" in step S332), the acceleration control process comes to an end, and the velocity control operation for the movable base 12A switches to the uniform velocity control process of step S28. In this manner, the acceleration control process for the movable base 12A continues until the movable base 12A enters the uniform velocity region or the moving velocity of the movable base 12A reaches the predetermined uniform velocity.

Figure 11:
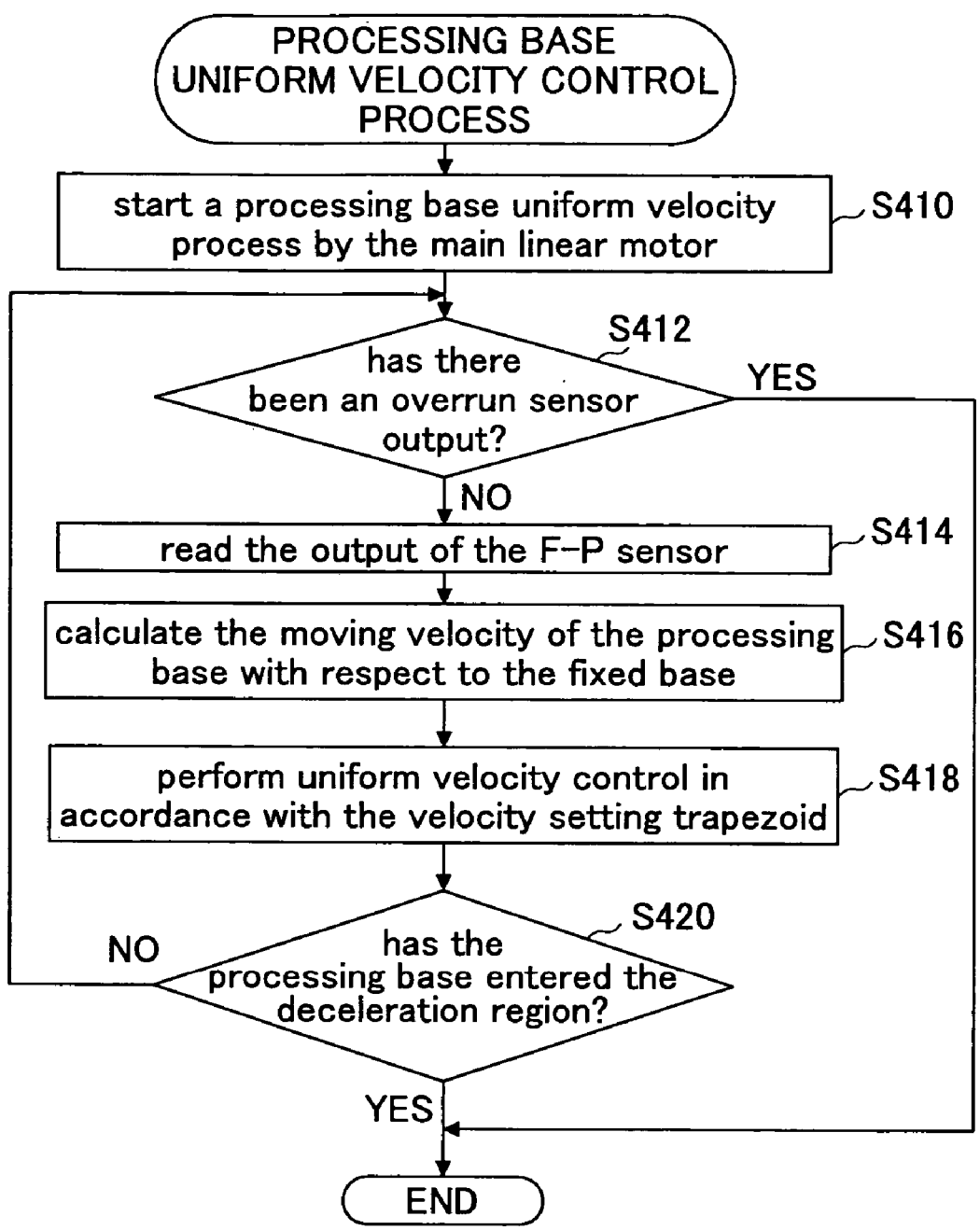
FIG. 11 is a flowchart of a uniform velocity control process to be carried out for the processing base.
Figure 12:
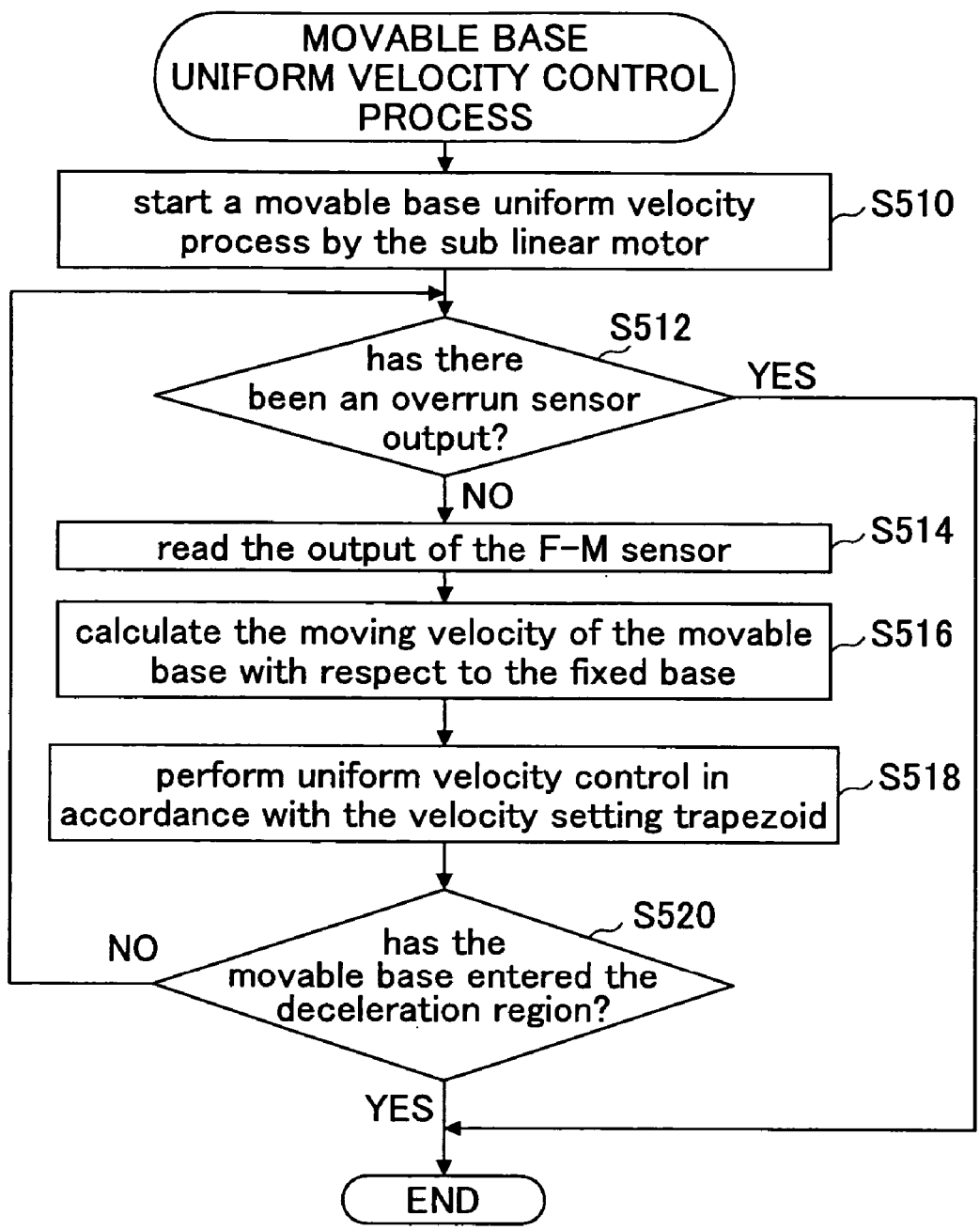
FIG. 12 is a flowchart of a uniform velocity control process to be carried out for the movable base.

The uniform velocity control process of step 28 shown in FIG. 7 will now be described. FIG. 11 is a flowchart of the uniform velocity control process to be carried out for the processing base 13A. FIG. 12 is a flowchart of the uniform velocity control process to be carried out for the movable base 12A.

When the uniform velocity control process for the processing base 13A starts, the control device 80 controls the driving of the main linear motor 14 to move the processing base 13A at a uniform velocity in step S410. In step S412, the control device 80 determines whether there has been an output from the F-P overrun sensor 20. If the control device 80 determines that there has been an output from the F-P overrun sensor 20 in step S412, the procedures of steps S414 through S420 are not carried out, and the uniform velocity control process comes to an end.

If the control device 80 determines that there has not been an output from the F-P overrun sensor 20 ("NO" in step S412), the operation moves on to step S414. In step S414, the output of the F-P sensor 16 is read. In step S416, based on the output of the F-P sensor 16 read in step S414, the control device 80 calculates the moving velocity of the processing base 13A with respect to the fixed base 11A.

In step S418, the control device 80 performs uniform velocity control based on the velocity setting trapezoid A (see FIG. 17) that has been input and stored in advance in step S10 and represents the ideal moving velocity of the processing base 13A. Here, the uniform velocity control based on the velocity setting trapezoid A is performed to control the moving velocity of the processing base 13A to conform to the uniform velocity region of the velocity setting trapezoid A shown in FIG. 17. The moving velocity of the processing base 13A with respect to the fixed base 11A is controlled to conform to the velocity setting trapezoid A shown in FIG. 17, so that the processing base 13A smoothly moves at a uniform velocity.

Specific control methods to be employed by the control device 80 to smoothly move the processing base 13A at a uniform velocity involve smooth feed correction control, feed control using an extended Karman filter (both being introduced in "Mechanical Design", Vol. 43, No. 16, December 1999, pp. 24–25), robust control (introduced in "Mechanical Design", Vol. 34, No. 17, December 1990, pp. 145–157), or a disturbance observer (introduced in "Mechanical Design", Vol. 43, No. 1, January 1999, pp. 26–27). By any of those methods, the processing base 13A can be smoothly moved at a uniform velocity, and the processor can perform the same processing on each wafer to be placed on the platen 72.

In step S420, the control device 80 determines whether the processing base 13A has entered the deceleration region. If the control device 80 determines that the processing base 13A has not entered the deceleration region ("NO" in step S420), the operation returns to step S412, and the procedures of steps S412 through S420 are repeated.

If the control device 80 determines that the processing base 13A has entered the deceleration region ("YES" in step S420), the uniform velocity control process comes to an end, and the velocity control operation for the processing base 13A switches to the deceleration control process of step S30 shown in FIG. 7. In this manner, the uniform velocity control process for the processing base 13A continues until the processing base 13A enters the deceleration region.

Referring now to FIG. 12, the uniform velocity control process for the movable base 12A will be described. When the uniform velocity control process for the movable base 12A starts, the control device 80 controls the driving of the sub linear motor 15 to move the movable base 12A at a uniform velocity in step S510.

In step S512, the control device 80 determines whether there has been an output from the F-M overrun sensor 19. If the control device 80 determines that there has been an output from the F-M overrun sensor 19 in step S512, the procedures of steps S514 through S520 are not carried out, and the uniform velocity control process comes to an end.

If the control device 80 determines that there has not been an output from the F-M overrun sensor 19 ("NO" in step S512), the output of the F-M sensor 17 is read. In step S516, based on the output of the F-M sensor 17 read in step S514, the control device 80 calculates the moving velocity of the movable base 12A with respect to the fixed base 11A.

In step S518, the control device 80 performs uniform velocity control based on the velocity setting trapezoid B (indicated by the thin solid line in FIG. 17) that has been input and stored in advance in step S10 and represents the ideal moving velocity of the movable base 12A. Here, the uniform velocity control based on the velocity setting trapezoid B is performed to control the moving velocity of the movable base 12A to conform to the uniform velocity region of the velocity setting trapezoid B shown in FIG. 17. The moving velocity of the movable base 12A with respect to the fixed base 11A is controlled to conform to the velocity setting trapezoid B shown in FIG. 17, so that the movable base 12A can smoothly move at a uniform velocity.

The specific control methods that are employed here by the control device 80 to smoothly move the movable base 12A at a uniform velocity are the same as the above described control methods that are employed in the uniform velocity control process for the processing base 13A (smooth feed correction control, feed control using an extended Karman filter, robust control, and a disturbance observer). In this manner, the movable base 12A can be smoothly moved at a uniform velocity, and accordingly, the processing base 13A can be stably moved at a uniform velocity. Thus, the processor can perform the same processing on each wafer to be placed on the platen 72.

In step S520, the control device 80 determines whether the movable base 12A has entered the deceleration region. If the control device 80 determines that the movable base 12A has not entered the deceleration region ("NO" in step S520), the operation returns to step S512, and the procedures of steps S512 through S520 are repeated.

If the control device 80 determines that the movable base 12A has entered the deceleration region ("YES" in step S520), the uniform velocity control process comes to an end, and the velocity control operation for the movable base 12A switches to the deceleration control process of step S30 shown in FIG. 7. In this manner, the uniform velocity control process for the movable base 12A continues until the movable base 12A enters the deceleration region.

Figure 13:
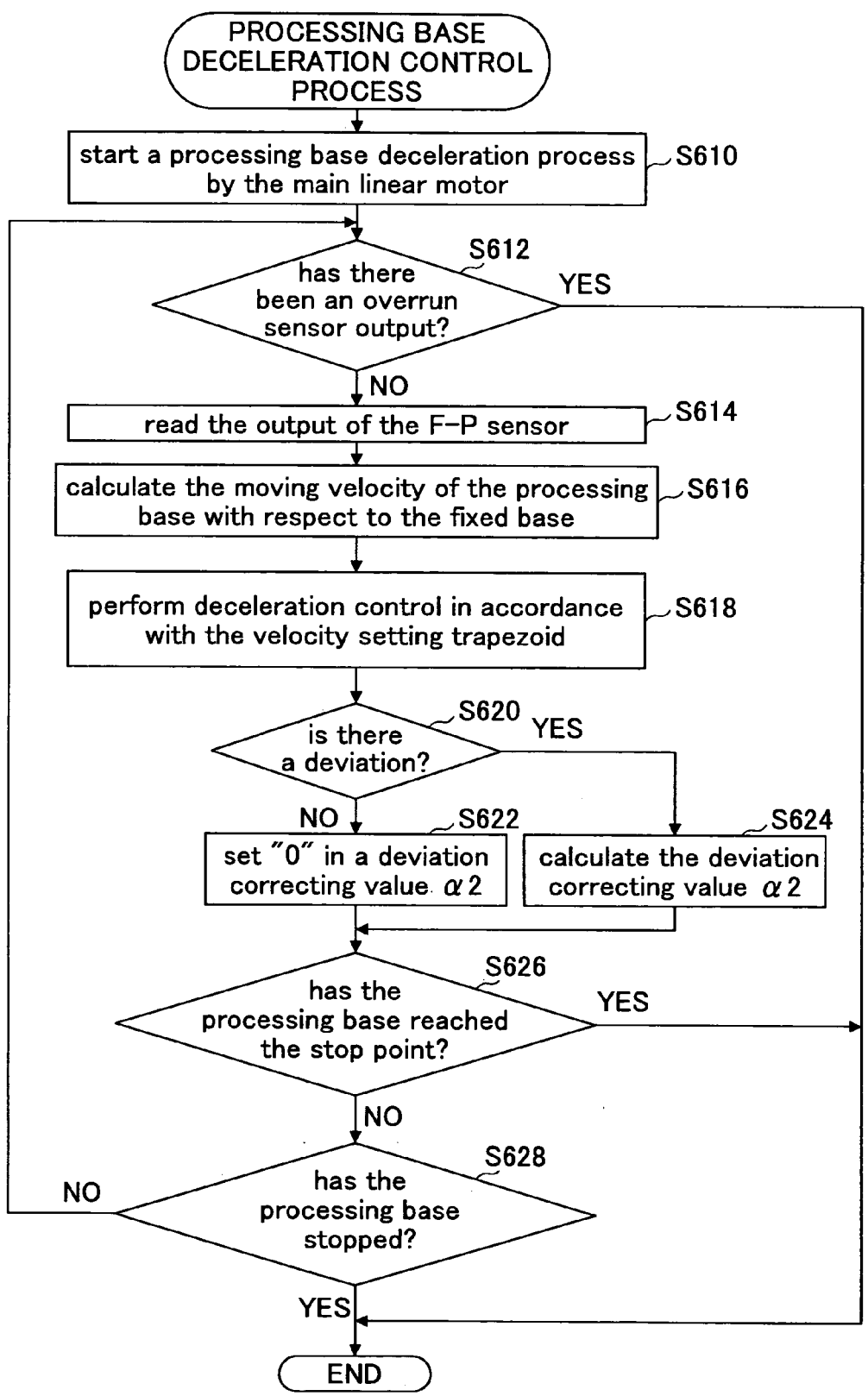
FIG. 13 is a flowchart of a deceleration control process to be carried out for the processing base.
Figure 14:
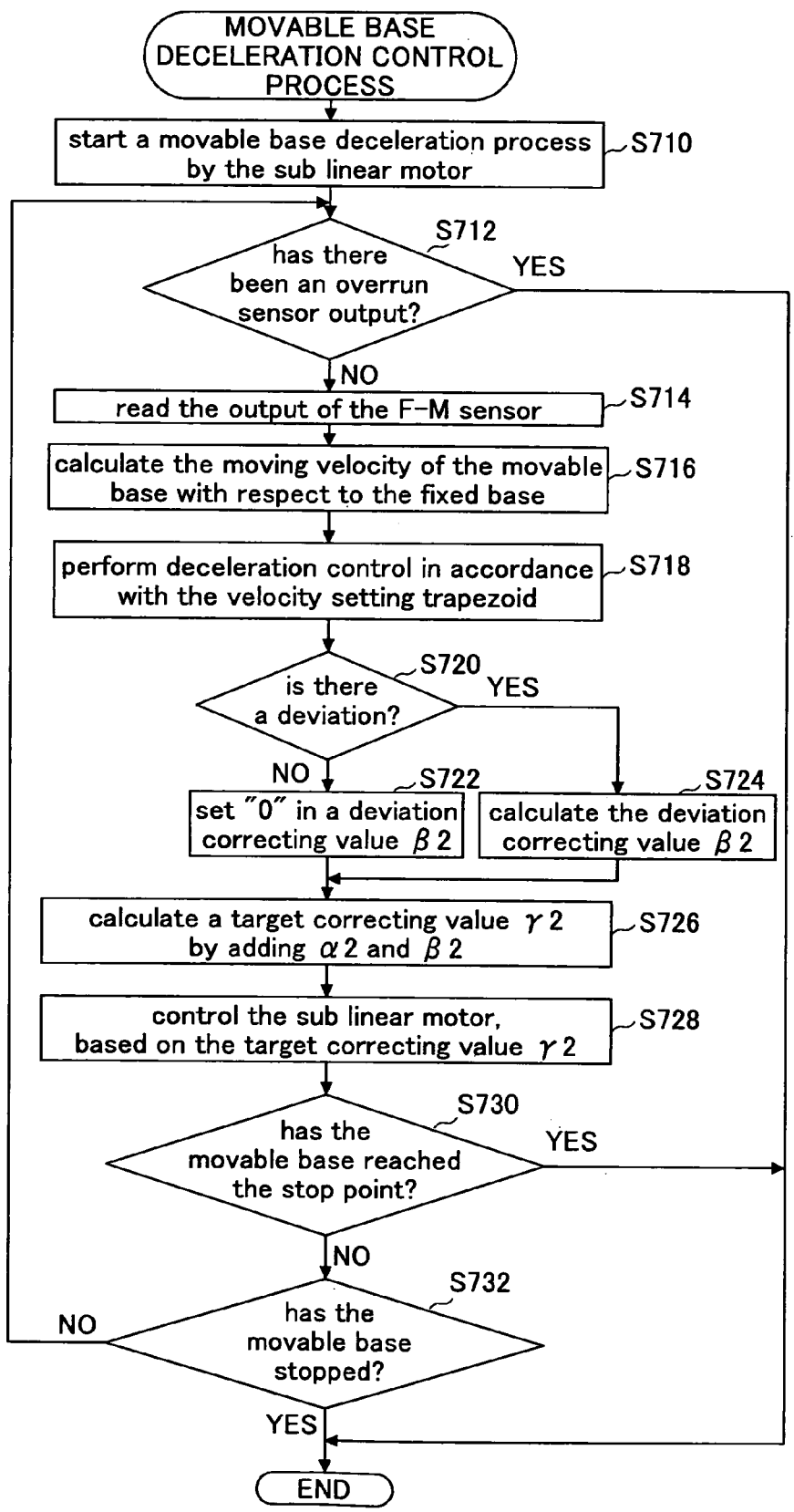
FIG. 14 is a flowchart of a deceleration control process to be carried out for the movable base.

The deceleration control process to be carried out in step S30 in FIG. 7 will now be described. FIG. 13 is a flowchart of a deceleration control process to be carried out for the processing base 13A. FIG. 14 is a flowchart of a deceleration control process to be carried out for the movable base 12A.

When the deceleration control process for the processing base 13A starts, the control device 80 controls the main linear motor 14 to start a deceleration process for the processing base 13A in step S610. In step S612, the control device 80 determines whether there has been an output from the F-P overrun sensor 20. If the control device 80 determines that there has been an output from the F-P overrun sensor 20 in step S612, the procedures of steps S614 through S628 are not carried out, and the deceleration control process comes to an end.

If the control device 80 determines that there has been an output from the F-P overrun sensor 20 ("NO" in step S612), the operation moves on to step S614. In step S614, the output of the F-P sensor 16 is read. In step S616, based on the output of the F-P sensor 16 read in step S614, the control device 80 calculates the moving velocity of the processing base 13A with respect to the fixed base 11A.

In step S618, the control device 80 performs deceleration control based on the velocity setting trapezoid A shown in FIG. 17 that has been input and stored in advance in step S10 and represents the ideal moving velocity of the processing base 13A. Here, the deceleration control based on the velocity setting trapezoid A is performed to control the moving velocity of the processing base 13A to conform to the deceleration region of the velocity setting trapezoid A shown in FIG. 17. In this manner, the moving velocity of the processing base 13A with respect to the fixed base 11A is controlled to conform to the velocity setting trapezoid A shown in FIG. 17, so that the processing base 13A can promptly and smoothly start decelerating.

After the procedure of step S618 is completed, the operation moves on to step S620. In step S620, the moving velocity of the processing base 13A with respect to the fixed base 11A calculated in step S616 is compared with the velocity setting trapezoid A, so as to determine whether there is a difference between the moving velocity of the processing base 13A and the velocity setting trapezoid A.

If there is not a difference detected in step S620, the operation moves on to step S622. In step S622, "0" is set in a deviation correcting value „2 („2=0). If there is a difference detected in step S620, the operation moves on to step S624. In step S624, the deviation correcting value „2 to be used for returning the moving velocity of the processing base 13A to the velocity setting trapezoid A is calculated. The deviation correcting value „2 calculated in step S624 will be reflected in step S726 in the later described deceleration control process for the movable base 12A (see FIG. 14).

In step S626, the control device 80 determines whether the processing base 13A has reached a predetermined stop point. If the control device 80 determines that the processing base 13A bas reached the predetermined stop point ("YES" in step S622), the deceleration control process comes to an end. If the control device 80 determines that the processing base 13A has not reached the predetermined stop point ("NO" in step S626), a forced stop process is carried out to stop the processing base 13A immediately. The operation then moves on to step S628, and the control device 80 determines whether the processing base 13A has stopped (whether the moving velocity has becomes zero).

If the control device 80 determines that the processing base 13A has not stopped ("NO" in step S628), the operation returns to step S612, and the procedures of steps S612 through S628 are repeated. If the control device 80 determines that the processing base 13A has stopped ("YES" in step S628), the deceleration control process comes to an end. In this manner, the deceleration control process for the processing base 13A continues until the processing base 13A reaches the predetermined stop point or comes to a stop.

Referring now to FIG. 14, the deceleration control process to be carried out for the movable base 12A will be described. When the deceleration control process for the movable base 12A starts, the control device 80 controls the driving of the sub linear motor 15 in step S710, so that the movable base 12A starts decelerating. In step S712, the control device 80 determines whether there has been an output from the F-M overrun sensor 19. If the control device 80 determines that there has been an output from the F-M overrun sensor 19, the procedures of steps S714 through S732 are not carried out, and the deceleration control process comes to an end.

If the control device 80 determines that there has not been an output from the F-M overrun sensor 19 ("NO" in step S712), the operation moves on to step S714. In step S714, the output of the F-M sensor 17 is read. In step S716, based on the output of the F-M sensor 17 read in step S714, the control device 80 calculates the moving velocity of the movable base 12A with respect to the fixed base 11A.

In step S718, the control device 80 performs deceleration control based on the velocity setting trapezoid B shown in FIG. 17 that has been input and stored in advance in step S10, and represents the ideal moving velocity of the movable base 12A. Here, the deceleration control based on the velocity setting trapezoid B is performed to control the moving velocity of the movable base 12A to conform to the deceleration region of the velocity setting trapezoid B shown in FIG. 17. In this manner, the moving velocity of the movable base 12A with respect to the fixed base 11A is controlled to conform to the velocity setting trapezoid B, so that the movable base 12A can promptly and smoothly start decelerating.

After the procedure of step S718 is completed, the operation moves on to step S720. In step S720, the moving velocity of the movable base 12A with respect to the fixed base 11A calculated in step S716 is compared with the velocity setting trapezoid B, so as to determine whether there is a difference between the moving velocity of the movable base 12A and the speed setting trapezoid B.

If there is not a difference detected in step S720, the operation moves on to step S722. In step S722, "0" is set in a deviation correcting value „2 („2=0). If there is a difference detected in step S720, the operation moves on to step S724. In step S724, the deviation correcting value „2 to be used for returning the moving velocity of the movable base 12A to the velocity setting trapezoid B is calculated.

In step S726, the deviation correcting value $„2$ of the processing base 13A obtained in steps S622 and S624 in FIG. 13 is added to the deviation correcting value $„2$ of the movable base 12A obtained in steps S722 and S724, so as to obtain a target correcting value $„2$. The target correcting value $„2$ is a correcting value to be used for correcting a positional deviation of the movable base 12A and a positional deviation of the processing base 13A at the same time.

In step S728, based on the target correcting value $„2$ obtained in step S726, the control device 80 controls the driving of the sub linear motor 15. Accordingly, based on the target correcting value $„2$, the control device 80 controls the driving of the sub linear motor 15 in the deceleration region of the movable base 12A, so as to correct a positional deviation of the movable base 12A and a positional deviation of the processing base 13A. In this manner, the driving of the sub linear motor 15 is controlled based on the target correcting value $„2$, so that movements of the movable base 12A with respect to the fixed base 11A are corrected. Thus, deviations of the movable base 12A and the processing base 13A can be corrected at the same time.

Since the mover device 10A of this embodiment has a positional deviation correcting means formed by the procedures of steps S620 through S624 and steps S720 through S728, any positional deviation of the processing base 13A with respect to the fixed base 11A can be readily corrected, and a decrease of the moving accuracy of the processing base 13A can be prevented. Furthermore, the main linear motor 14 moves the processing base 13A in the deceleration region, and the sub linear motor 15 controls the moving velocity of the processing base 13A. Accordingly, the moving operation and the movement control operation can be performed separately. Thus, a greater degree of freedom can be allowed in control operations to be performed on the processing base 13A.

After positional deviations of the movable base 12A and the processing base 13A with respect to the fixed base 11A are corrected in step S728, the operation moves on to step S730. In step S730, the control device 80 determines whether the movable base 12A has reached a predetermined stop point. If the control device 80 determines that the movable base 12A has reached the predetermined stop point ("YES" in step S730), the deceleration control process comes to an end. If the control device 80 determines that the movable base 12A has not reached the predetermined stop point ("NO" in step S730), a forced stopping process is carried out, and the operation moves on to step S732. In step S732, the control device 80 determines whether the movable base 12A has stopped.

If the control device 80 determines that the movable base 12A has not stopped ("NO" in step S732), the operation returns to step S712, and the procedures of steps S712 through S732 are repeated. If the control device 80 determines that the movable base 12A has stopped ("YES" in step S732), the deceleration control process comes to an end. In this manner, the deceleration control process for the movable base 12A continues until the movable base 12A comes to a stop.

Referring back to FIG. 7, the movement control operation to be performed on the processing base 13A will be further described. After the acceleration control process of step S26 (the procedures shown in FIGS. 9 and 10), the uniform velocity control process of step S28 (the procedures shown in FIGS. 11 and 12), and the deceleration control process of step S30 (the procedures shown in FIGS. 13 and 14) are completed, the operation moves on to step S32. In step S32, a deviation correcting process is carried out for the movable base 12A.

Figure 15:
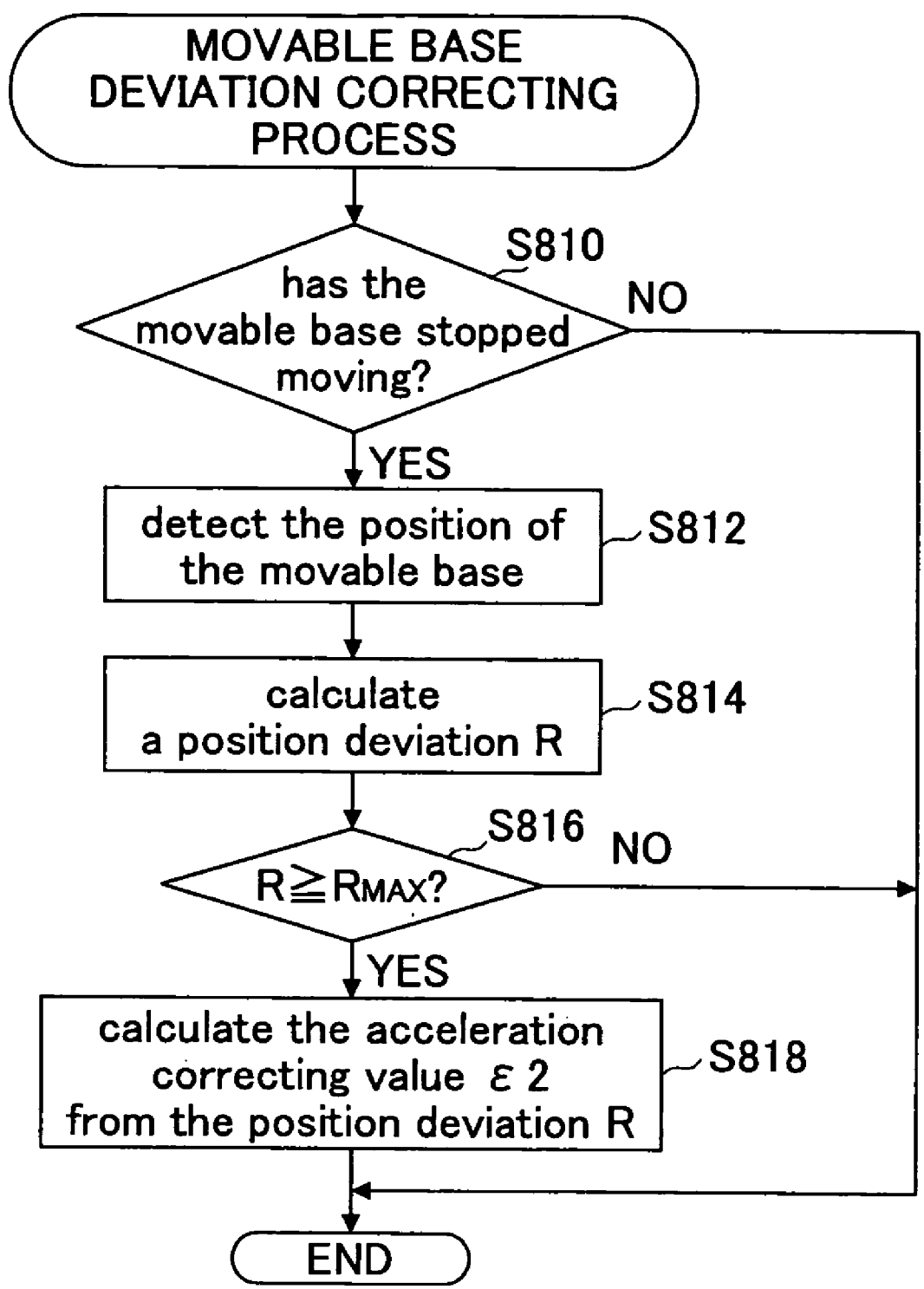
FIG. 15 is a flowchart of a deviation correcting process to be carried out for the movable base.

FIG. 15 is a flowchart of the deviation correcting process for the movable base 12A to be carried out in step S32 in FIG. 7. When the deviation correcting process is started, the control device 80 determines whether the movable base 12A has stopped moving in step S810, based on the determination result of step 732 shown in FIG. 14. If the control device 80 determines that the movable base 12A has not stopped moving ("NO" in step S810), the deviation correcting process comes to an end, because a positional deviation of the movable base 12A that is still moving cannot be measured with accuracy.

If the control device 80 determines that the movable base 12A has stopped moving ("YES" in step S810), the operation moves on to step S812. In step S812, the position of the movable base 12A is detected. More specifically, the position of the movable base 12A with respect to the fixed base 11A is calculated from the output of the F-M sensor 17.

In step S814, the positional deviation R of the movable base 12A from the normal position with respect to the fixed base 11A is calculated. More specifically, so as to calculate the positional deviation R, the actual stopping position of the movable base 12A detected in step S812 is compared with a predetermined stopping position. If the actual stopping position is the same as the predetermined stopping position, there is not a positional deviation. If the actual stopping position is different from the predetermined stopping position, the difference is regarded as the positional deviation R.

In step S816, the control device 80 determines whether the positional deviation R calculated in step S814 is equal to or greater than a predetermined allowable positional deviation RMAX. If the control device 80 determines that the positional deviation R is not equal to or greater than the predetermined allowable positional deviation RMAX ("NO" in step S816), the procedure of step S818 is not carried out, and the positional deviation correcting process for the movable base 12A comes to an end, because the positional deviation R in this case is too small to be corrected.

If the control device 80 determines that the positional deviation R is equal to or greater than the predetermined allowable positional deviation RMAX ("YES" in step S816), the operation moves on to step S818, because the positional deviation R in this case is so large as to hinder accurate movements of the movable base 12A.

In step S818, the acceleration correcting value $„2$ is calculated based on the positional deviation R calculated in step S814. The calculation of the acceleration correcting value $„2$ is performed in the following manner. First, the stopping position of the movable base 12A is determined whether to be before or after the predetermined stopping position, so as to decide the sign of the acceleration correcting value $„2$. The absolute value of the acceleration correcting value $„2$ is then decided from the distance between the actual stopping position and the predetermined stopping position.

The acceleration correcting value $„2$ calculated in step S818 is temporarily stored in the control device 80, and is reflected in the acceleration control performed on the movable base 12A in step S318 in the acceleration control process for the movable base 12A shown in FIG. 10.

Figure 16:
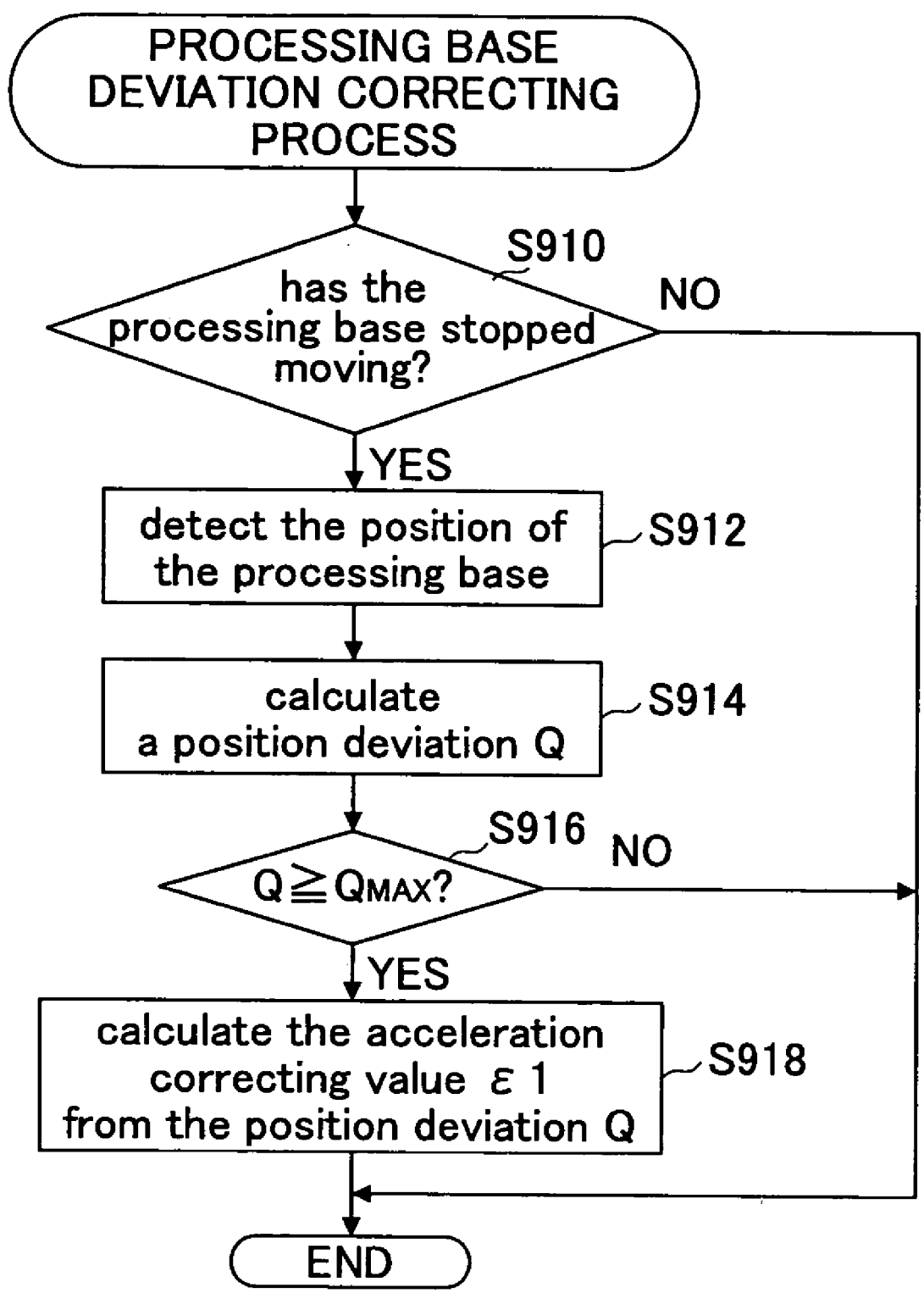
FIG. 16 is a flowchart of a deviation correcting process to be carried out for the processing base.
Figure 18D:
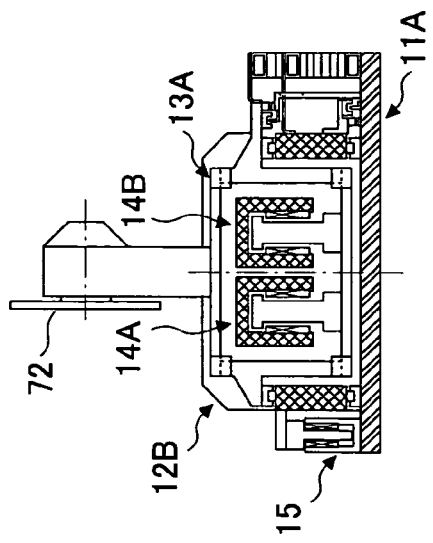
Figure 18E:
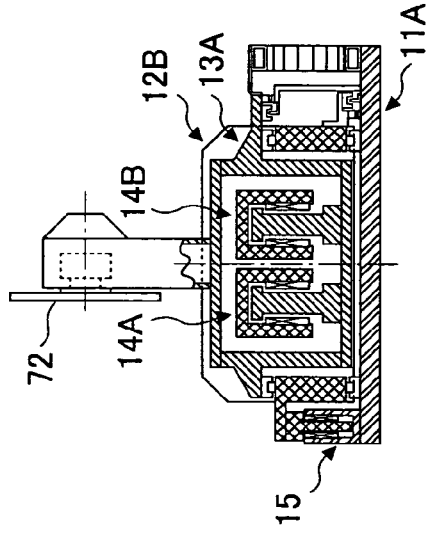
Figure 18F:
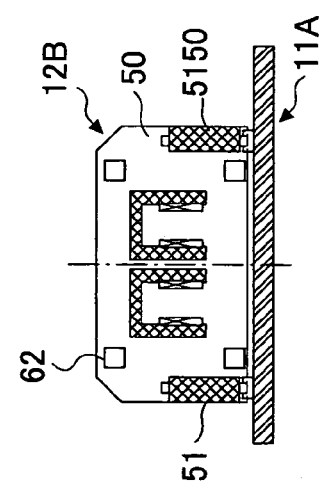
Figure 19A:
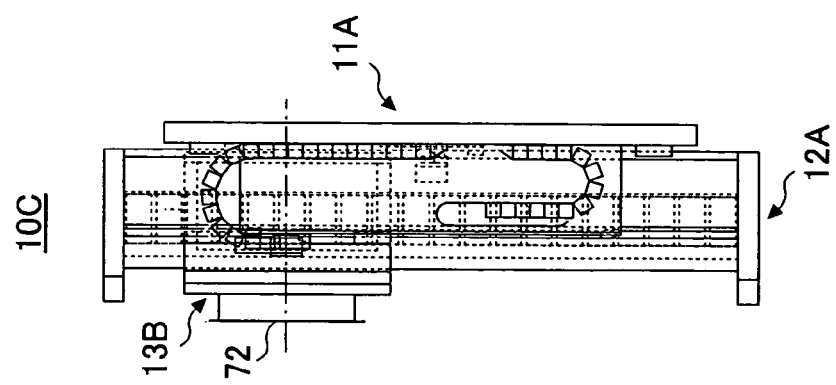
FIGS. 19A through 19F illustrate the hardware structure of a mover device in accordance with a third of the present invention.
Figure 19B:
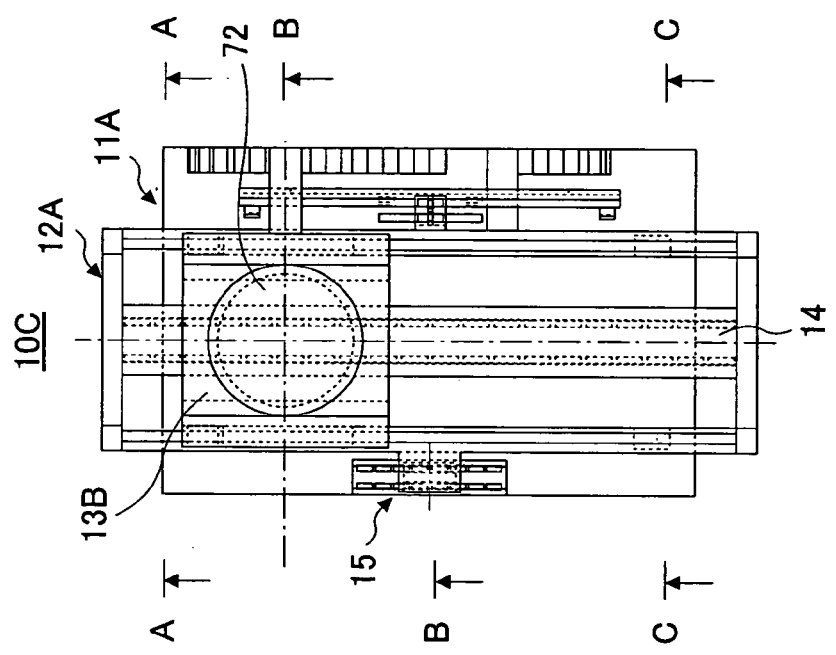
Figure 19C:
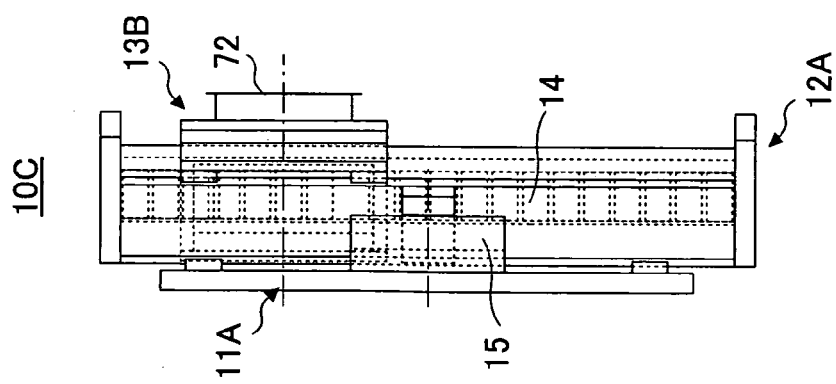
Figure 19D:
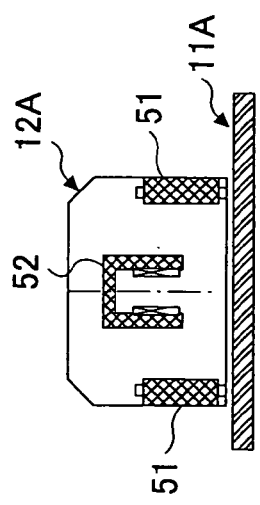
Figure 19E:
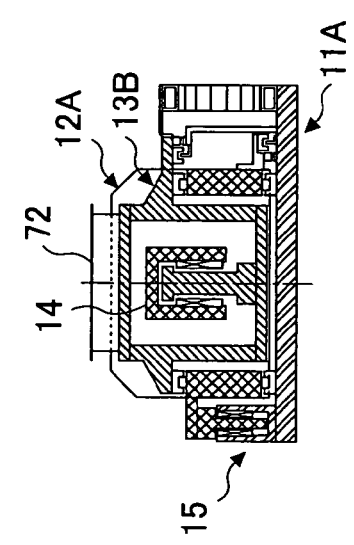
Figure 19F:
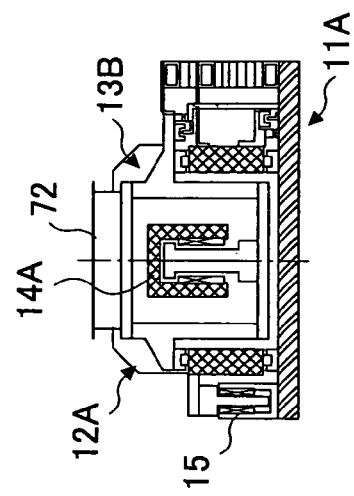

After the deviation correcting process for the movable base 12A in step S32 is completed, the operation moves on to step S34. In step S34, a deviation correcting process is carried out for the processing base 13A. FIG. 16 is a flowchart of the deviation correcting process to be carried out for the processing base 13A in step S34 in FIG. 7.

When the deviation correcting process is started, the control device 80 determines whether the processing base 13A has stopped moving in step S910, based on the determination result of step S628 shown in FIG. 13. If the control device 80 determines that the processing base 13A has not stopped moving ("NO" in step S910), the deviation correcting process comes to an end, because a positional deviation of the processing base 13A that is still moving cannot be measured with accuracy.

If the control device 80 determines that the processing base 13A has stopped moving ("YES" in step S910), the operation moves on to step S912. In step S912, the position of the processing base 13A is detected. More specifically, based on the output of the P-M sensor 18, the control device 80 calculates the position of the processing base 13A with respect to the movable base 12A.

In step S914, a positional deviation Q of the processing base 13A from the normal position with respect to the movable base 12A is calculated. More specifically, the positional deviation Q is calculated by comparing the actual stopping position of the processing base 13A detected in step S912 with a predetermined stopping position. If the actual stopping position is the same as the predetermined stopping position, there is not a positional deviation. If the actual stopping position is different from the predetermined stopping position, the difference is regarded as the positional deviation Q.

In step S916, the control device 80 determines whether the positional deviation Q calculated in step S914 is equal to or greater than a predetermined allowable positional deviation QMAX. If the control device 80 determines that the positional deviation Q is not equal to or greater than the predetermined allowable positional deviation QMAX ("NO" in step S916), the procedure of step S918 is not carried out, and the positional deviation correcting process for the processing base 13A comes to an end, because the positional deviation Q in this case is too small to be corrected.

If the control device 80 determines that the positional deviation Q is equal to or greater than the predetermined allowable positional deviation QMAX ("YES" in step S916), the operation moves on to step S918, because the positional deviation Q in this case is so large as to hinder accurate movements of the processing base 13A.

In step S918, the acceleration correcting value $„1$ is calculated based on the positional deviation Q calculated in step S914. The calculation of the acceleration correcting value $„1$ is performed in the following manner. First, the stopping position of the processing base 13A is determined whether to be before or after the predetermined stopping position, so as to decide the sign of the acceleration correcting value $„1$. The absolute value of the acceleration correcting value $„1$ is then decided from the distance between the actual stopping position and the predetermined stopping position.

The acceleration correcting value $„1$ calculated in step S918 is temporarily stored in the control device 80, and is reflected in the acceleration control performed on the processing base 13A in step S218 in the acceleration control process for the processing base 13A shown in FIG. 9.

As described above, in the mover device 10A of this embodiment, the positional deviations R and Q of the movable base 12A and the processing base 13A are detected, and the acceleration correcting values $„2$ and $„1$ are determined from the positional deviations R and Q. The acceleration correcting values $„2$ and $„1$ are reflected in the acceleration control to be performed in accordance with the velocity setting trapezoids A and B, so that positional deviations of the movable base 12A and the processing base 13A can be automatically corrected at the time of the acceleration control. Thus, positional deviations of the movable base 12A and the processing base 13A can be readily corrected with accuracy.

In the acceleration region, the processor does not perform processing on wafers. Therefore, positional deviations of the movable base 12A and the processing base 13A are corrected at the time of the acceleration control. By doing so, the precision in wafer processing is not adversely affected by a change of the moving velocity from the ideal moving velocity in the acceleration region.

In this embodiment, positional deviations of the movable base 12A and the processing base 13A are detected by the F-M sensor 17 and the P-M sensor 18 that are also used for movement control operations. Accordingly, the mover device 10A has a simpler structure and requires fewer components than a structure in which a positional deviation detector is employed as well as the sensors 17 and 18.

The method of detecting positional deviations of the movable base 12A and the processing base 13A is not limited to the above described method. It is possible to employ a method of detecting positional deviations of the movable base 12A and the processing base 13A based on the phases of the coils and the magnets of the linear motors 14 and 15. By such a method, the mover device 10A can have a simpler structure and requires fewer components than a structure in which a positional deviation detector is employed separately from other components.

Referring now to FIGS. 18A through 20C, mover devices 10B through 10D in accordance with second through fourth embodiments of the present invention will be described. In FIGS. 18A through 20C, the same components as those shown in FIGS. 1A through 5H are denoted by the same reference numerals as those in FIGS. 1A through 5H, and explanation of them will be omitted.

FIGS. 18A through 18F illustrate the mover device 10B in accordance with the second embodiment.

The mover device 10A of the first embodiment has only one moving force generator, which is the main linear motor 14. The mover device 10B of this embodiment, on the other hand, has two main linear motors 14A and 14B. With the two main linear motors 14A and 14B that function as moving force generators, the acceleration and the deceleration of the processing base 13A can be increased. Also, even if the weight of the processing base 13A increases as the parts of the processing base 13A become larger to accommodate larger wafers, the processing base 13A of this embodiment can stably reciprocate with precision.

FIGS. 19A through 19F illustrate the mover device 10C in accordance with the third embodiment.

In the mover device 10A of the first embodiment, the wafer attaching face of the platen 72 is perpendicular to the fixed base 11A. In the mover device 10C of this embodiment, on the other hand, the wafer attaching face of the platen 72 provided on the processing base 13A is in parallel with the fixed base 11A. With this structure, each wafer can be processed in a laid state.

FIGS. 20A through 20C illustrate the mover device 10D in accordance with the fourth embodiment. The mover device 10A in accordance with the first embodiment has the sub linear motor 15. On the other hand, the mover device 10D of this embodiment does not include the sub linear motor 15.

Since a driving means for moving the movable base 12A with respect to a fixed base 11B does not exist in this embodiment, the movable base 12A is moved by the repulsion force generated from the processing base 13A moving with respect to the movable base 12A. Also, in the first embodiment, the sub linear motor 15 is used for correcting a positional deviation of the movable base 12A in the first embodiment. In the mover device 10D of this embodiment, however, the sub linear motor 15 does not exist, and deviation correcting operations cannot be performed. Therefore, the mover device 10D of this embodiment is equipped with positional deviation correcting mechanisms 81 instead.

The positional deviation correcting mechanisms 81 are provided on sideboards 84 that stand at the X1-side end and the X2-side end of the fixed base 11B. Each of the positional deviation correcting mechanisms 81 includes a spring 82 and an adjuster 83 that shifts the spring 82 to the X1 side or the X2 side.

Each spring 82 faces the outer face of the corresponding sideboard 84 attached to the movable base 12A. Each adjuster 83 has a rotation lever that is rotated by an operator to shift the corresponding spring 82 to the X1 side or the X2 side. The movable base 12A reciprocates between the pair of springs 82.

In this structure, the movable base 12A might deviate from the predetermined position due to the load of the cable bearings 46A and 46B, for example. More specifically, if the movable base 12A deviates to the X1 side from the predetermined stopping position shown in FIG. 20A, the movable base 12A moves in the X1 direction and comes in contact with the spring 82 on the X1 side.

When the movable base 12A comes in contact with the spring 82, the positional deviation correcting mechanism 81 on the X1 side pushes the movable base 12A to the X2 side (pushes the movable base 12A back) by virtue of the elasticity of the spring 82. In this manner, a positional deviation of the movable base 12A is corrected. In this embodiment that does not include the sub linear motor 15, the positional deviation correcting mechanisms 81 directly correct positional deviations of movable base 12A.

Each of the positional deviation correcting mechanisms 81 can also adjust the position of the spring 82 with the adjuster 83, so as to control a positional deviation correcting range. Accordingly, the positional deviation correcting mechanisms 81 can readily cope with a case where the moving force generated from the main linear motor 14 increases or decreases, or a case where the condition setting of the mover device 10D is changed.

FIGS. 21A through 21C illustrate a mover device 10E in accordance with a fifth embodiment of the present invention. In each of the foregoing embodiments, the main linear motor 14 is used as a moving force generator to move the processing base 13A with respect to the movable base 12A. In the mover device 10E of this embodiment, however, a fluid actuator 90 is employed instead of the main linear motor 14. Although the fluid actuator 90 of this embodiment is an air pressure actuator, it is possible to employ an actuator using a fluid other than air.

The fluid actuator 90 includes a guide shaft that has both ends fixed to a movable base 12C and is formed integrally with the center part connecting body 52, and a slider that is formed integrally with a processing base 13C that moves along the center part connecting body 52. The slider is a cylindrical body that surrounds the guide shaft. A space to be used as a pressure chamber is formed between the outer surface of the guide shaft and the slider.

Also, a static pressure air bearing is provided at either end of the slider (the processing base 13C). Further, either end of the slider is connected to a cylinder air supply system, so that compressed air can leave and enter two cylinder chambers formed in the slider. The pair of cylinder air supply systems each has a servo valve that is connected to a compressed air supply source.

When compressed air is supplied to the static pressure air bearings in this structure, the processing base 13C (the slider) slightly lifts off the center part connecting body 52 (the guide shaft). Here, one of the servo valves is opened to the air while the other one is connected to the compressed air supply source. As a result, the processing base 13C (the slider) moves in one direction on the movable base 12C. If the connection to the compressed air supply source is switched between the servo valves, the processing base 13C moves in the opposite direction. The opening of the pair of servo valves is controlled in such a manner that the processing base 13C can reciprocate with respect to the movable base 12C.

With the fluid actuator 90 as a moving force generator, a driving force generated from the compressed air supply source for the processing base 13C can be greater than a driving force generated from the main linear motor 14. Thus, the mover device 10E of this embodiment can move the processing base 13C at a high speed.

In some of the foregoing embodiments, the springs 82 are employed to directly correct positional deviations of the movable base 12A (12C). However, it is also possible to employ magnets to correct positional deviations. In such a case, positional deviations of the movable base 12A (12C) can also be corrected with a simple mechanism.

Also, in some of the foregoing embodiments, linear motors are employed as moving force generators. However, it is possible to employ a fluid actuator (or an air actuator) as a moving force generator, instead of a linear motor.

Figure 22A:
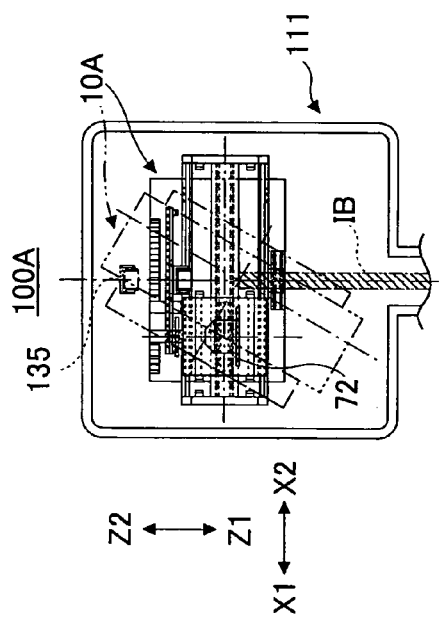
FIG. 22A is a plan view illustrating the hardware structure of an ion implanter apparatus in accordance with a sixth embodiment of the present invention.
Figure 22B:
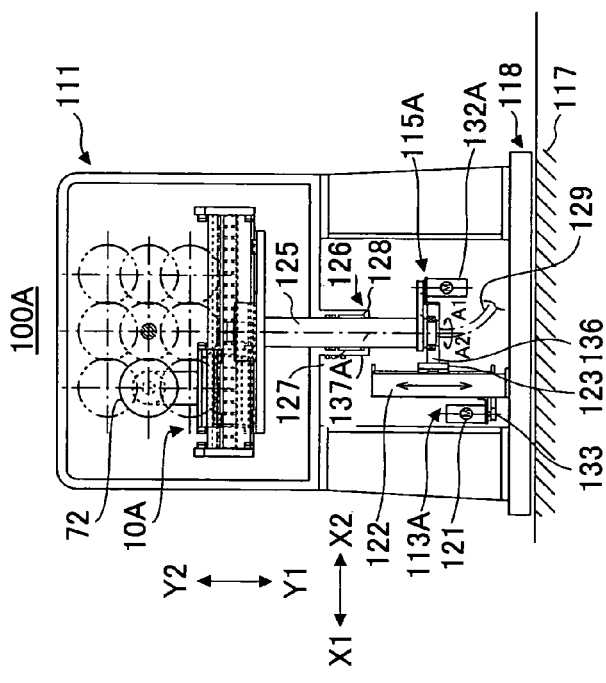
FIG. 22B is a front view illustrating the ion implanter apparatus in accordance with the sixth embodiment.
Figure 22C:
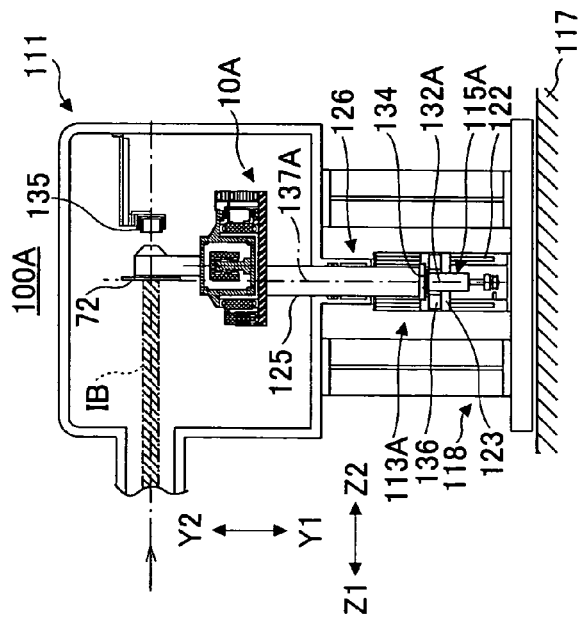
FIG. 22C is a right side view illustrating the ion implanter apparatus in accordance with the sixth embodiment.

In the following, semiconductor manufacturing devices in the form of ion implanter apparatuses to which the mover devices 10A through 10D are incorporated will be described. FIGS. 22A through 22C illustrate an ion implanter apparatus 100A in accordance with a sixth embodiment of the present invention. The ion implanter apparatus 100A includes the mover device 10A.

More specifically, the ion implanter apparatus 100A includes the mover device 10A, a vacuum processing chamber 111, and driving mechanisms 113A and 115A. The driving mechanism 113A moves the mover device 10A in the directions of the arrows Y1 and Y2 shown in the drawings. The driving mechanism 115A tilts the mover device 10A.

In the ion implanter apparatus 100A of this embodiment, the mover device 10A is provided inside the vacuum processing chamber 111, and the driving mechanisms 113A and 115A are provided outside the vacuum processing chamber 111.

When the platen 72 of the mover device 10A is in the reference attachment position (in the initial state prior to a start of an operation), the wafer attaching face 12 stands vertically. Accordingly, ion beams (hereinafter referred to as IB) are horizontally emitted to the platen 72. In this structure, even if there is dust laid on a wafer attached to the platen 72, the dust naturally falls off as a result of gravity.

Further, a Faraday cup 135 is provided behind the platen 72 (on the side of the arrow Z2 in FIGS. 22A and 22C). The Faraday cup 135 measures the current of the IB emitted to each wafer attached to the platen 72, and is located at the IB impinging point, facing the emitted IB.

As the mover device 10A is provided inside the vacuum processing chamber 111, a power source for the mover device 10A and cooling media for the coil units 56 and 74 need to be drawn into the vacuum chamber 111 from the outside. In this embodiment, these components are collectively provided through a collective cable 129, and the collective cable 129 is connected to the movable device 10A in the vacuum chamber via a hollow pillar 125. The hollow pillar 125 rotates in the directions of the arrows A1 and A2 (shown in FIG. 22B) and moves up and down in the directions of the arrows Y1 and Y2.

The driving mechanism 113A moves the mover device 10A in the directions of the arrows Y1 and Y2 shown in the drawings. In this embodiment, the driving mechanism 113A is provided outside the vacuum processing chamber 111. The driving mechanism 113A includes a Y-direction driving motor 121, an elevating mechanism 122, a table 124, and the pillar 125.

The Y-direction driving motor 121 drives the elevating mechanism 122. The elevating mechanism 122 is formed by a ball screw, or the like. The lower end of the ball screw is connected to the Y-direction driving motor 121 with a belt 133. The ball screw is engaged with an engaging part 123, and a flange 136 fixed to the lower end of the pillar 125 is integrally joined to the engaging part 123.

In this structure, when the Y-direction driving motor 121 is driven, the ball screw of the elevating mechanism 122 rotates, and the engaging part 123 selectively moves up and down in the directions of the arrows Y1 and Y2 in accordance with the rotational direction of the Y-direction driving motor 121. Since the flange 136 fixed to the lower end of the pillar 125 is integrally joined to the engaging part 123, the pillar 125 moves up and down with the flange 136 as the engaging part 123 moves up and down.

The upper part (a part on the Y2 side) of the pillar 125 is located inside the vacuum processing chamber 111, and the lower part (a part on the Y1 side) of the pillar 125 is located outside the vacuum processing chamber 111. The vacuum processing chamber 111 is provided above a base 118 placed on an installation board 117. The inside of the vacuum processing chamber 111 is maintained at a predetermined degree of vacuum by a vacuum pump (not shown).

The pillar 125 is inserted in the vacuum processing chamber 111 via an air bearing 126. The air bearing 126 is formed by a differential exhaust part 127 and a jetting part 128. With this structure, the degree of vacuum in the vacuum processing chamber 11 does not drop, even though the pillar 125 is inserted in the vacuum processing chamber 111.

The pillar 125 is designed to rotate, with respect to the vacuum processing chamber 111, in the directions of A1 and A2 on an axis (denoted by reference numeral 137A) that is perpendicular to the moving directions (the X1 and X2 directions) of the processing base 13A. The pillar 125 is also designed to move in the directions of the arrows Y1 and Y2. The mover device 10A is provided at the upper end (the Y2-side end) of the pillar 125.

As the mover device 10A is contained in the ion implanter apparatus 10A, the processing base 13A having the platen 72 can be smoothly moved at a high speed. Accordingly, each wafer that is attached to the platen 72 can be moved with IB at a high speed. Thus, the throughput of ion implanting into each wafer can be increased.

In the ion implanter apparatus 100A, the mover device 10A can be tilted, and can rotate on the axis 137A that is perpendicular to the moving directions of the processing base 13A. With this structure, the processing base 13A can be arbitrarily moved with the IB impinging direction with respect to each wafer attached to the platen 72. Thus, the ion implanting condition for each wafer can be arbitrarily set.

The ion implanter apparatus 100B in accordance with a seventh embodiment of the present invention will now be described. FIGS. 23A through 24B illustrate the ion implanter apparatus 100B in accordance with the seventh embodiment. In FIGS. 23A through 24B and 25A through 25C, the same components as those shown in FIGS. 22A through 22C are denoted by the same reference numerals as those in FIGS. 22A through 22C, and explanation of them will be omitted in the following description.

In the ion implanter apparatus 100A of the sixth embodiment, the driving mechanism 113A is provided outside the vacuum processing chamber 111. In the ion implanter apparatus 100B of this embodiment, however, a driving mechanism 113B that moves the mover device 10A in the directions of the arrows Y1 and Y2 is also provided inside the vacuum processing chamber 111.

The mover device 10A is provided on a base board 141A that is axially held by a rotational shaft 144 in the vacuum processing chamber 111. The driving mechanism 113B moves the mover device 10A in the directions of the arrows Y1 and Y2 with respect to the base board 141A. Accordingly, the platen 72, to which each wafer is to be attached, is moved in the directions of the arrows X1 and X2 at a high speed by the mover device 10A, and is also moved in the directions of the arrows Y1 and Y2 by the driving mechanism 113B. Thus, IB can be emitted onto the entire surface of each wafer that is attached to the platen 72.

The mover device 10A is moved in the directions of the arrows Y1 and Y2 by a linear guide 146 that is provided between the mover device 10A and the base board 141A. In this structure, the mover device 10A, which is a heavy device, can be smoothly moved in the directions of Y1 and Y2 with precision.

A driving mechanism 115B will now be described. The driving mechanism 115B is formed by a tilting motor 132B and the base board 141A. The base board 141A has the rotational shaft 144 at either end. The rotational shaft 144 is axially held by bearings 145 provided on the vacuum processing chamber 111. In this manner, the base board 141A is axially and movable held by the vacuum processing chamber 111.

The X2-side end of the rotational shaft 144 extends outward from the vacuum processing chamber 111, and the extending part of the rotational shaft 144 is connected to the tilting motor 132B with a belt 134. When the tilting motor 132B is driven, the base board 141A swings about the rotational shaft 144.

The rotation center of the rotational shaft 144 is designed to pass through the center S of each wafer to be attached to the platen 72. When the tilting motor 132B is driven, the platen 72 (each wafer) tilts with respect to the center axis of the rotational shaft 144 (the center axis being a tilting axis 137B). The tilting axis 137B lies in parallel with the moving directions (the directions of the arrows X1 and X2 in this embodiment) of the platen 72.

In FIG. 24D, the arrow D1 indicates a situation in which the driving mechanism 115B tilts the platen 72 through an angle of 60 degrees. The driving mechanism 115B rotates (tilts) the mover device 10A, so that the IB impinging angle with respect to each wafer can be arbitrarily set.

Figure 24B:
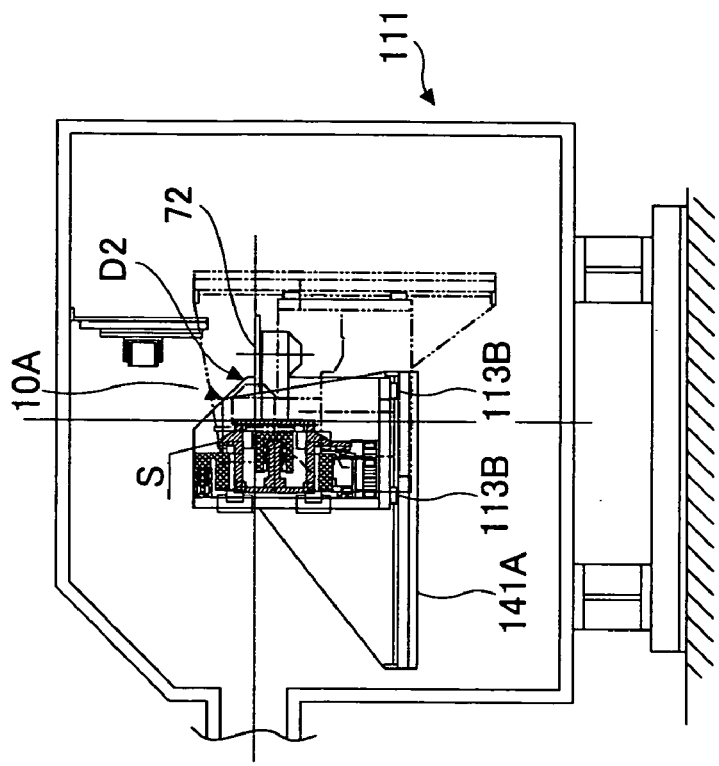
FIGS. 24A and 24B illustrate operations of the ion implanter apparatus in accordance with the seventh embodiment.
Figure 24A:
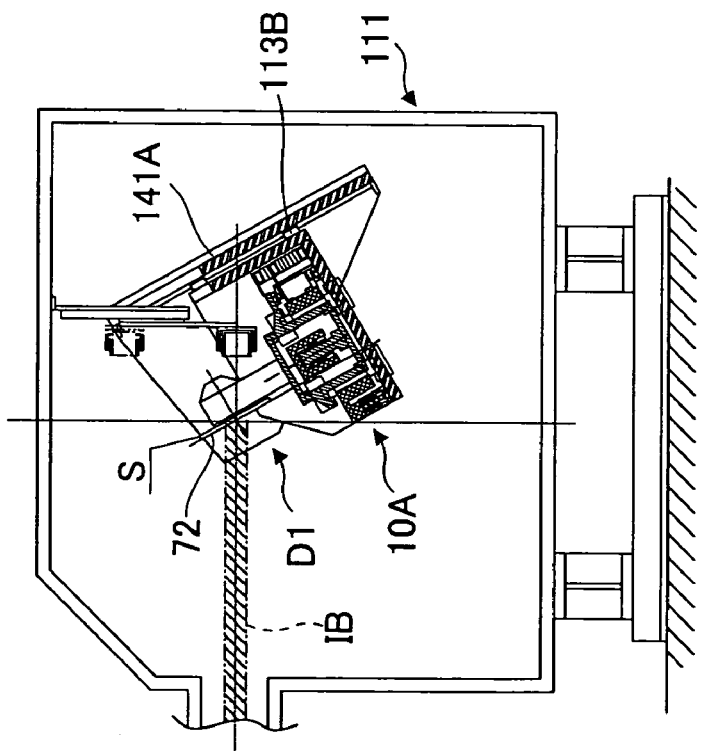

In FIG. 24B, the arrow D2 indicates a situation in which the driving mechanism 115B tilts the platen 72 through an angle of approximately 90 degrees. In this situation, the platen 72 faces upward, and a wafer is attached to or detached from the platen 72.

The ion implanter apparatus 100C in accordance with an eighth embodiment of the present invention will now be described. FIGS. 25A through 25C illustrate the ion implanter apparatus 100C in accordance with the eighth embodiment. The ion implanter apparatus 100C is characterized by the mover device 10C of the third embodiment. The mover device 10C is designed to have the wafer attaching face of the platen 20 in parallel with the fixed base 11A, as described earlier.

Since the mover device 10C of the ion implanter apparatus 100C does not include the stay frame 71, the moment generated at the platen 72 in the reciprocation movements (in the directions of X1 and X2) is smaller. For the same reason, the vacuum processing chamber 111 can be made smaller, and accordingly, the ion implanter apparatus 100C and the vacuum pump to be connected to the vacuum processing chamber 111 can be made smaller.

It should be noted that the present invention is not limited to the embodiments specifically disclosed above, but other variations and modifications may be made without departing from the scope of the present invention.

This patent application is based on Japanese priority patent application No. 2003-45102 filed on Feb. 21, 2003, the entire contents of which are hereby incorporated by reference.

What is claimed is:

1. A mover device comprising:
   a fixed base;
   a movable base that is movable in a linear direction with respect to the fixed base;
   a processing base that is movable in a linear direction with respect to the movable base, the linear direction being in parallel with the linear moving direction of the movable base;
   a moving force generating unit that is provided between the processing base and the movable base, and forms a main moving unit in cooperation with the processing base and the movable base;
   a P-F measuring unit that is provided between the processing base and the fixed base, and an M-F measuring unit that is provided between the movable base and the fixed base,
   the moving force generating unit being designed to generate a moving force to move the processing base with respect to the movable base, and, as a result, to move the processing base with respect to the fixed base,
   the movable base forming an inertial force processing unit that is moved on the fixed base in the opposite direction to the moving direction of the processing base by virtue of a reaction force caused by the moving force generated from the moving force generating unit to move the processing base, and
   the moving force generating unit being controlled so as to control the moving velocity of the processing base with respect to the fixed base, using signals generated from the P-F measuring unit and the M-F measuring unit.

2. The mover device as claimed in claim 1, wherein the movable base has a greater mass than the processing base so that the movable base functions as an inertial force processing weight and that the movement of the movable base by virtue of the reaction force is made smaller than the movement of the processing base.

3. The mover device as claimed in claim 1, wherein the linear-direction inertial movement of the movable base caused by the reaction force generated from the movement of the processing base includes accelerating or decelerating movements and a uniform velocity movement.

4. The mover device as claimed in claim 2, wherein, so as to start moving the movable base by virtue of the moving force generated from the moving force generating unit to move the processing base, the moving force generating unit moves the processing base with a greater moving force than a moving force that overcomes a moving force required to start moving the movable base and then moves the movable base in the opposite direction, the moving force generating unit thereby forcing the movable base to start moving.

5. The mover device as claimed in claim 1, wherein the velocity controlling unit includes a first detector that detects the moving state of the processing base with respect to the fixed base, and a controller that controls the moving force generating unit based on a detection result of the first detector.

6. The mover device as claimed in claim 1, wherein the velocity controlling unit includes:
   a first detector that detects the moving state of the movable base with respect to the fixed base;
   a second detector that detects the moving state of the processing base with respect to the movable base; and
   a controller that controls the moving force generating unit based on detection results of the second detector and the third detector.

7. The mover device as claimed in claim 1, wherein the velocity controlling unit includes:
   a first detector that detects the moving state of the processing base with respect to the fixed base;
   a second detector that detects the moving state of the movable base with respect to the fixed base;
   a third detector that detects the moving state of the processing base with respect to the movable base; and
   a controller that controls the moving force generating unit based on detection results of at least two of the first detector, the second detector, and the third detector.

8. The mover device as claimed in claim 1, wherein the velocity controlling unit includes:
   a first detector that detects the moving state of the processing base with respect to the fixed base;
   a second detector that detects the moving state of the movable base with respect to the fixed base;
   a third detector that detects the moving state of the processing base with respect to the movable base; and
   a controller that controls the moving force generating unit based on detection results of the first detector, the second detector, and the third detector.

9. The mover device as claimed in claim 1, wherein the movable base is guided by a first linear support guide, to move linearly with respect to the fixed base.

10. The mover device as claimed in claim 1, wherein the processing base is guided by a linear support guide, to move linearly with respect to the movable base.

11. The mover device as claimed in claim 1, wherein the processing base is guided by a linear support guide provided on the fixed base, so as to move linearly with respect to the fixed base.

12. The mover device as claimed in claim 1, wherein the velocity controlling unit controls the processing base to reciprocate in a predetermined range.

13. The mover device as claimed in claim 12, wherein the velocity controlling unit sets a region in which the processing base moves at a uniform velocity.

14. The mover device as claimed in claim 12, wherein the velocity controlling unit controls the processing base to reciprocate in the predetermined range in such a manner that the processing base moves in both directions at the same velocity in each uniform velocity reciprocation movement.

15. The mover device as claimed in claim 12, wherein the velocity controlling unit repeats acceleration control, uniform velocity control, and deceleration control, while moving the processing base with respect to the fixed base.

16. The mover device as claimed in claim 1, wherein the center of composite gravity of the processing base and the movable base in the linear moving directions is maintained at a predetermined point that is located on the fixed base, regardless of movements of the processing base and the movable base.

17. The mover device as claimed in claim 1, wherein the moving force generating unit is a linear motor that can linearly reciprocate.

18. The mover device as claimed in claim 17, wherein the linear motor is of a coreless coil type.

19. The mover device as claimed in claim 1, further comprising a positional deviation correcting unit that corrects a positional deviation of the movable base from a predetermined reference position with respect to the fixed base.

20. The mover device as claimed in claim 19, wherein a positional deviation of the movable base from the predetermined reference position with respect to the fixed base is detected by a second detector.

21. The mover device as claimed in claim 1, further comprising a positional deviation correcting mechanism that acts between the movable base and the fixed base, and corrects a positional deviation of the movable base from a predetermined reference position, the positional deviation correcting mechanism being provided in a position in which the fixed base and the movable base face each other with respect to the moving direction of the movable base.

22. The mover device as claimed in claim 21, wherein the positional deviation correcting mechanism can adjust a range in which a positional deviation can be corrected.

23. The mover device as claimed in claim 21, wherein the positional deviation correcting mechanism utilizes magnetism for correcting a positional deviation of the movable base from the predetermined reference position.

24. The mover device as claimed in claim 21, wherein the positional deviation correcting mechanism utilizes a spring for correcting a positional deviation of the movable base from the predetermined reference position.

25. The mover device as claimed in claim 12, further comprising a reverse facilitating unit that helps the processing base to reverse the moving direction so as to keep reciprocating, the reverse facilitating unit being provided between the movable base and the processing base.

26. The mover device as claimed in claim 1, further comprising an auxiliary driving unit that drives the movable base to move with respect to the fixed base.

27. The mover device as claimed in claim 26, wherein the auxiliary driving unit is controlled through a second detector that detects the moving state of the movable base with respect to the fixed base.

28. The mover device as claimed in claim 26, wherein:
the auxiliary driving unit is controlled through the second detector that detects the moving state of the movable base with respect to the fixed base; and
the moving force generating unit is controlled through the first detector that detects the moving state of the processing base with respect to the fixed base.

29. The mover device as claimed in claim 21, wherein the positional deviation correcting mechanism utilizes an auxiliary driving unit for correcting a positional deviation of the movable base from the predetermined reference position, the auxiliary driving unit driving the movable base to move with respect to the fixed base.

30. The mover device as claimed in claim 26, wherein the velocity controlling unit utilizes the auxiliary driving unit for correcting the moving velocity of the processing base with respect to the fixed base.

31. The mover device as claimed in claim 26, wherein:
the velocity controlling unit controls the moving force generating unit so as to perform acceleration control, uniform velocity control, and deceleration control on the processing base moving with respect to the fixed base; and
the velocity controlling unit also controls the auxiliary driving unit so as to perform velocity control for disturbance correction on the processing base moving with respect to the fixed base.

32. The mover device as claimed in claim 26, wherein the auxiliary driving unit is a linear motor of a coreless coil type.

33. The mover device as claimed in claim 26, wherein:
the center of gravity of the processing base in the linear moving direction is located in the same position as the center of gravity of the movable base in the linear moving direction; and
the point at which the moving force generating unit applies a moving force to the processing base is located in the same position as the center of gravity of the processing base in the linear moving direction and the center of gravity of the movable base in the linear moving direction.

34. The mover device as claimed in claim 26, wherein the center of gravity of the processing base in the linear moving direction is located in the same position as the center of gravity of the movable base in the linear moving direction and the point at which the moving force generating unit applies a moving force to the processing base, the center of gravity of the processing base in the linear moving direction being also located on the linear moving plane of a second linear support guide that guides and moves the processing base linearly with respect to the movable base.

35. The mover device as claimed in claim 26, wherein:
the velocity controlling unit controls the moving force generating unit, so as to perform acceleration control, uniform velocity control, and deceleration control on the processing base moving with respect to the fixed base; and
the velocity controlling unit also controls the auxiliary driving unit, so as to perform acceleration control, uniform velocity control, and deceleration control on the movable base moving with respect to the fixed base.

36. The mover device as claimed in claim 35, wherein:
the velocity controlling unit controls the moving force generating unit in such a manner that changes of the moving velocity of the processing base with time conform to a first reference trapezoid, the changes of the moving velocity being caused by acceleration, uniform velocity moving, and deceleration; and
the velocity controlling unit controls the auxiliary driving unit in such a manner that changes of the moving velocity of the movable base with time conform to a second reference trapezoid, the changes of the moving velocity being caused by acceleration, uniform velocity moving, and deceleration.

37. The mover device as claimed in claim 36, wherein a transition point between the acceleration and the uniform velocity moving and a transition point between the uniform velocity moving and the deceleration in accordance with the first reference trapezoid are in synchronization with the corresponding transition points in accordance with the second reference trapezoid.

38. The mover device as claimed in claim 36, wherein:
the first reference trapezoid that represents ideal movements of the processing base is stored beforehand in the velocity controlling unit; and
the velocity controlling unit controls the moving force generating unit to correct the moving velocity of the processing base, when the moving velocity of the processing base deviates from the velocity represented by the first reference trapezoid.

39. The mover device as claimed in claim 36, wherein:
the second reference trapezoid that represents ideal movements of the movable base is stored beforehand in the velocity controlling unit; and
the velocity controlling unit controls the auxiliary driving unit to correct the moving velocity of the movable base, when the moving velocity of the movable base deviates from the velocity represented by the second reference trapezoid.

40. The mover device as claimed in claim 1, wherein the moving force generating unit is designed to generate a moving force to accelerate and decelerate the processing base with respect to the movable base, the moving force generating unit being controlled so as to control the moving velocity of the processing base and the movable base that interactively move on the fixed base in linear directions.

41. The mover device as claimed in claim 1, wherein the moving force generating unit is designed to generate a moving force to accelerate and decelerate the processing base with respect to the movable base, the inertial force processing unit being designed to convert the reaction force caused by the movement of the processing base into linear-direction inertial movements of the moveable base, so that the processing base and the moveable base linearly move with respect to each other.

42. A mover device comprising:
a fixed base;
a movable base that is movable in a linear direction with respect to the fixed base;
a processing base that is movable in a linear direction with respect to the movable base, the linear direction being in parallel with the linear moving direction of the movable base;
a moving force generating unit that is provided between the processing base and the movable base, and forms a main moving unit in cooperation with the processing base and the movable base; and
a P-M measuring unit that is provided between the processing base and the movable base and an M-F measuring unit that is provided between the movable base and the fixed base,
the moving force generating unit being designed to generate a moving force to move the processing base with respect to the movable base, and, as a result, to move the processing base with respect to the fixed base,
the movable base forming an inertial force processing unit that is moved on the fixed base in the opposite direction to the moving direction of the processing base by virtue of a reaction force caused by the moving force generated from the moving force generating unit to move the processing base, and
the moving force generating unit being controlled so as to control the moving velocity of the processing base with respect to the fixed base, using signals generated from the P-M measuring unit and the M-F measuring unit.

43. A mover device comprising:
a fixed base;
a movable base that is movable in a linear direction with respect to the fixed base;
a processing base that is movable in a linear direction with respect to the movable base, the linear direction being in parallel with the linear moving direction of the movable base;
a moving force generating unit that is provided between the processing base and the movable base, and forms a main moving unit in cooperation with the processing base and the movable base; and
a P-F measuring unit that is provided between the processing base and the fixed base, and
a P-M measuring unit that is provided between the processing base and the movable base,
the moving force generating unit being designed to generate a moving force to move the processing base with respect to the movable base, and, as a result, to move the processing base with respect to the fixed base,
the movable base forming an inertial force processing unit that is moved on the fixed base in the opposite direction to the moving direction of the processing base by virtue of a reaction force caused by the moving force generated from the moving force generating unit to move the processing base, and
the moving force generating unit being controlled so as to control the moving velocity of the processing base with respect to the fixed base, using signals generated from the P-F measuring unit and the P-M measuring unit.

44. A semiconductor manufacturing apparatus comprising:
a mover device; and
a processing unit that performs processing on a processing object attached to a processing base of the mover device,
the mover device including:
a fixed base;
a movable base that is movable in a linear direction with respect to the fixed base;
the processing base that is movable in a linear direction with respect to the movable base, the linear direction being in parallel with the linear moving direction of the movable base;
a moving force generating unit that is provided between the processing base and the movable base, and forms a main moving unit in cooperation with the processing base and the movable base;
a velocity controlling unit that controls the moving velocity of the processing base with respect to the fixed base;
a P-F measuring unit that is provided between the processing base and the fixed base, and an M-F measuring unit that is provided between the movable base and the fixed base,
the movable base forming an inertial force processing unit,
the moving force generating unit being controlled so as to control the moving velocity of the processing base with respect to the fixed base, using signals generated from the P-F measuring unit and the M-F measuring unit,
the moving force generating unit being designed to generate a moving force to move the processing base with respect to the movable base, and, as a result, to move the processing base with respect to the fixed base, and
the movable base on the fixed base being moved in the opposite direction to the moving direction of the processing base by virtue of a reaction force caused by the moving force generated from the moving force generating unit to move the processing base.

45. The semiconductor manufacturing apparatus as claimed in claim 44, further comprising a mover unit that moves the mover device in a direction perpendicular to the moving direction of the processing base.

46. The semiconductor manufacturing apparatus as claimed in claim 44, further comprising a tilting unit that tilts the mover device.

47. The semiconductor manufacturing apparatus as claimed in claim 44, further comprising a rotator unit that rotates the mover device on an axis that is perpendicular to the moving direction of the processing base.

48. A semiconductor manufacturing apparatus of a vacuum processing type, comprising:
- a mover device; and
- a processing unit that performs processing on a processing object attached to a processing base of the mover device in a vacuum,
- the mover device including:
- a fixed base;
- a movable base that is movable in a linear direction with respect to the fixed base;
- the processing base that is movable in a linear direction with respect to the movable base, the linear direction being in parallel with the linear moving direction of the movable base;
- a moving force generating unit that is provided between the processing base and the movable base, and forms a main moving unit in cooperation with the processing base and the movable base;
- a velocity controlling unit that controls the moving velocity of the processing base with respect to the fixed base;
- a P-F measuring unit that is provided between the processing base and the fixed base, and an M-F measuring unit that is provided between the movable base and the fixed base,
- the movable base forming an inertial force processing unit,
- the moving force generating unit being controlled so as to control the moving velocity of the Processing base with respect to the fixed base, using signals generated from the P-F measuring unit and the M-F measuring unit,
- the moving force generating unit being designed to generate a moving force to move the processing base with respect to the movable base, and, as a result, to move the processing base with respect to the fixed base, and
- the movable base on the fixed base being moved in the opposite direction to the moving direction of the processing base by virtue of a reaction force caused by the moving force generated from the moving force generating unit to move the processing base.

* * * * *